United States Patent
Park et al.

(10) Patent No.: US 9,966,446 B2
(45) Date of Patent: May 8, 2018

(54) SEMICONDUCTOR DEVICE AND METHOD FOR FABRICATING THE SAME

(71) Applicant: SAMSUNG ELECTRONICS CO., LTD., Suwon-si, Gyeonggi-Do (KR)

(72) Inventors: Yong Hee Park, Hwaseong-si (KR); Young Seok Song, Hwaseong-si (KR); Young Chul Hwang, Hwaseong-si (KR); Ui Hui Kwon, Hwaseong-si (KR); Keun Ho Lee, Seongnam-si (KR); Jee Soo Chang, Seoul (KR); Jae Hee Choi, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days. days.

(21) Appl. No.: 15/353,163

(22) Filed: Nov. 16, 2016

(65) Prior Publication Data
US 2017/0154968 A1 Jun. 1, 2017

(30) Foreign Application Priority Data
Nov. 27, 2015 (KR) ........................ 10-2015-0167475

(51) Int. Cl.
*H01L 29/76* (2006.01)
*H01L 29/417* (2006.01)
(Continued)

(52) U.S. Cl.
CPC .... *H01L 29/41791* (2013.01); *H01L 23/5226* (2013.01); *H01L 23/5329* (2013.01);
(Continued)

(58) Field of Classification Search
CPC ........... H01L 29/41791; H01L 29/7851; H01L 23/52–23/5389; H01L 21/823431;
(Continued)

(56) References Cited

U.S. PATENT DOCUMENTS 8,362,572 B2 1/2013 Huang et al.
8,723,271 B2 5/2014 Yuan et al.
(Continued)

*Primary Examiner* — Kevin M Picardat
(74) *Attorney, Agent, or Firm* — F. Chau & Associates, LLC

(57) ABSTRACT

There is provided a semiconductor device to enhance operating characteristics by reducing parasitic capacitance between a gate electrode and other nodes. The semiconductor device includes: a substrate including an active region, and a field region directly adjacent to the active region; a first fin-type pattern protruding from the substrate in the active region; a first gate electrode disposed on the substrate, intersecting with the first fin-type pattern and including a first portion and a second portion, the first portion intersecting with the first fin-type pattern; a second gate electrode disposed on the substrate, intersecting with the first fin-type pattern and including a third portion and a fourth portion, the fourth portion facing the second portion, and the third portion intersecting with the first fin-type pattern and facing the first portion; a first interlayer insulating structure disposed between the first portion and the third portion, being on the substrate, and having a first dielectric constant; and a second interlayer insulating structure disposed between the second portion and the fourth portion, being on the substrate, and having a second dielectric constant which is different from the first dielectric constant.

20 Claims, 59 Drawing Sheets

(51) Int. Cl.
  *H01L 29/78*   (2006.01)
  *H01L 23/532*  (2006.01)
  *H01L 23/522*  (2006.01)
  *H01L 29/66*   (2006.01)

(52) U.S. Cl.
  CPC .... *H01L 29/41775* (2013.01); *H01L 29/6653* (2013.01); *H01L 29/66795* (2013.01); *H01L 29/7851* (2013.01)

(58) Field of Classification Search
  CPC ........... H01L 21/823821; H01L 21/845; H01L 27/0886; H01L 27/0924; H01L 27/10826; H01L 27/10879; H01L 27/1211; H01L 29/66795–29/66818; H01L 29/785–29/7856
  USPC ........................................................ 257/365
  See application file for complete search history.

(56) References Cited

U.S. PATENT DOCUMENTS

| | | |
|---|---|---|
| 8,912,602 B2 | 12/2014 | Hsu et al. |
| 2013/0277686 A1 | 10/2013 | Liu et al. |
| 2013/0277730 A1 | 10/2013 | Jung et al. |
| 2014/0043905 A1 | 2/2014 | Lee |
| 2014/0138779 A1 | 5/2014 | Xie et al. |
| 2014/0203348 A1 | 7/2014 | Suk et al. |
| 2015/0021683 A1 | 1/2015 | Xie et al. |
| 2015/0132936 A1 | 5/2015 | Rho et al. |
| 2016/0111524 A1* | 4/2016 | Ha .................... H01L 29/66795 438/283 |
| 2016/0190141 A1* | 6/2016 | Lee .................... H01L 27/1104 257/390 |
| 2016/0372316 A1* | 12/2016 | Yang .................. H01L 27/0924 |
| 2017/0133367 A1* | 5/2017 | Baek .................. H01L 27/088 |

\* cited by examiner

SEMICONDUCTOR DEVICE AND METHOD FOR FABRICATING THE SAME

CROSS-REFERENCE TO RELATED APPLICATION

This application claims priority to Korean Patent Application No. 10-2015-0167475 filed on Nov. 27, 2015 in the Korean Intellectual Property Office, and all the benefits accruing therefrom under 35 U.S.C. 119, the content of which in its entirety is herein incorporated by reference.

TECHNICAL FIELD

The present disclosure relates to a semiconductor device and a method for fabricating the same.

DISCUSSION OF RELATED ART

The dramatic increase in the distribution of information through media recently has led to the remarkable advances in the functionalities of semiconductor devices. To ensure higher levels of competitiveness, new semiconductor products having lower cost and higher quality through higher integration are required. To achieve higher integration, the semiconductor industry has relied on the continued scaling down of the minimum feature sizes of the transistor.

Researches are under way to increase the operating speed of a semiconductor device and to enhance the integration density. The semiconductor device is equipped with discrete devices such as metal-oxide-semiconductor (MOS) transistors. As the integration density of the semiconductor device becoming higher, gates of the MOS transistors are becoming smaller, and underlying channel regions of the gates are also becoming narrower.

SUMMARY

The present disclosure provides a semiconductor device to enhance operating characteristics by reducing parasitic capacitance between a gate electrode and other nodes, and also provides a method for fabricating the same.

According to an aspect of the present inventive concept, there is provided a semiconductor device comprising: a substrate including an active region, and a field region directly adjacent to the active region; a first fin-type pattern protruding from the substrate in the active region; a first gate electrode disposed on the substrate, intersecting with the first fin-type pattern and including a first portion and a second portion, the first portion intersecting with the first fin-type pattern; a second gate electrode disposed on the substrate, intersecting with the first fin-type pattern and including a third portion and a fourth portion, the fourth portion facing the second portion, and the third portion intersecting with the first fin-type pattern and facing the first portion; a first interlayer insulating structure disposed between the first portion and the third portion, being on the substrate, and having a first dielectric constant; and a second interlayer insulating structure disposed between the second portion and the fourth portion, being on the substrate, and having a second dielectric constant which is different from the first dielectric constant.

In an exemplary embodiment of the present inventive concept, the semiconductor device may further comprise a source/drain formed on the first fin-type pattern between the first portion and the third portion. The first interlayer insulating structure is formed on the source/drain, and no fin-type pattern is formed in the field region.

In an exemplary embodiment of the present inventive concept, the first dielectric constant is greater than the second dielectric constant.

In an exemplary embodiment of the present inventive concept, the second interlayer insulating structure includes an air gap, and the first interlayer insulating structure includes no air gap.

In an exemplary embodiment of the present inventive concept, the first interlayer insulating structure and the second interlayer insulating structure include no air gap.

In an exemplary embodiment of the present inventive concept, the semiconductor device may further comprise a gate spacer formed on a sidewall of the first gate electrode. A thickness of the gate spacer on the sidewall of the first portion is different from a thickness of the gate spacer on the sidewall of the second portion.

In an exemplary embodiment of the present inventive concept, the gate spacer includes an inner spacer formed on the sidewall of the first portion and the sidewall of the second portion, and an outer spacer formed on the sidewall of the first portion, but not formed on the sidewall of the second portion.

In an exemplary embodiment of the present inventive concept, the gate spacer defines a trench. The semiconductor device may further comprise a gate insulating film formed along a sidewall and a bottom surface of the trench.

In an exemplary embodiment of the present inventive concept, the semiconductor device may further comprise a gate spacer formed on a sidewall of the first gate electrode. The gate spacer is formed on the sidewall of the first portion, but not formed on the sidewall of the second portion In an exemplary embodiment of the present inventive concept, the semiconductor device may further comprise a gate insulating film formed along the sidewall and a bottom surface of the first gate electrode. The gate insulating film formed on the sidewall of the first portion is interposed between the gate spacer and the first portion.

In an exemplary embodiment of the present inventive concept, the gate insulating film contacts the second interlayer insulating structure.

In an exemplary embodiment of the present inventive concept, the semiconductor device may further comprise a gate insulating film formed on the sidewall and a bottom surface of the first gate electrode. The gate insulating film is formed on the sidewall and the bottom surface of the first portion, and formed on the bottom surface of the second portion. The gate insulating film formed on the sidewall of the first portion is interposed between the gate spacer and the first portion.

In an exemplary embodiment of the present inventive concept, the gate insulating film is not formed on the sidewall of the second portion.

In an exemplary embodiment of the present inventive concept, the semiconductor device may further comprise a liner formed on the sidewall of the second portion between the second portion and the second interlayer insulating structure. The liner includes a portion extending between the second interlayer insulating structure and the substrate.

In an exemplary embodiment of the present inventive concept, the semiconductor device may further comprise a capping pattern formed along an upper surface of the first gate electrode. The capping pattern is formed on the upper surface of the first portion, but not formed on the upper surface of the second portion.

In an exemplary embodiment of the present inventive concept, the second interlayer insulating structure overlays the upper surface of the second portion.

In an exemplary embodiment of the present inventive concept, the semiconductor device may further comprise a gate spacer formed on a sidewall of the first portion, defining a trench. The first portion fills a portion of the trench, and the capping pattern fills the rest of the trench.

In an exemplary embodiment of the present inventive concept, the first portion and the third portion are laid on the active region, and the second portion and the fourth portion are laid on the field region.

In an exemplary embodiment of the present inventive concept, the first fin-type pattern is defined by a first trench having a first depth, and the active region is defined by a second trench having a second depth which is larger than the first depth.

In an exemplary embodiment of the present inventive concept, the semiconductor device may further comprise a second fin-type pattern disposed in parallel with the first fin-type pattern, and intersecting with the first gate electrode and the second gate electrode. The second interlayer insulating structure is disposed between the first fin-type pattern and the second fin-type pattern.

In an exemplary embodiment of the present inventive concept, the first gate electrode includes a fifth portion intersecting with the second fin-type pattern, the second gate electrode includes a sixth portion intersecting with the second fin-type pattern and facing the fifth portion. The semiconductor device may further comprise a third interlayer insulating structure disposed between the fifth portion and the sixth portion, being on the substrate, and having a third dielectric constant.

In an exemplary embodiment of the present inventive concept, the third dielectric constant is greater than the second dielectric constant, and the third interlayer insulating structure includes an insulating material same as that included in the first interlayer insulating structure.

According to another aspect of the present inventive concept, there is provided a semiconductor device comprising: a first fin-type pattern extending in a first direction protruding from a substrate; a second fin-type pattern extending in the first direction, and spaced apart from the first fin-type pattern by a first distance in a second direction different form the first direction; a third fin-type pattern extending in the first direction, and spaced apart from the first fin-type pattern by a second distance in the second direction, the second distance being greater than the first distance; a first gate electrode includes a first portion intersecting with the first fin-type pattern and the second fin-type pattern, a second portion intersecting with the third fin-type pattern, and a third portion interposed between the first portion and the second portion; a second gate electrode including a fourth portion intersecting with the first fin-type pattern and the second fin-type pattern, a fifth portion intersecting with the third fin-type pattern, and a sixth portion interposed between the fourth portion and the fifth portion; a first interlayer insulating structure disposed between the first portion and the fourth portion, being on the substrate, and having a first dielectric constant; a second interlayer insulating structure disposed between the second portion and the fifth portion, being on the substrate, and having a second dielectric constant; and a third interlayer insulating structure disposed between the third portion and the sixth portion, being on the substrate, and having a third dielectric constant different from the first dielectric constant and the second dielectric constant.

In an exemplary embodiment of the present inventive concept, the third dielectric constant is smaller than the first dielectric constant and the second dielectric constant.

In an exemplary embodiment of the present inventive concept, the second interlayer insulating structure includes an insulating material same as that included in the first interlayer insulating structure.

In an exemplary embodiment of the present inventive concept, the third interlayer insulating structure includes an air gap.

In an exemplary embodiment of the present inventive concept, a dielectric constant of an insulating material included in the first interlayer insulating structure is greater than a dielectric constant of an insulating material included in the third interlayer insulating structure.

In an exemplary embodiment of the present inventive concept, between a sidewall of the first gate electrode and a sidewall of the second gate electrode facing the sidewall of the first gate electrode, a width of the first interlayer insulating structure is substantially equal to a width of the third interlayer insulating structure.

In an exemplary embodiment of the present inventive concept, between a sidewall of the first gate electrode and a sidewall of the second gate electrode facing the sidewall of the first electrode, a width of the third interlayer insulating structure is greater than a width of the first interlayer insulating structure.

In an exemplary embodiment of the present inventive concept, number of insertion films interposed between the sidewall of the first gate electrode and the third interlayer insulating structure is less than number of insertion films interposed between the sidewall of the first gate electrode and the first interlayer insulating structure.

In an exemplary embodiment of the present inventive concept, the semiconductor device may further comprise a contact connected with the third portion on the first gate electrode.

In an exemplary embodiment of the present inventive concept, the semiconductor device may further comprise, on the substrate, a fourth interlayer insulating structure disposed in a region overlapped with the contact, and having a fourth dielectric constant greater than the third dielectric constant.

In an exemplary embodiment of the present inventive concept, the fourth interlayer insulating structure has a material same as that of the first interlayer insulating structure and the second interlayer insulating structure.

In an exemplary embodiment of the present inventive concept, the first fin-type pattern is positioned between the second fin-type pattern and the third fin-type pattern.

According to still another aspect of the present inventive concept, there is provided a semiconductor device comprising: a first trench having a first depth, and defining an active region; a fin-type pattern defined by a second trench having a second depth smaller than the first depth, and being in the active region; a field insulating film filling a portion of the first trench and a portion of the second trench; a gate electrode intersecting with the fin-type pattern, disposed on the field insulating film, and including a first portion overlapping with the active region and a second portion not overlapping with the active region; a first interlayer insulating structure overlaying a sidewall of the first portion, disposed on the field insulating film, and having a first dielectric constant; and a second interlayer insulating structure overlaying the second portion, disposed on the field insulating film, and having a second dielectric constant different from the first dielectric constant.

In an exemplary embodiment of the present inventive concept, the first dielectric constant is greater than the second dielectric constant.

In an exemplary embodiment of the present inventive concept, the second interlayer insulating structure includes an air gap.

According to still another aspect of the present inventive concept, there is provided a semiconductor device comprising: a substrate including a first region, a second region, and a third region between the first region and the second region; a first fin-type pattern on the substrate in the first region; a second fin-type pattern on the substrate in the second region; a first source/drain including a first epitaxial layer on the first fin-type pattern; a second source/drain including a second epitaxial layer on the second fin-type pattern; a first interlayer insulating structure disposed on the substrate in the first region and overlaying the first source/drain; a second interlayer insulating structure disposed on the substrate in the second region and overlaying the second source/drain; and a third interlayer insulating structure disposed on the substrate in the third region and contacting the first interlayer insulating structure and the second interlayer insulating structure, wherein a dielectric constant of the third interlayer insulating structure is smaller than a dielectric constant of the first interlayer insulating structure and a dielectric constant of the second interlayer insulating structure.

In an exemplary embodiment of the present inventive concept, the semiconductor device may further comprise a field insulating film formed on the substrate. The first to third interlayer insulating structures are formed on the field insulating film. Between the third interlayer insulating structure and the field insulating film, no semiconductor pattern is formed.

In an exemplary embodiment of the present inventive concept, no fin-type pattern is formed on the substrate in the third region.

In an exemplary embodiment of the present inventive concept, the first interlayer insulating structure has an insulating material same as that of the second interlayer insulating structure.

In an exemplary embodiment of the present inventive concept, a dielectric constant of a first insulating material included in the first interlayer insulating structure is greater than a dielectric constant of a second insulating material included in the third interlayer insulating structure.

In an exemplary embodiment of the present inventive concept, the third interlayer insulating structure includes an air gap.

In an exemplary embodiment of the present inventive concept, a dielectric constant of a first insulating material included in the first interlayer insulating structure is equal to a dielectric constant of a second insulating material included in the third interlayer insulating structure. The third interlayer insulating structure includes an air gap.

In an exemplary embodiment of the present inventive concept, the semiconductor device may further comprise a third fin-type pattern on the substrate in the first region, and a third source/drain including a third epitaxial layer on the third fin-type pattern. The first interlayer insulating structure overlays the first epitaxial layer and the third epitaxial layer.

In an exemplary embodiment of the present inventive concept, the first epitaxial layer and the third epitaxial layer contact each other.

According to still another aspect of the present inventive concept, there is provided a semiconductor device comprising: a substrate including an active region, and a field region bordered by the active region; at least one or more fin-type patterns extending in a first direction on the substrate; first and second gate electrodes intersecting with a first fin-type pattern of the at least one or more fin-type patterns, and extending in a second direction different from the first direction; a source/drain formed on the first fin-type pattern between the first gate electrode and the second gate electrode; a first interlayer insulating structure disposed on the active region and having a first dielectric constant; and a second interlayer insulating structure disposed on the field region, having a second dielectric constant different from the first dielectric constant, and contacting the first interlayer insulating structure, wherein a boundary between the first interlayer insulating structure and the second interlayer insulating structure is positioned in the field region, and is separated from a boundary between the active region and the field region by a margin distance M. The at least one or more fin-type patterns are formed to have a fin pitch P. When the source/drain has a width SW in the second direction, the margin distance M is greater than a half of a remainder after subtracting the fin pitch P from the width SW of the source/drain.

In an exemplary embodiment of the present inventive concept, the first dielectric constant is greater than the second dielectric constant.

In an exemplary embodiment of the present inventive concept, the second interlayer insulating structure includes an air gap, and the first interlayer insulating structure includes no air gap.

In an exemplary embodiment of the present inventive concept, the margin distance M further includes a misalign margin of a mask used when defining the active region.

In an exemplary embodiment of the present inventive concept, the margin distance M further includes a misalign margin of a mask used when forming the second interlayer insulating structure.

According to still another aspect of the present inventive concept, there is provided a method for fabricating a semiconductor device comprising: defining an active region where a fin-type pattern is formed, and a field region where no fin-type pattern is formed on a substrate; forming a first gate electrode and a second gate electrode intersecting with the fin-type pattern, and spanning the active region and the field region on the substrate; forming a source/drain on the first fin-type pattern between the first gate electrode and the second gate electrode; forming a first interlayer insulating structure overlaying the source/drain on the substrate in the active region; and forming a second interlayer insulating structure contacting the first interlayer insulating structure on the substrate in the field region, and having a dielectric constant different from that of the first interlayer insulating structure.

In an exemplary embodiment of the present inventive concept, forming the first interlayer insulating structure includes: forming an interlayer insulating film surrounding a sidewall of the first gate electrode and a sidewall of the second gate electrode and overlaying the source/drain, and removing the interlayer insulating film in the field region.

In an exemplary embodiment of the present inventive concept, the second interlayer insulating structure is formed by depositing a material having a dielectric constant smaller than that of the interlayer insulating film.

In an exemplary embodiment of the present inventive concept, the second interlayer insulating structure is formed by filling in with an air gap and depositing a material having a dielectric constant not greater than that of the interlayer insulating film.

In an exemplary embodiment of the present inventive concept, the method may further comprise after forming the second interlayer insulating structure, removing the first gate electrode and the second gate electrode to form a first trench and a second trench, and forming a third gate electrode and a fourth gate electrode filling the first trench and the second trench, respectively.

In an exemplary embodiment of the present inventive concept, the method may further comprise between forming the source/drain and forming the first interlayer insulating structure, removing the first gate electrode and the second gate electrode to form a first trench and a second trench, and forming a third gate electrode and a fourth gate electrode filling the first trench and the second trench, respectively.

In an exemplary embodiment of the present inventive concept, the method may further comprise after forming the second interlayer insulating structure, forming a contact connected with at least one of the third gate electrode and the fourth gate electrode.

In an exemplary embodiment of the present inventive concept, the method may further comprise before forming the first interlayer insulating structure, forming a contact connected with at least one of the third gate electrode and the fourth gate electrode.

According to still another aspect of the present inventive concept, there is provided a semiconductor device comprising: a substrate including an active region, and a field region directly adjacent to the active region; a first fin-type pattern protruding from the substrate in the active region; a field insulating film disposed on the substrate, spanning the active region and the field region, and surrounding a portion of the first fin-type pattern; a first gate structure disposed on the field insulating film, intersecting with the first fin-type pattern and including a first gate portion and a second gate portion, the first gate portion intersecting with the first fin-type pattern; a second gate structure disposed on the field insulating film, intersecting with the first fin-type pattern and including a third gate portion and a fourth gate portion, the fourth gate portion facing the second gate portion, and the third gate portion intersecting with the first fin-type pattern and facing the first gate portion; a first interlayer insulating structure disposed between the first gate portion and the third gate portion, being on the field insulating film, and having a first dielectric constant; and a second interlayer insulating structure disposed between the second gate portion and the fourth gate portion, being on the field insulating film, and having a second dielectric constant which is smaller than the first dielectric constant. The first gate portion and the third gate portions each includes a gate spacer, a gate insulating film, a gate electrode and a capping pattern sequentially stacked. The second gate portion and the fourth gate portion each includes the gate insulating film and the gate electrode sequentially stacked, but does not include the gate spacer and the capping pattern.

In an exemplary embodiment of the present inventive concept, the second interlayer insulating structure includes an air gap, and the first interlayer insulating structure includes no air gap.

BRIEF DESCRIPTION OF THE DRAWINGS

The above and other features of the present disclosure will become more apparent to those of ordinary skill in the art by describing in detail exemplary embodiments thereof with reference to the accompanying drawings, and in which.

Figure 1:
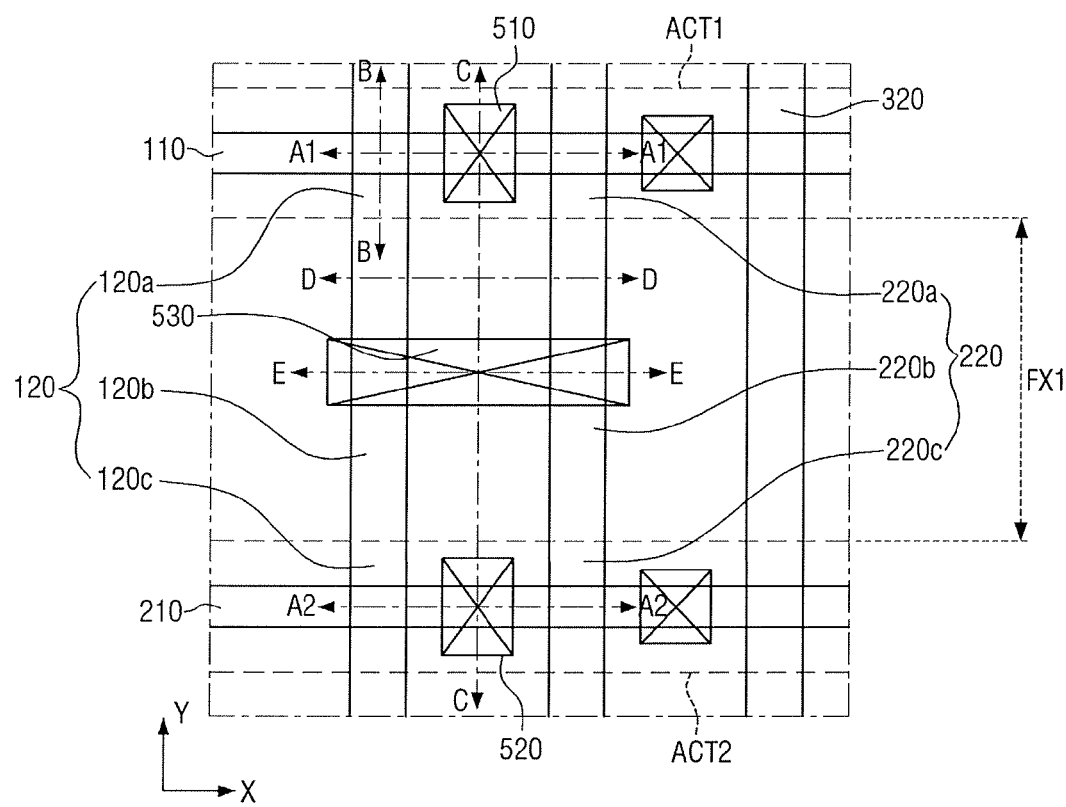
FIG. 1 is a layout diagram provided to explain a semiconductor device according to an exemplary embodiment of the present inventive concept.

Since the drawings in FIGS. 1-45 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Features of the present inventive concept and methods of accomplishing the same may be understood more readily by reference to the following detailed description of preferred embodiments and the accompanying drawings. The present inventive concept may, however, be embodied in many different forms and should not be construed as being limited to the specific embodiments set forth herein. Rather, these embodiments are provided so that this disclosure will be thorough and complete and will fully convey the concept of the invention to those skilled in the art.

It will be understood that when an element or layer is referred to as being "connected to" or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout the specification and the accompany drawings. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms "first", "second", etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The use of the terms "a", "an", "the" and similar referents in the context of describing the invention (especially in the context of the following claims) are to be construed to cover both the singular and the plural, unless otherwise indicated herein or clearly contradicted by context. The terms "comprising", "having", "including" and "containing" are to be construed as open-ended terms (i.e., meaning "including but not limited to") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Although the drawings regarding a semiconductor device according to some exemplary embodiments of the present inventive concept exemplify a fin-type field effect transistor (FinFET) comprising a channel region in a fin-type pattern shape, the exemplary embodiments of the present inventive concept are not limited thereto. It is of course possible that a semiconductor device according to an exemplary embodiment of the present inventive concept may include a tunneling transistor (tunneling FET), a transistor comprising nanowire, a transistor comprising nano-sheet, or a three-dimensional (3D) transistor. Further, a semiconductor device according to an exemplary embodiment of the present inventive concept may include a bipolar junction transistor, a laterally diffused metal oxide semiconductor (LDMOS) transistor, and so on.

Hereinbelow, a semiconductor device according to an exemplary embodiment of the present inventive concept will be explained with reference to FIGS. 1 to 6.

Figure 2A:
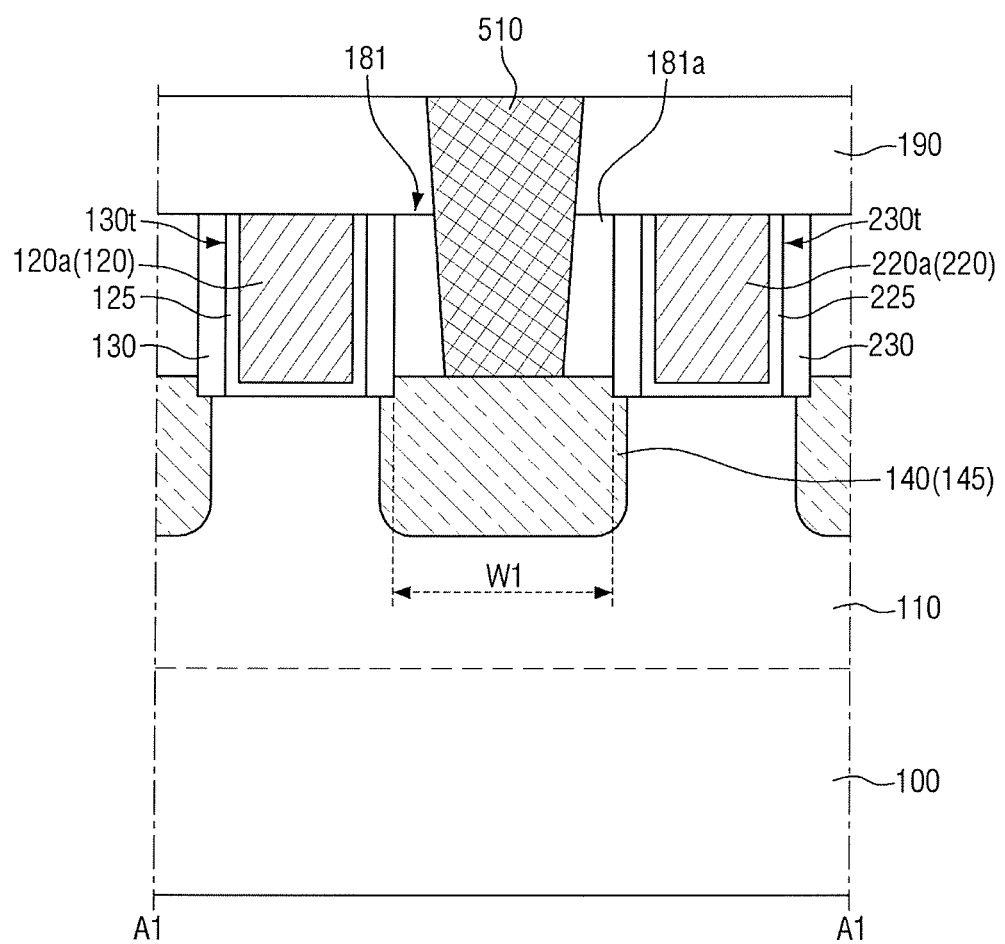
FIGS. 2A and 2B are cross sectional views taken along line A1-A1 and line A2-A2 of FIG. 1, respectively, according to an exemplary embodiment of the present inventive concept.
Figure 2B:
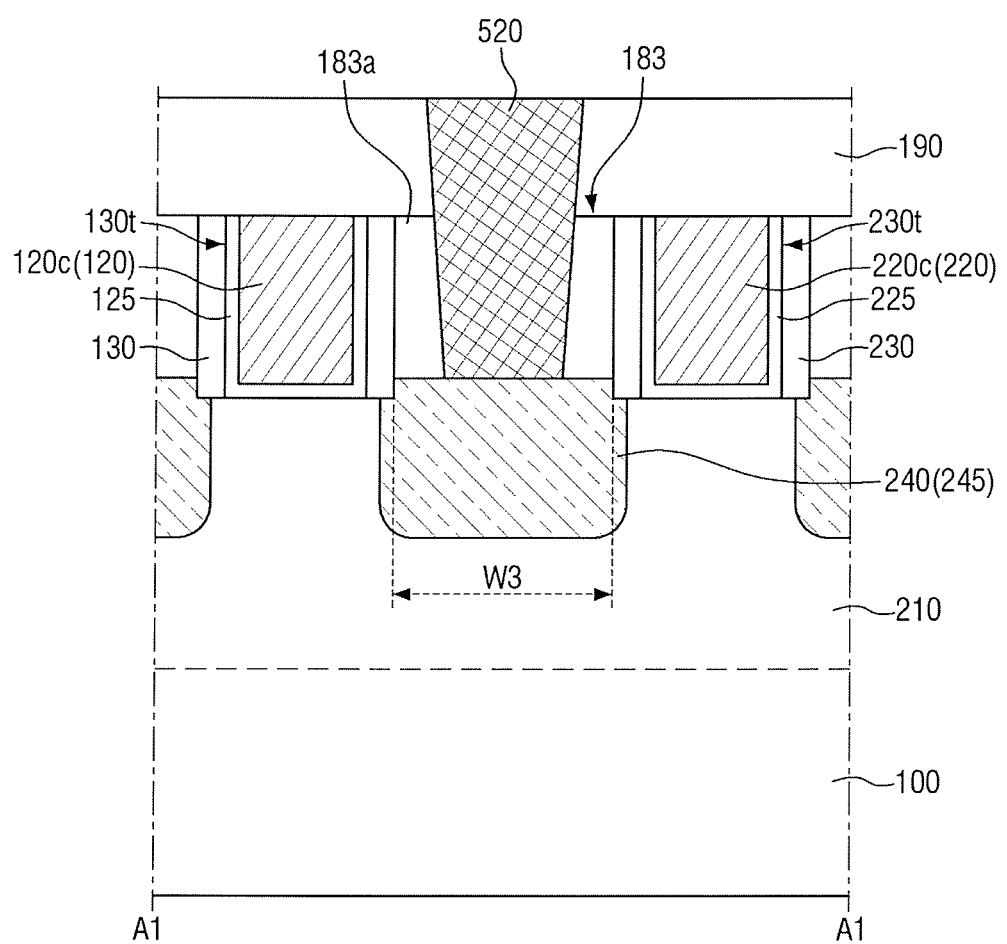
Figure 3A:
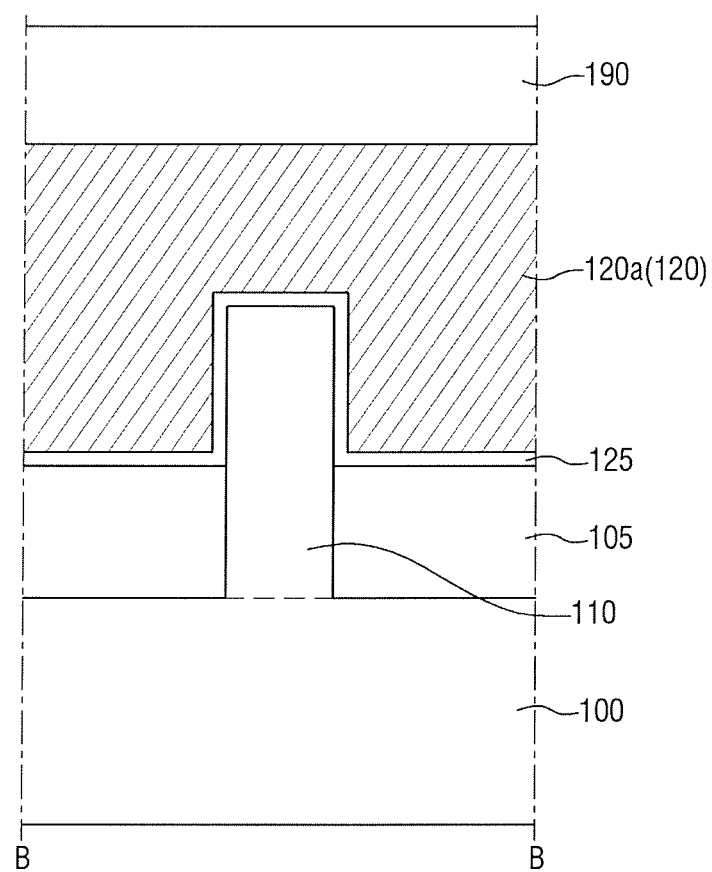
FIGS. 3A and 3B are cross sectional views taken along line B-B of FIG. 1 according to an exemplary embodiment of the present inventive concept.
Figure 3B:
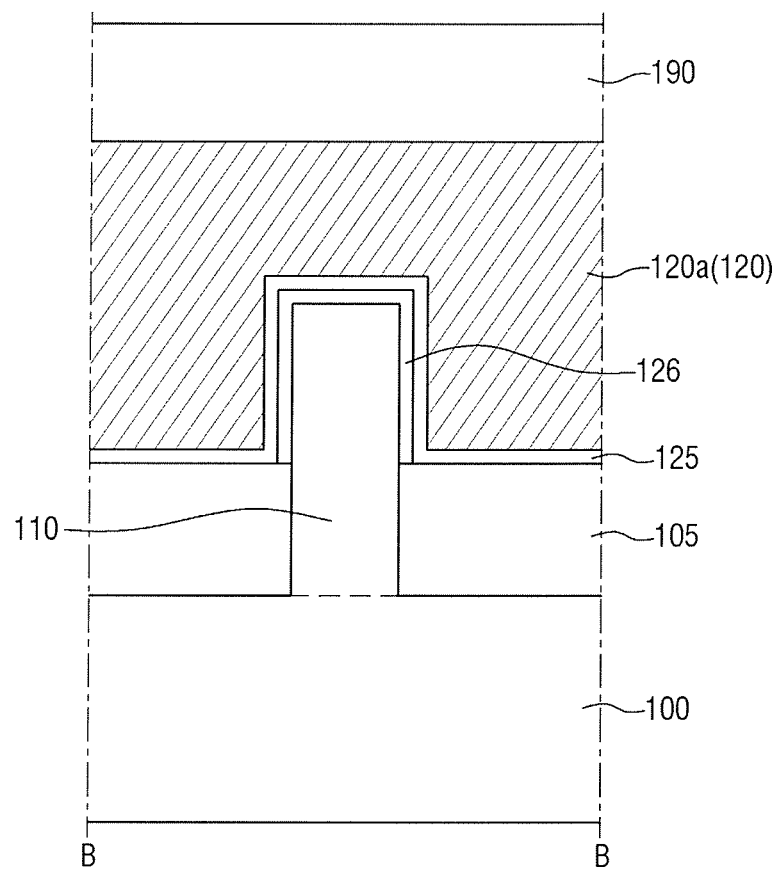
Figure 4:
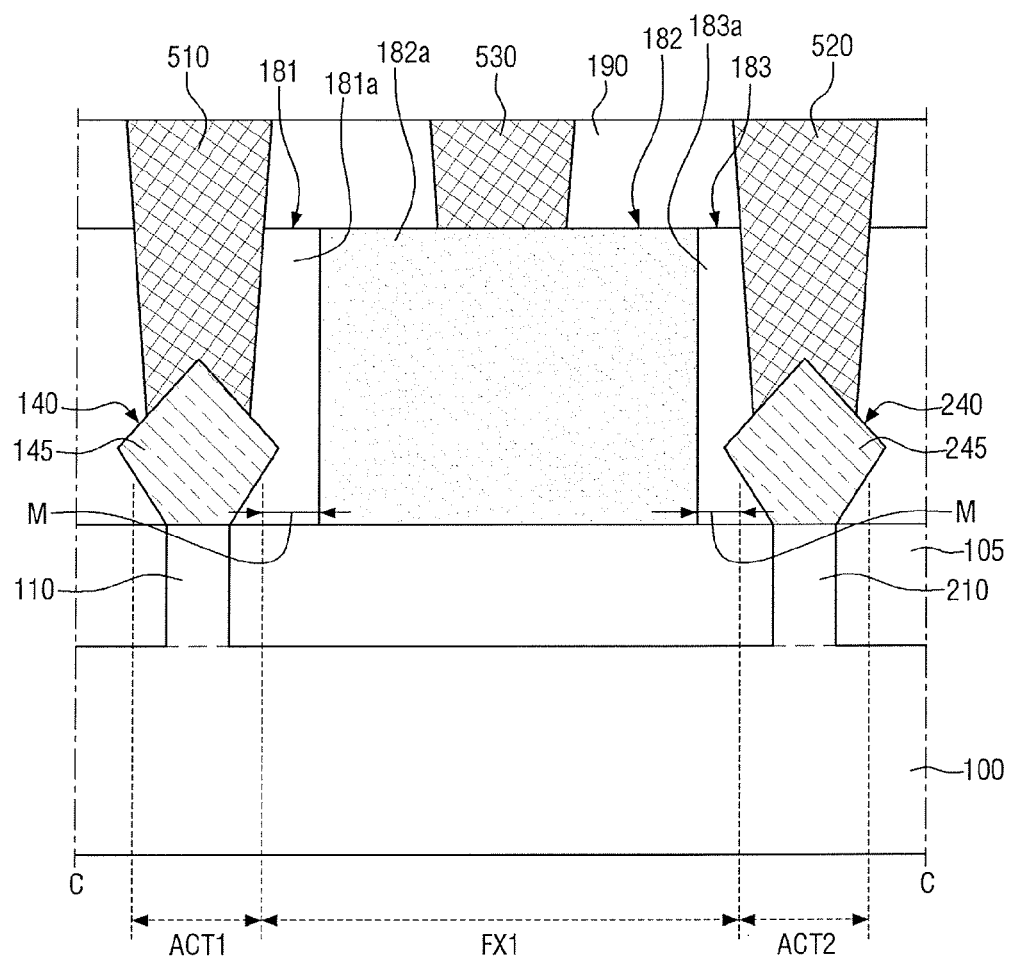
FIG. 4 is a cross sectional view taken along line C-C of FIG. 1 according to an exemplary embodiment of the present inventive concept.
Figure 5:
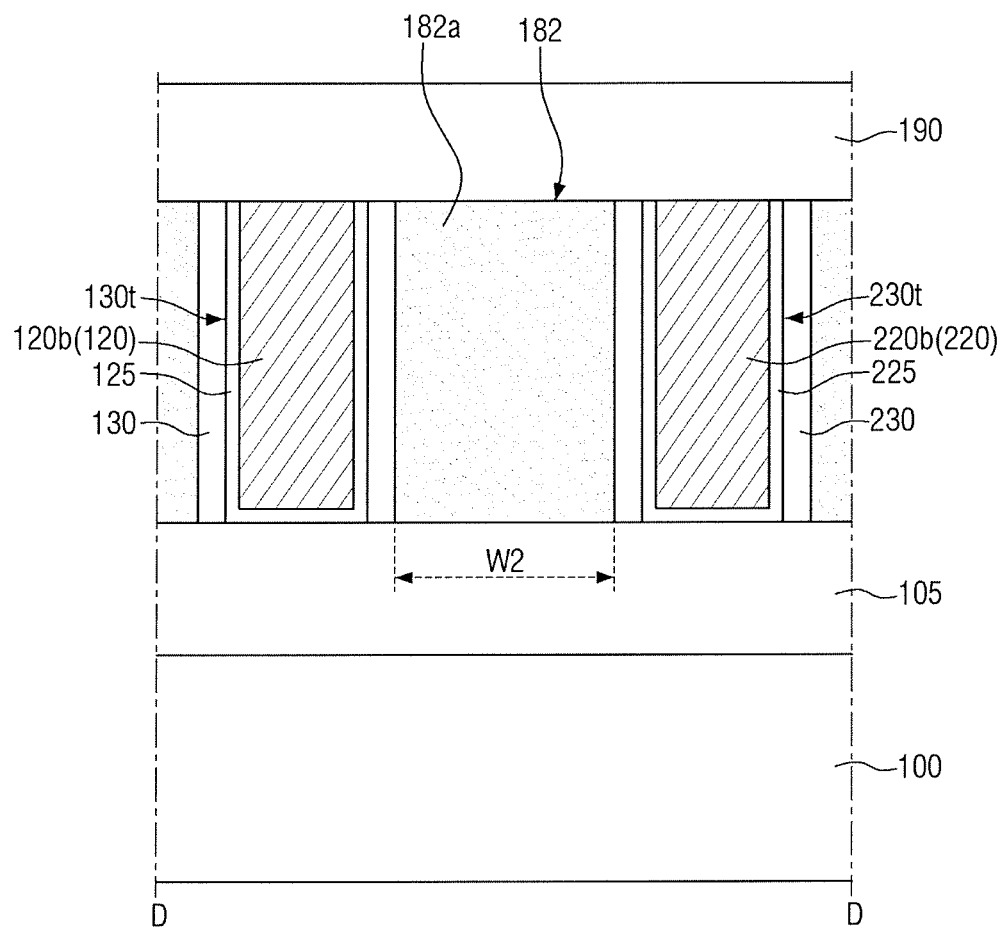
FIG. 5 is a cross sectional view taken along line D-D of FIG. 1 according to an exemplary embodiment of the present inventive concept.
Figure 6:
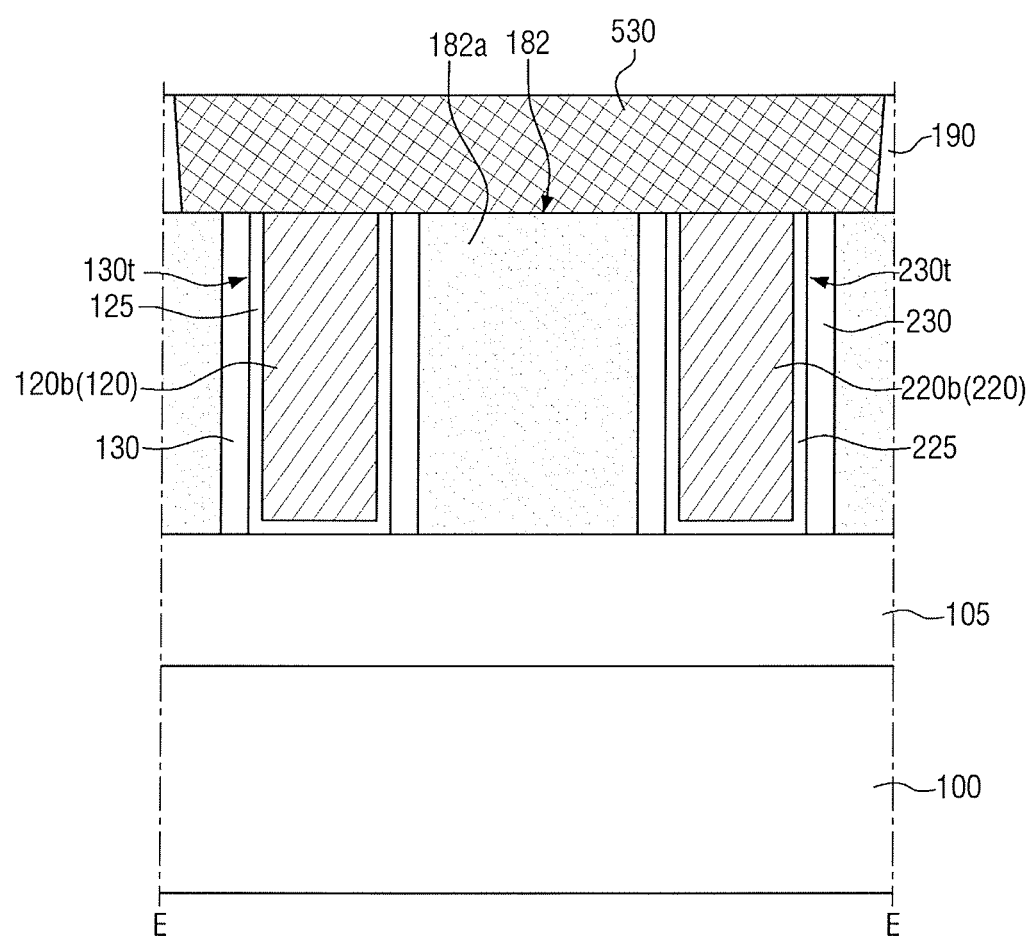
FIG. 6 is a cross sectional view taken along line E-E of FIG. 1 according to an exemplary embodiment of the present inventive concept.

FIG. 1 is a layout diagram provided to explain a semiconductor device according to an exemplary embodiment of the present inventive concept. FIGS. 2A and 2B are cross sectional views taken along line A1-A1 and line A2-A2 of FIG. 1, respectively. FIGS. 3A and 3B are cross sectional views taken along line B-B of FIG. 1. FIG. 4 is a cross sectional view taken along line C-C of FIG. 1. FIG. 5 is a cross sectional view taken along line D-D of FIG. 1. FIG. 6 is a cross sectional view taken along line E-E of FIG. 1.

Referring to FIGS. 1 to 6, the semiconductor device according to an exemplary embodiment of the present inventive concept may include a substrate 100, a first fin-type pattern 110, a second fin-type pattern 210, a first gate electrode 120, a second gate electrode 220, a first source/drain 140, a second source/drain 240, a first interlayer insulating structure 181, a second interlayer insulating structure 182, a first contact 510, a second contact 520, and a third contact 530.

The substrate 100 may include a first active region ACT1, a second active region ACT2, and a first field region FX1. The first field region FX1 may be formed directly adjacent to and bordered by the first active region ACT1 and the second active region ACT2.

The first active region ACT1 and the second active region ACT2 are spaced apart from each other, and may be isolated by the first field region FX1. In other words, the field region may surround the perimeter of the first active region ACT1 and the second active region ACT2 which are spaced apart from each other. In this case, a portion of the field region, between the first active region ACT1 and the second active region ACT2, may be the first field region FX1.

A portion where a channel region of a transistor is formed may be an active region, and a portion that distinguishes the channel region of the transistor formed in the active region may be a field region. Alternatively, the active region may be a portion where the fin-type pattern is formed as the channel region of the transistor, and the field region may be a region where the fin-type pattern is not formed.

As illustrated in FIG. 4, a deep trench defining the first field region FX1 may not be formed between the first active region ACT1 and the first field region FX1, and between the second active region ACT2 and the first field region FX1. That is, a trench defining the first fin-type pattern 110 and the second fin-type pattern 210 may be formed between the first active region ACT1 and the second active region ACT 2, but a trench having a different depth may not be formed. In the meantime, the case in which the first field region FX1 is defined by a trench with deep depth will be described with reference to FIG. 24. In addition, those skilled in the art will be obviously able to distinguish which portion is the field region, and which portion is the active region.

The transistor formed in the first active region ACT1 and the transistor formed in the second active region ACT2 may be the same type as each other, or may be different types from each other.

The substrate 100 may be a bulk silicon or a silicon-on-insulator (SOI). Alternatively, the substrate 100 may be a silicon substrate, or may include other material such as, for example, silicon germanium (SiGe), silicon germanium on insulator (SGOI), indium antimonide (InSb), lead telluride (PbTe), indium arsenide (InAs), indium phosphide (InP), gallium arsenide (GaAs), or gallium antimonide (GaSb), but not limited thereto.

The first fin-type pattern 110 may be formed in the first active region ACT1, and may protrude from the substrate 100 in the first active region ACT1. The first fin-type pattern 110 may extend longitudinally on the substrate 100 and in a first direction X.

The second fin-type pattern 210 may be formed in the second active region ACT2, and may protrude from the substrate 100 in the second active region ACT 2. The second fin-type pattern 210 may extend longitudinally on the substrate 100 and in the first direction X, and may be formed in parallel with the first fin-type pattern 110.

As illustrated in FIG. 1, one fin-type pattern may be formed in each of the first active region ACT1 and the second active region ACT2. However, as an alternative to the example illustrated, two or more fin-type patterns may be formed in the first active region ACT1 and/or the second active region ACT2. This will be described with reference to FIG. 27. That is, at least one or more fin-type patterns may be formed in each of the first active region ACT1 and the second active region ACT2. However, an exemplary embodiment of the present inventive concept will be first described with reference to an example in which one fin-type pattern is formed in each of the first active region ACT1 and the second active region ACT2.

The first fin-type pattern 110 and the second fin-type pattern 210 may be part of the substrate 100, and may include an epitaxial layer grown on the substrate 100.

The first fin-type pattern 110 and the second fin-type pattern 210 may include an element semiconductor material such as, for example, silicon or germanium. Further, the first fin-type pattern 110 and the second fin-type pattern 210 may include a compound semiconductor such as, for example, group IV-IV compound semiconductor or group III-V compound semiconductor. Specifically, take the group IV-IV compound semiconductor for example, the first fin-type pattern 110 and the second fin-type pattern 210 may be a binary compound or a ternary compound comprising at least two or more of carbon (C), silicon (Si), germanium (Ge) and tin (Sn), or these compounds doped with group IV element.

Take the group III-V compound semiconductor for instance, the first fin-type pattern 110 and the second fin-type pattern 210 may be one of a binary compound, a ternary compound and a quaternary compound which is formed by a combination of a group III element which may be at least one of aluminum (Al), gallium (Ga), and indium (In), with a group V element which may be one of phosphorus (P), arsenic (As) and antimony (Sb).

In the semiconductor device according to an exemplary embodiment of the present inventive concept, it is assumed that the first fin-type pattern 110 and the second fin-type pattern 210 are silicon fin-type patterns including silicon.

The fin-type pattern protruding from the substrate 100 may not be formed in the first field region FX1 between the first fin-type pattern 110 and the second fin-type pattern 210. Alternatively, there may not be an exposed fin-type pattern on which a semiconductor pattern may be formed, in the first field region FX1 between the first fin-type pattern 110 and the second fin-type pattern 210.

A field insulating film 105 may be formed on the substrate 100, and may span the first active region ACT1, the second active region ACT2, and the first field region FX1.

The field insulating film 105 may be formed such that the field insulating film 105 surrounds a portion of the first fin-type pattern 110 and a portion of the second fin-type pattern 210. The first fin-type pattern 110 and the second fin-type pattern 210 may be defined by the field insulating film 105. The portion of the first fin-type pattern 110 and the portion of the second fin-type pattern 210 may protrude upward higher than an upper surface of the field insulating film 105.

The field insulating film 105 may include, for example, an oxide film, a nitride film, an oxynitride film, or a combination thereof.

As illustrated in FIG. 1, first to third gate electrodes 120, 220, 320 may intersect the first fin-type pattern 110 and the second fin-type pattern 210, but exemplary embodiments of the present inventive concept are not limited thereto. Further, since description of the first gate electrode 120 and the second gate electrode 220 may be applied to the third gate electrode 320, an exemplary embodiment of the present inventive concept will be explained mainly with reference to the first gate electrode 120 and the second electrode 220 below.

As illustrated in FIG. 1, both the first gate electrode 120 and the second gate electrode 220 may intersect with the first fin-type pattern 110 and the second fin-type pattern 210, but exemplary embodiments of the present inventive concept are not limited thereto. The first gate electrode 120 intersecting with the first fin-type pattern 110, and the first gate electrode 120 intersecting with the second fin-type pattern 210 may be separated from each other, i.e., the existence of two first gate electrodes 120. Alternatively, the second gate electrode 220 intersecting with the first fin-type pattern 110, and the second gate electrode 220 intersecting with the second fin-type pattern 210 may be separated from each other, i.e., the existence of two second gate electrodes 220. Furthermore, the first and second gate electrodes 120, 220 intersecting with the first fin-type pattern 110, and the first and second gate electrodes 120, 220 intersecting with the second fin-type pattern 210 may be separated from each other.

Hereinbelow, it is assumed that the first gate electrodes 120 intersecting with the first fin-type pattern 110 and the second fin-type pattern 210 are not separated from each other, i.e., the existence of one first gate electrode 120, and the second gate electrodes 220 intersecting with the first fin-type pattern 110 and the second fin-type pattern 210 are not separated from each other, i.e., the existence of one second gate electrode 220.

A first gate spacer 130 and a second gate spacer 230 may be formed on the field insulating film 105 on the substrate 100, and may extend longitudinally in the second direction Y.

The first gate spacer 130 and the second gate spacer 230 may span the first active region ACT1, the first field region FX1, and the second active region ACT2.

The first gate spacer 130 and the second gate spacer 230 each may be formed on both the first fin-type pattern 110 and the second fin-type pattern 210. The first gate spacer 130 and the second gate spacer 230 each may intersect with both the first fin-type pattern 110 and the second fin-type pattern 210.

The first gate spacer 130 may define a first trench 130t extending in the second direction Y, and the second gate spacer 230 may define a second trench 230t extending in the second direction Y.

The first gate spacer 130 and the second gate spacer 230 may include at least one of, for example, silicon nitride (SiN), silicon oxynitride (SiON), silicon dioxide (SiO$_2$), silicon oxycarbonitride (SiOCN), and a combination thereof.

Depending on examples, the first gate spacer 130 and the second gate spacer 230 may serve as the guides to form self aligned contacts. Accordingly, the first gate spacer 130 and the second gate spacer 230 may include a material having etch selectivity to first to third interlayer insulating structures 181, 182, 183, and a top interlayer insulating film 190 which will be described below.

As illustrated in FIGS. 2A and 2B, the first gate spacer 130 and the second gate spacer 230 may be a single film, respectively. However, this is provided only for convenience of illustration and exemplary embodiments of the present inventive concept are not limited thereto.

When the first gate spacer 130 and the second gate spacer 230 are a plurality of films, at least one of the plurality of films of the first gate spacer 130 and the second gate spacer 230 may have an L-shape. In other words, when the first gate spacer 130 and the second gate spacer 230 are a plurality of films, each of the first gate spacer 130 and the second gate spacer 230 may be a combination of an L-shaped film and an I-shaped film.

An example in which the first gate spacer 130 and the second gate spacer 230 are a plurality of films will be described with reference to FIGS. 19 and 20.

The first gate insulating film 125 may span the first active region ACT1, the first field region FX1, and the second active region ACT2. The first gate insulating film 125 may be formed on the first fin-type pattern 110, the second fin-type pattern 210, and the field insulating film 105.

The first gate insulating film 125 may be formed along a sidewall and a bottom surface of the first trench 130t. The first gate insulating film 125 may be formed along profiles of the first fin-type pattern 110 and the second fin-type pattern 210 protruding upward higher than the field insulating film 105, the upper surface of the field insulating film 105, and an inner sidewall of the first gate spacer 130.

An interfacial layer 126 may be additionally formed between the first gate insulating film 125 and the first fin-type pattern 110 as shown in FIG. 3B. Although not illustrated in FIGS. 2A, 2B and 3A, the interfacial layer may also be additionally formed between the first gate insulating film 125 and the first fin-type pattern 110. In this case, the interfacial layer may also be additionally formed between the first gate insulating film 125 and the second fin-type pattern 210.

As illustrated in FIG. 3B, the interfacial layer 126 may be formed along the profile of the first fin-type pattern 110 protruding higher than the upper surface of the field insulating film 105, but exemplary embodiments of the present inventive concept are not limited thereto.

The interfacial layer 126 may extend along the upper surface of the field insulating film 105 depending on methods for forming the interfacial layer 126.

Hereinbelow, exemplary embodiments are explained by referring to drawings in which illustration of the interfacial layer 126 is omitted for convenience of explanation.

The second gate insulating film 225 may span the first active region ACT1, the first field region FX1, and the second active region ACT2. The second gate insulating film 225 may be formed on the first fin-type pattern 110, the second fin-type pattern 210, and the field insulating film 105.

The second gate insulating film 225 may be formed along a sidewall and a bottom surface of the second trench 230t. Since description of the second gate insulating film 225 may be substantially similar to that of the first gate insulating film 125, it will not be redundantly described below.

The first gate insulating film 125 and the second gate insulating film 225 may each include, for example, at least one of silicon oxide, silicon oxynitride, silicon nitride, and a high-k dielectric material with a higher dielectric constant than silicon oxide.

The high-k dielectric material may include one or more of, for example, hafnium oxide (HfO$_2$), hafnium silicon oxide (HfSiO), hafnium aluminum oxide (HfAlO), lanthanum oxide (La$_2$O$_3$), lanthanum aluminum oxide (LaAlO$_3$), zirconium oxide (ZrO$_2$), zirconium silicon oxide (ZrSiO$_4$), tantalum oxide (Ta$_2$O$_5$), titanium oxide (TiO$_2$), barium strontium titanium oxide (BaSrTi$_2$O$_6$), barium titanium oxide (BaTiO$_3$), strontium titanium oxide (SrTiO$_3$), yttrium oxide (Y$_2$O$_3$), aluminum oxide (Al$_2$O$_3$), lead scandium tantalum oxide (Pb(Sc,Ta)O$_3$), and lead zinc niobate (Pb(Zn$_{1/3}$Nb$_{2/3}$)O$_3$). Further, while the high-k dielectric material described above is explained mainly with reference to oxides, alternatively, the high-k dielectric material may include one or more of the nitride (e.g., hafnium nitride), or one or more of the oxynitride (e.g., hafnium oxynitride) of the metal materials described above, but not limited thereto.

The first gate electrode 120 may be formed on the first gate insulating film 125, and may fill the first trench 130t.

The second gate electrode 220 may be formed on the second gate insulating film 225, and may fill the second trench 230t.

The first gate electrode 120 and the second gate electrode 220 may span the first active region ACT1, the first field region FX1, and the second active region ACT2, respectively. The first gate electrode 120 and the second gate electrode 220 may intersect with the first fin-type pattern 110 and the second fin-type pattern 210.

The first gate spacer 130 may be formed on a sidewall of the first gate electrode 120, and the second gate spacer 230 may be formed on a sidewall of the second gate electrode 220. Further, the first gate insulating film 125 may be formed along the sidewall and a bottom surface of the first gate electrode 120, and the gate insulating film 225 may be formed along the sidewall and a bottom surface of the second gate electrode 220.

The first gate insulating film 125 formed on the sidewall of the first gate electrode 120 is interposed between the first gate spacer 130 and the first gate electrode 120. The second gate insulating film 225 formed on the sidewall of the second gate electrode 220 is interposed between the second gate spacer 230 and the second gate electrode 220.

The first gate electrode 120 may include a first portion 120a, a second portion 120b, and a third portion 120c.

The first portion 120a of the first gate electrode may be formed in the first active region ACT1, and the third portion 120c of the first gate electrode may be formed in the second active region ACT2. The second portion 120b of the first gate electrode may be positioned between the first portion 120a of the first gate electrode and the third portion 120c of the first gate electrode.

The second portion 120b of the first gate electrode may be formed in the first field region FX1, and may not overlap with the first active region ACT1 and the second active region ACT2.

The first portion 120a of the first gate electrode may intersect with the first fin-type pattern 110 to surround the first fin-type pattern 110 protruding upward higher than the field insulating film 105, and may overlap with the first active region ACT1.

The third portion 120c of the first gate electrode may intersect with the second fin-type pattern 210 to surround the second fin-type pattern 210 protruding upward higher than the field insulating film 105, and may overlap with the second active region ACT2.

The second portion 120b of the first gate electrode may not intersect with any fin-type pattern. More specifically, there may not be a fin-type pattern surrounded by the second portion 120b of the first gate electrode.

The second gate electrode 220 may include a first portion 220a, a second portion 220b, and a third portion 220c. The first portion 220a of the second gate electrode may correspond to the first portion 120a of the first gate electrode, the second portion 220b of the second gate electrode may correspond to the second portion 120b of the first gate electrode, and the third portion 220c of the second gate electrode may correspond to the third portion 120c of the first gate electrode. Accordingly, the first portion 220a of the second gate electrode may be formed in the first active region ACT1, and the third portion 220c of the second gate electrode may be formed in the second active region ACT2. The second portion 220b of the second gate electrode may be positioned between the first portion 220a of the second gate electrode and the third portion 220c of the second gate electrode.

The second portion 220b of the second gate electrode may be formed in the first field region FX1, and may not overlap with the first active region ACT1 and the second active region ACT2.

The first portion 220a of the second gate electrode may intersect with the first fin-type pattern 110 to surround the first fin-type pattern 110 protruding upward higher than the field insulating film 105, and may overlap with the first active region ACT1.

The third portion 220c of the second gate electrode may intersect with the second fin-type pattern 210 to surround the second fin-type pattern 210 protruding upward higher than the field insulating film 105, and may overlap with the second active region ACT2.

The second portion 220b of the second gate electrode may not intersect with any fin-type pattern. More specifically, there may not be a fin-type pattern surrounded by the second portion 220b of the second gate electrode.

The first portion 120a of the first gate electrode and the first portion 220a of the second gate electrode may not be defined as a width of the first active region ACT1 in the second direction Y. Further, the third portion 120c of the first gate electrode and the third portion 220c of the second gate electrode may not be defined as a width of the second active region ACT2 in the second direction Y. For example, a portion of the first portion 120a of the first gate electrode and a portion of the first portion 220a of the second gate electrode may be formed in the first field region FX1.

As illustrated, the first gate electrode 120 and the second gate electrode 220 may be single films. However, this is provided only for convenience of illustration and exemplary embodiments of the present inventive concept are not limited thereto. That is, it is of course possible that the first gate electrode 120 and/or the second gate electrode 220 may each include a plurality of films such as a barrier film, a work function adjustment film, a filling film, and so on.

The first gate electrode 120 and the second gate electrode 220 may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantlum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and a combination thereof. The first gate electrode 120 and the second gate electrode 220 may each include a conductive metal oxide, a conductive metal oxynitride, and so on, and may each include an oxidized form of the materials described above.

The first source/drain 140 may be formed between the first gate electrode 120 and the second gate electrode 220, and may include a first epitaxial layer 145 formed on the first fin-type pattern 110, although exemplary embodiments of the present inventive concept are not limited thereto.

The second source/drain 240 may be formed between the first gate electrode 120 and the second gate electrode 220, and may include a second epitaxial layer 245 formed on the second fin-type pattern 210, although exemplary embodiments of the present inventive concept are not limited thereto.

The first source/drain 140 may be impurity regions formed within the first fin-type pattern 110, and may include an epitaxial layer formed along a profile of the first fin-type pattern 110. For example, the first source/drain 140 and the second source/drain 240 may be raised source/drains.

As illustrated in FIG. 4, the first epitaxial layer 145 and the second epitaxial layer 245 may not include an outer circumference extending along the upper surface of the field insulating film 105, but this is provided only for convenience of explanation and the exemplary embodiments of the present inventive concept are not limited thereto. That is, the first epitaxial layer 145 and/or the second epitaxial layer 245 may include an outer circumference extending along the upper surface of the field insulating film 105 and being in surface-contact with the field insulating film 105. In addition, since there is no fin-type pattern protruding upward higher than the upper surface of the field insulating film 105 in the first field region FX1, a semiconductor pattern such as the first epitaxial layer 145 and the second epitaxial layer 245 may not be formed in the first field region FX1.

When transistors in the first active region ACT1 and the second active region ACT2 according to an exemplary embodiment of the present inventive concept are PMOS transistors, the first epitaxial layer 145 and the second epitaxial layer 245 may include a compressive stress material. For example, the compressive stress material may be a material such as SiGe that has a lattice constant larger than that of the Si. The compressive stress material may enhance mobility of the carrier in the channel region by exerting compressive stress on the first fin-type pattern 110 and the second fin-type pattern 210.

When transistors in the first active region ACT1 and the second active region ACT2 according to an exemplary embodiment of the present inventive concept are NMOS transistors, the first epitaxial layer 145 and the second epitaxial layer 245 may include a tensile stress material. For example, when the first fin-type pattern 110 and the second fin-type pattern 210 are silicon, the first epitaxial layer 145 and the second epitaxial layer 245 may be a material such as SiC which has a lattice constant smaller than that of the silicon. The tensile stress material may enhance mobility of the carrier in the channel region by exerting tensile stress on the first fin-type pattern 110 and the second fin-type pattern 210.

When transistors in the first active region ACT1 and the second active region ACT2 according to an exemplary embodiment of the present inventive concept are NMOS transistors, the first epitaxial layer 145 and the second epitaxial layer 245 may include a material the same as that included in the first fin-type pattern 110 and the second fin-type pattern 210, i.e., silicon.

When transistors in the first active region ACT1 and the second active region ACT2 are different types from each other, e.g., one is n-type and the other one is p-type, the first epitaxial layer 145 and the second epitaxial layer 245 may each include a material suitable for its respective type.

Lower interlayer insulating films 181, 182, 183 may be formed on the field insulating film 105 on the substrate 100. The lower interlayer insulating films 181, 182, 183 may include a first interlayer insulating structure 181, a second interlayer insulating structure 182, and a third interlayer insulating structure 183.

The first interlayer insulating structure 181 may be formed on the field insulating film 105 on the substrate 100. The first interlayer insulating structure 181 may be formed on the first source/drain 140 on the first fin-type pattern 110, and may overlay the first epitaxial layer 145.

The first interlayer insulating structure 181 may be positioned between the first portion 120a of the first gate electrode and the first portion 220a of the second gate electrode. The first interlayer insulating structure 181 may surround a sidewall of the first portion 120a of the first gate electrode and a sidewall of the first portion 220a of the second gate electrode.

The upper surface of the first interlayer insulating structure 181 may be in the same plane as the upper surface of the first gate electrode 120 and the upper surface of the second gate electrode 220.

The first interlayer insulating structure 181 may be formed in the first active region ACT1. Further, a portion of the first interlayer insulating structure 181 may be formed on the substrate 100 in the first field region FX1. A margin width M where the first field region FX1 overlaps with the first interlayer insulating structure 181 will be described, and this will be described when explaining a semiconductor fabrication method with reference to FIGS. 31 to 44C.

The first interlayer insulating structure 181 may have a first dielectric constant. The first interlayer insulating structure 181 may have a first interlayer insulating material 181a. For example, the first interlayer insulating material 181a may include, for example, silicon oxide, silicon oxynitride, silicon nitride, flowable oxide (FOX), Tonen silazene (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but not limited thereto.

Referring to FIG. 5, the second interlayer insulating structure 182 may be formed on the field insulating film 105 on the substrate 100, and may be formed on the field insulating film 105 on the first field region FX1.

Since there is no fin-type pattern formed on the substrate 100 or a semiconductor material exposed by the field insulating film 105 in the first field region FX1, no semiconductor pattern may be formed between the second interlayer insulating structure 182 and the field insulating film 105.

The second interlayer insulating structure 182 may be disposed between the second portion 120b of the first gate electrode and the second portion 220b of the second gate electrode. The second interlayer insulating structure 182 may surround the sidewall of the second portion 120b of the first gate electrode and the sidewall of the second portion 220b of the second gate electrode.

The upper surface of the second interlayer insulating structure 182 may be in the same plane as the upper surface of the first gate electrode 120 and the upper surface of the second gate electrode 220.

Referring to FIG. 4, the second interlayer insulating structure 182 may be in contact with the first interlayer insulating structure 181. The boundary between the second interlayer insulating structure 182 and the first interlayer insulating structure 181 may be positioned in the first field region FX1 and separated from the boundary between the first active region ACT1 and the first field region FX1 by a margin distance M, i.e. the margin width M.

The second interlayer insulating structure 182 may have a second dielectric constant which is different from the first dielectric constant of the first interlayer insulating structure 181. For example, the second dielectric constant of the second interlayer insulating structure 182 may be smaller than the first dielectric constant of the first interlayer insulating structure 181.

The second interlayer insulating structure 182 may have a second interlayer insulating material 182a. For example, the second interlayer insulating material 182a may include, for example, silicon oxide, silicon oxynitride, silicon nitride, flowable oxide (FOX), Tonen silazene (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but not limited thereto.

Since the first dielectric constant and the second dielectric constant may be different, the first interlayer insulating material 181a and the second interlayer insulating material 182a may be different from each other. For example, a dielectric constant of the second interlayer insulating material 182a may be smaller than a dielectric constant of the first interlayer insulating material 181a.

The third interlayer insulating structure 183 may be formed on the field insulating film 105 on the substrate 100, and may be in contact with the second interlayer insulating structure 182.

The third interlayer insulating structure 183 may be formed on the second source/drain 240 on the second fin-type pattern 210, and may overlay the second epitaxial layer 245.

The third interlayer insulating structure 183 may be disposed between the third portion 120c of the first gate electrode and the third portion 220c of the second gate electrode. The third interlayer insulating structure 183 may surround the sidewall of the third portion 120c of the first gate electrode and the sidewall of the third portion 220c of the second gate electrode.

The upper surface of the third interlayer insulating structure 183 may be in the same plane as the upper surface of the first gate electrode 120 and the upper surface of the second gate electrode 220.

The third interlayer insulating structure 183 may be formed in the second active region ACT2. Further, a portion of the third interlayer insulating structure 183 may be formed on the substrate 100 in the first field region FX1. A width by which the first field region FX1 overlaps with the first interlayer insulating structure 181 may be the margin width M.

The third interlayer insulating structure 183 may have a third dielectric constant, and may have a third interlayer insulating material 183a.

The first interlayer insulating structure 181 may be formed in the same fabrication process as the third interlayer insulating structure 183 is formed. As a result, the third dielectric constant of the third interlayer insulating structure 183 may be substantially equal to the first dielectric constant of the first interlayer insulating structure 181. Further, the first interlayer insulating material 181a and the third interlayer insulating material 183a may be the same material.

In the semiconductor device according to an exemplary embodiment of the present inventive concept, the second dielectric constant of the second interlayer insulating structure 182 and the dielectric constant of the second interlayer insulating material 182a may not be always the same. For example, when the second interlayer insulating structure 182 also includes a material different from the second interlayer insulating material 182a, the second dielectric constant of the second interlayer insulating structure 182 may be different from the dielectric constant of the second interlayer insulating material 182a. In this case, the second dielectric constant of the second interlayer insulating structure 182 may be the bulk dielectric constant obtained in consideration of the dielectric constant and the volume of the second interlayer insulating material 182a and the dielectric constant and the volume of the different material included.

The second interlayer insulating structure 182 may be disposed between the first interlayer insulating structure 181 and the third interlayer insulating structure 183. In other words, the second interlayer insulating structure 182 is disposed between the first fin-type pattern 110 and the second fin-type pattern 210.

Referring to FIGS. 2A to 6, the first interlayer insulating structure 181, the third interlayer insulating structure 183, and the second interlayer insulating structure 182 may not include an air gap.

In the semiconductor device according to an exemplary embodiment of the present inventive concept, the air gap included in the second interlayer insulating structure 182 may refer to an air gap surrounded by the second interlayer insulating material 182a. That is, as shown in FIGS. 2A to 6, the first interlayer insulating structure 181 includes no air gap surrounded by the first interlayer insulating material 181a, the second interlayer insulating structure 182 includes no air gap surrounded by the second interlayer insulating material 182a, and the third interlayer insulating structure 183 includes no air gap surrounded by the third interlayer insulating material 183a.

In FIGS. 2A, 2B and 5, a width W1 of the first interlayer insulating structure 181 in the first direction X may be equal to a width W3 of the third interlayer insulating structure 183 in the first direction X. Further, in the semiconductor device according to an exemplary embodiment of the present inventive concept, the width W1 of the first interlayer insulating structure 181 in the first direction X may be equal to the width W2 of the second interlayer insulating structure 182 in the first direction X.

In FIGS. 2A, 2B and 5, the number of insertion films interposed between the sidewall of the first gate electrode 120 and the first interlayer insulating structure 181 may be equal to the number of insertion films interposed between the sidewall of the first gate electrode 120 and the second interlayer insulating structure 182. In other words, the first gate insulating film 125 and the first gate spacer 130 are equally interposed between the sidewall of the first gate electrode 120 and the first interlayer insulating structure 181, and between the sidewall of the first gate electrode 120 and the second interlayer insulating structure 182. In addition, the first to third interlayer insulating structures 181, 182, 183 are described mainly with reference to a region between the first gate electrode 120 and the second gate electrode 220. However, description of the first to third interlayer insulating structures 181, 182, 183 is also applicable to a region between the second gate electrode 220 and the third gate electrode 320, and so on.

An upper interlayer insulating film 190 may be formed on the lower interlayer insulating films 181, 182, 183. The upper interlayer insulating film 190 may overlay the first gate electrode 120, the second gate electrode 220, and the third gate electrode 320.

The upper interlayer insulating film 190 may include, for example, silicon oxide, silicon oxynitride, silicon nitride, flowable oxide (FOX), Tonen silazene (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but not limited thereto.

The first contact 510 may be formed on the first fin-type pattern 110 between the first gate electrode 120 and the second gate electrode 220, and may be formed on the first source/drain 140, and connected with the first source/drain 140. The first contact 510 may be formed in the first active region ACT1.

The first contact 510 may be formed within the first interlayer insulating structure 181 and the upper interlayer insulating film 190.

Although the boundary between the first contact 510 and the first epitaxial layer 145 is illustrated to be a facet of the first epitaxial layer 145, this is only for convenience of explanation and the exemplary embodiments of the present inventive concept are not limited thereto.

Although not illustrated in FIGS. 2A to 4, a silicide layer may be additionally formed between the first contact 510 and the first source/drain 140.

The second contact 520 may be formed on the second fin-type pattern 210 between the first gate electrode 120 and the second gate electrode 220, and may be formed on the second source/drain 240, and connected with the second source/drain 240. The second contact 520 may be formed in the second active region ACT2.

The second contact 520 may be formed within the third interlayer insulating structure 183 and the upper interlayer insulating film 190.

The third contact 530 may be formed in the first field region FX1, and may be formed on the second portion 120b of the first gate electrode and the second portion 220b of the second gate electrode. The third contact 530 may be connected with the first gate electrode 120 and the second gate electrode 220.

The third contact 530 may be formed within the upper interlayer insulating film 190, and may be formed on the second interlayer insulating structure 182.

As illustrated in FIGS. 4 and 6, a bottom surface of the third contact 530 overlapping with the second interlayer insulating structure 182 may be in the same plane as the upper surfaces of the first gate electrode 120 and the second gate electrode 220, but this is provided only for convenience of explanation and the exemplary embodiments of the present inventive concept are not limited thereto.

As illustrated in FIG. 1, the third contact 530 may be connected with the first gate electrode 120 and the second gate electrode 220, but this is provided only for convenience of illustration and exemplary embodiments of the present inventive concept are not limited thereto. The third contact 530 may be connected with one of the first gate electrode 120 and the second gate electrode 220. Further, as illustrated in FIG. 1, a contact connected with the third gate electrode 320 may not be formed on the substrate 100 in the first field region FX1, but this is provided only for convenience of illustration and exemplary embodiments of the present inventive concept are not limited thereto.

The first to third contacts 510, 520, 530 may each include at least one of, for example, tantalum (Ta), tantalum nitride (TaN), titanium (Ti), titanium nitride (TiN), ruthenium (Ru), nickel (Ni), nickel boride (NiB), tungsten nitride (WN), aluminum (Al), tungsten (W), copper (Cu), cobalt (Co) and doped polysilicon.

Although the first to third contacts 510, 520, 530 are illustrated to be a single pattern, respectively, this is only for convenience of explanation and the exemplary embodiments of the present inventive concept are not limited thereto. The first to third contacts 510, 520, 530 may each include a barrier film, and a filling film formed on the barrier film.

Due to the integration density of the semiconductor device becoming higher, interval between, for example, the first and second contacts 510, 520 connected with the first and second source/drain 140, 240, and the third contact 530 connected with the first and second gate electrodes 120, 220 is becoming smaller.

As interval between the contacts connected with the source/drain and the contacts connected with the gate electrode is becoming smaller, capacitance between the contacts connected with the source/drain and the contacts connected with the gate electrode is becoming larger. As a result, parasitic capacitance generated from the coupling of the source/drain and the gate electrode becomes larger. Increase of the parasitic capacitance to a larger value may lead to reduced operating performance and degraded reliability of the semiconductor device. Therefore, the capacitance between the contact connected the source/drain and the contact connected the gate electrode may be reduced by decreasing the dielectric constant of the second interlayer insulating structure 182 formed in the first field region FX1. As a result, it is possible to obtain better operating performance and reliability of the semiconductor device by decreasing the parasitic capacitance generated from coupling between contacts of the source/drain and the gate electrode.

Figure 7:
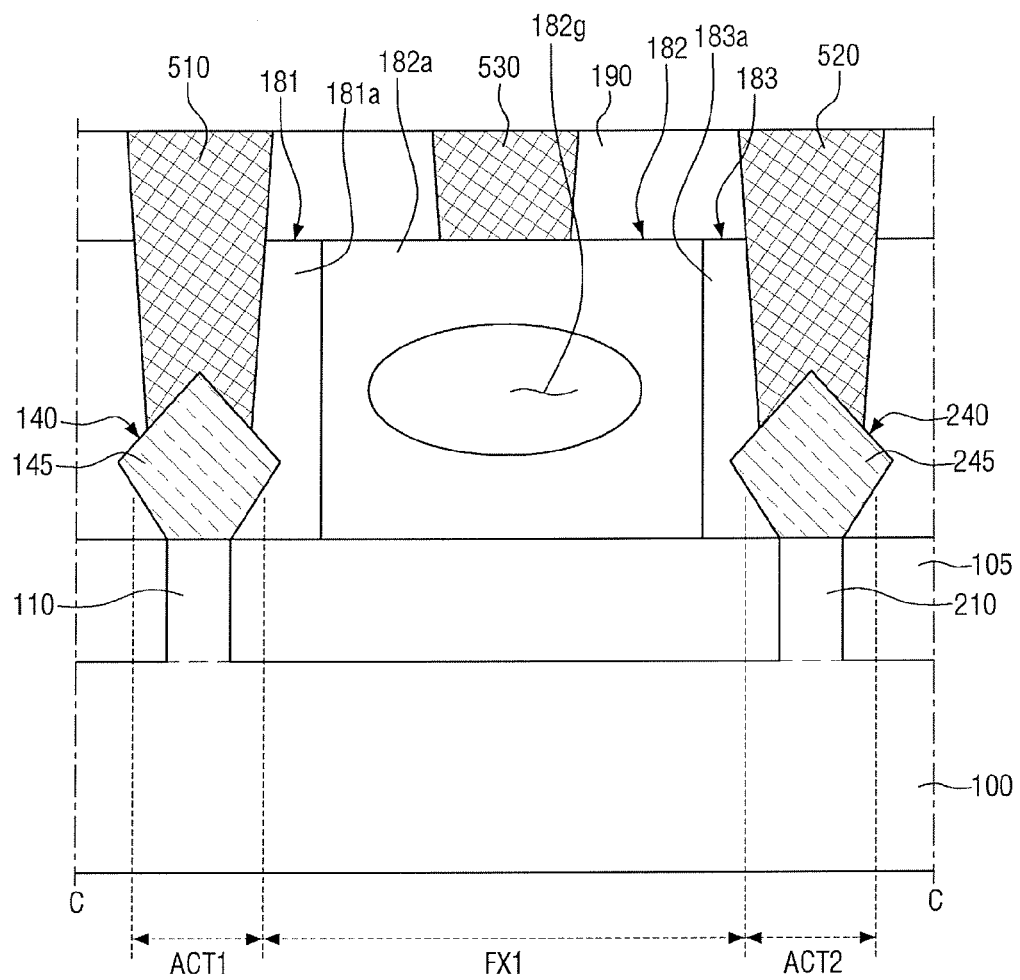
FIGS. 7 and 8 are views provided to explain a semiconductor device according to an exemplary embodiment of the present inventive concept.
Figure 8:
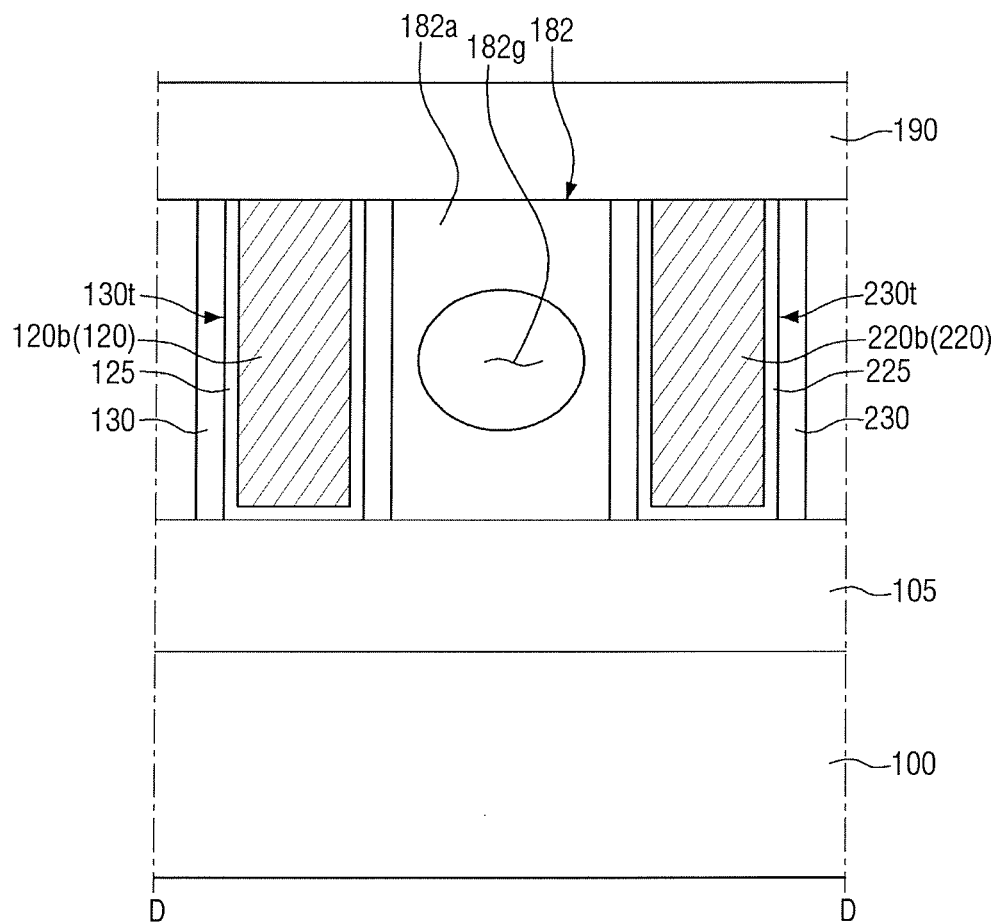

FIGS. 7 and 8 are views provided to explain a semiconductor device according to an exemplary embodiment of the present inventive concept. For convenience of explanation, differences that are not explained above with reference to FIGS. 1 to 6 will be mainly explained below.

For reference, FIG. 7 is a cross sectional view taken along line C-C of FIG. 1, and FIG. 8 is a cross sectional view taken along line D-D of FIG. 1.

Referring to FIGS. 7 and 8, in a semiconductor device according to an exemplary embodiment of the present inventive concept, the second interlayer insulating structure 182 may include an air gap 182g.

The second interlayer insulating structure 182 may include the second interlayer insulating material 182a, and the air gap 182g formed within the space filled with the second interlayer insulating material 182a. The air gap 182g may be surrounded by the second interlayer insulating material 182a. However, the first interlayer insulating structure 181 and the third interlayer insulating structure 183 may not include an air gap, respectively. That is, the first interlayer insulating structure 181 may not include an air gap surrounded by the first interlayer insulating material 181a, and the third interlayer insulating structure 183 may not include an air gap surrounded by the third interlayer insulating material 183a.

Since the second interlayer insulating structure 182 includes a different material besides second interlayer insulating material 182a, the second dielectric constant of the second interlayer insulating structure 182 is different from the dielectric constant of the second interlayer insulating material 182a. That is, since the second interlayer insulating structure 182 includes an air gap, the second dielectric constant of the second interlayer insulating structure 182 is smaller than the dielectric constant of the second interlayer insulating material 182a. In this case, the second dielectric constant of the second interlayer insulating structure 182 may be the bulk dielectric constant obtained in consideration of the dielectric constant and the volume of the second interlayer insulating material 182a and the dielectric constant and the volume of the air gap 182g. By choosing various depth-height-width combinations of the air gap 182g, the dielectric constant of the second interlayer insulating structure 182 may be tuned to the desired value. For example, by incorporating the air gap 182g with a larger size to the second interlayer insulating structure 182, a lower dielectric constant may be obtained for the second interlayer insulating structure 182.

In the semiconductor device according to an exemplary embodiment of the present inventive concept, the dielectric constant of the second interlayer insulating material 182a may be equal to the dielectric constant of the first interlayer insulating material 181a and the dielectric constant of the third interlayer insulating material 183a. For example, the second interlayer insulating material 182a included in the second interlayer insulating structure 182 may be a material which is the same as the material of the first interlayer insulating material 181a and the third interlayer insulating material 183a.

Figure 9:
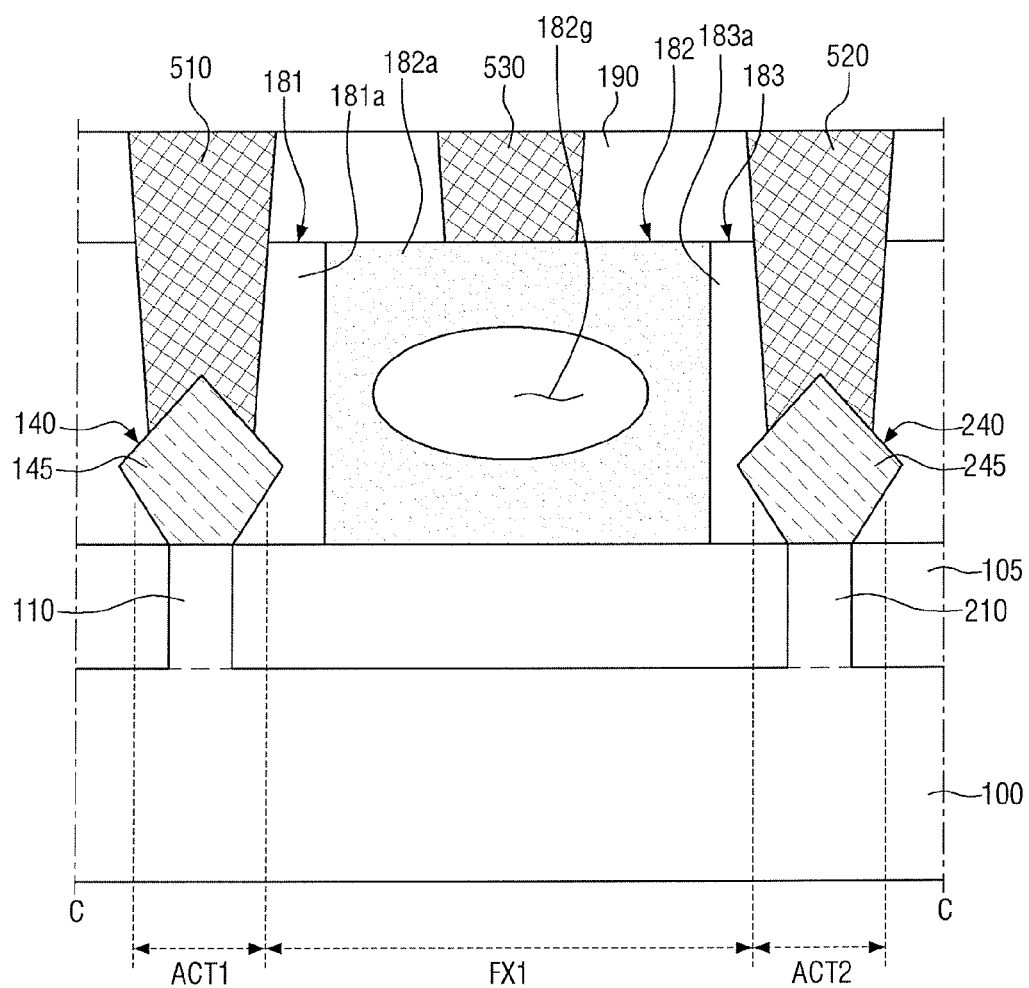
FIGS. 9 and 10 are views provided to explain a semiconductor device according to an exemplary embodiment of the present inventive concept.
Figure 10:
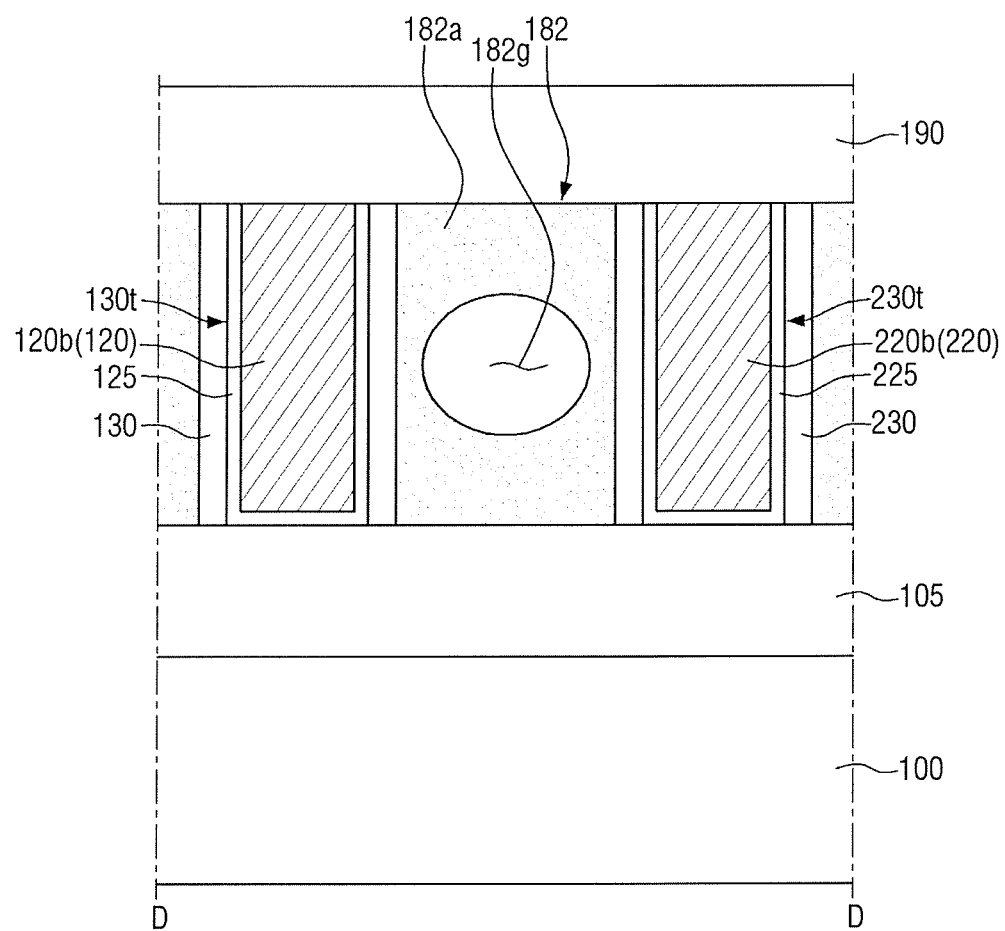

FIGS. 9 and 10 are views provided to explain a semiconductor device according to an exemplary embodiment of the present inventive concept. For convenience of explanation, differences that are not explained above with reference to FIGS. 7 and 8 will be mainly explained below.

For reference, FIG. 9 is a cross sectional view taken along line C-C of FIG. 1, and FIG. 10 is a cross sectional view taken along line D-D of FIG. 1.

Referring to FIGS. 9 and 10, in the semiconductor device according to an exemplary embodiment of the present inventive concept, the dielectric constant of the second interlayer insulating material 182a included in the second interlayer insulating structure 182 may be different from the dielectric constant of the first interlayer insulating material 181a and the dielectric constant of the third interlayer insulating material 183a.

In the semiconductor device according to an exemplary embodiment of the present inventive concept, the dielectric constant of the second interlayer insulating material 182a may be smaller than the dielectric constant of the first interlayer insulating material 181a and the dielectric constant of the third interlayer insulating material 183a. Further, the second interlayer insulating material 182a may be a material different from the material of the first interlayer insulating material 181a and the third interlayer insulating material 183a.

The air gap 182g may be surrounded by the second interlayer insulating material 182a having the dielectric constant smaller than that of the first interlayer insulating material 181a.

Figure 11:
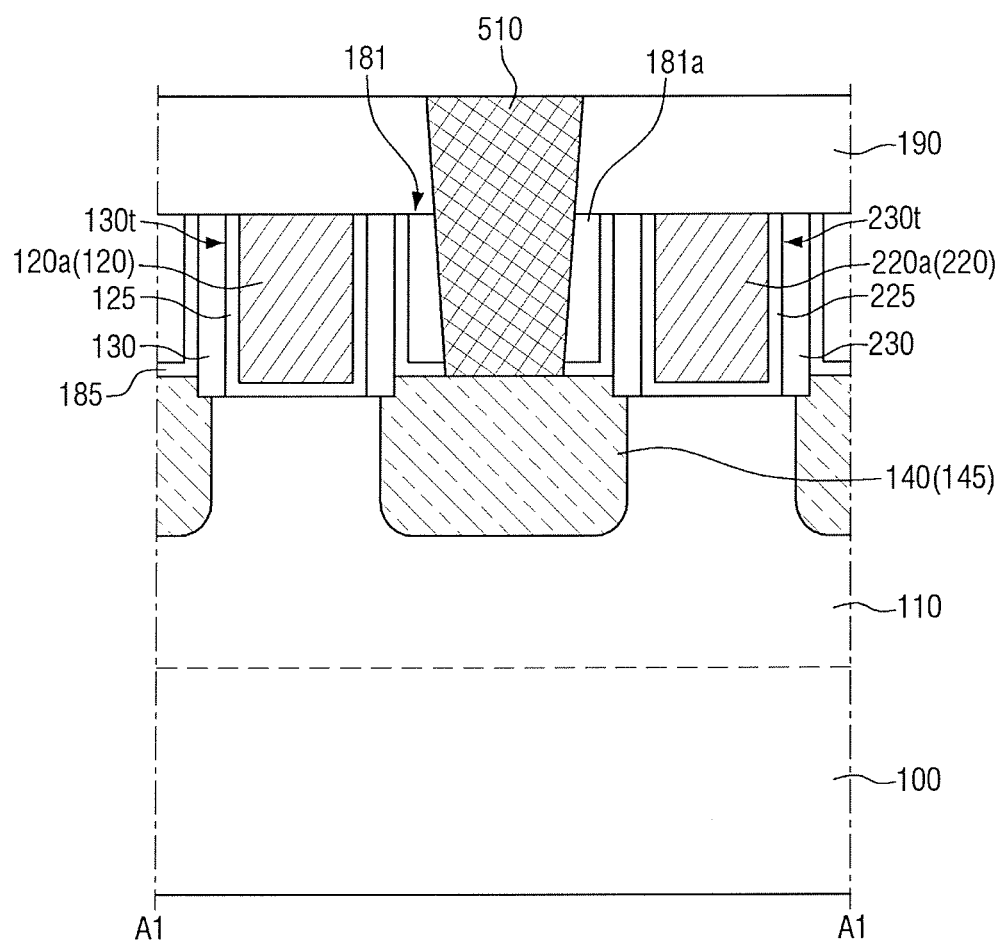
FIGS. 11 and 12 are views provided to explain a semiconductor device according to an exemplary embodiment of the present inventive concept.
Figure 12:
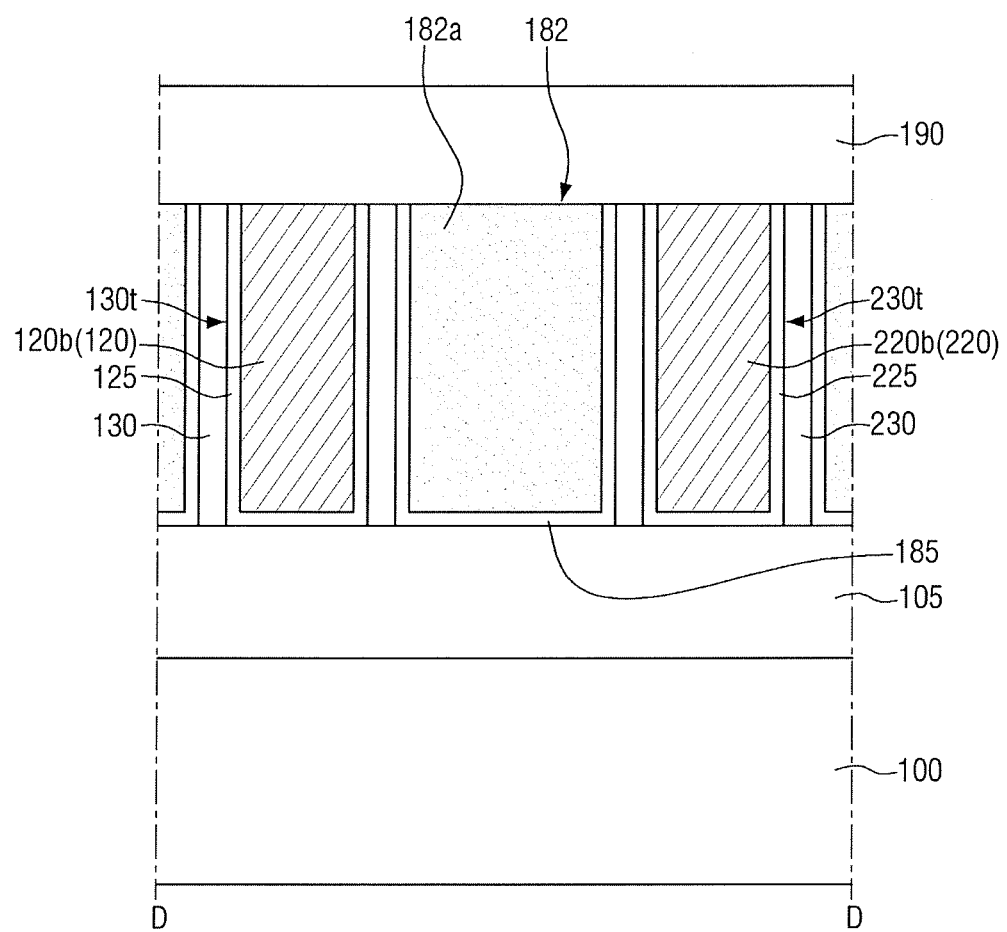

FIGS. 11 and 12 are views provided to explain a semiconductor device according to an exemplary embodiment of the present inventive concept. For convenience of explanation, differences that are not explained above with reference to FIGS. 1 and 6 will be mainly explained below.

For reference, FIG. 11 is a cross sectional view taken along line A1-A1 of FIG. 1, and FIG. 12 is a cross sectional view taken along line D-D of FIG. 1.

Referring to FIGS. 11 and 12, the semiconductor device according to an exemplary embodiment of the present inventive concept may additionally include a first liner 185.

The first liner 185 may be formed between the first interlayer insulating structure 181 and the sidewall of the first gate electrode 120, between the first interlayer insulating structure 181 and the second gate electrode 220, and between the first interlayer insulating structure 181 and the first source/drain 140. Although not illustrated, the first liner 185 may also be formed in the second active region ACT2.

The first liner 185 may be formed between the second interlayer insulating structure 182 and the sidewall of the first gate electrode 120, between the second interlayer insulating structure 182 and the second gate electrode 220, and between the second interlayer insulating structure 182 and the field insulating layer 105.

The first liner 185 may be formed along a sidewall of the first gate spacer 130, a sidewall of the second gate spacer 230, the upper surface of the first source/drain 140, and the upper surface of the field insulating layer 105.

The first liner 185 may include one of, for example, silicon nitride, silicon oxynitride, silicon oxycarbonitride (SiOCN), silicon oxide, and a combination thereof. Further, the first liner 185 may be a single film or multiple films.

The first interlayer insulating structure 181, the second interlayer insulating structure 182, and the third interlayer insulating structure 183 may be formed on the first liner 185.

The first contact 510 may be connected with the first source/drain 140 through the first liner 185 formed on an upper surface of the first epitaxial layer 145, and the second contact 520 may be connected with the second source/drain 240 through the first liner 185 on an upper surface of the second epitaxial layer 245.

Even when the first liner 185 is formed, the number of insertion films interposed between the sidewall of the first gate electrode 120 and the first interlayer insulating structure 181 may be equal to the number of insertion films interposed between the sidewall of the first gate electrode 120 and the second interlayer insulating structure 182.

Figure 13:
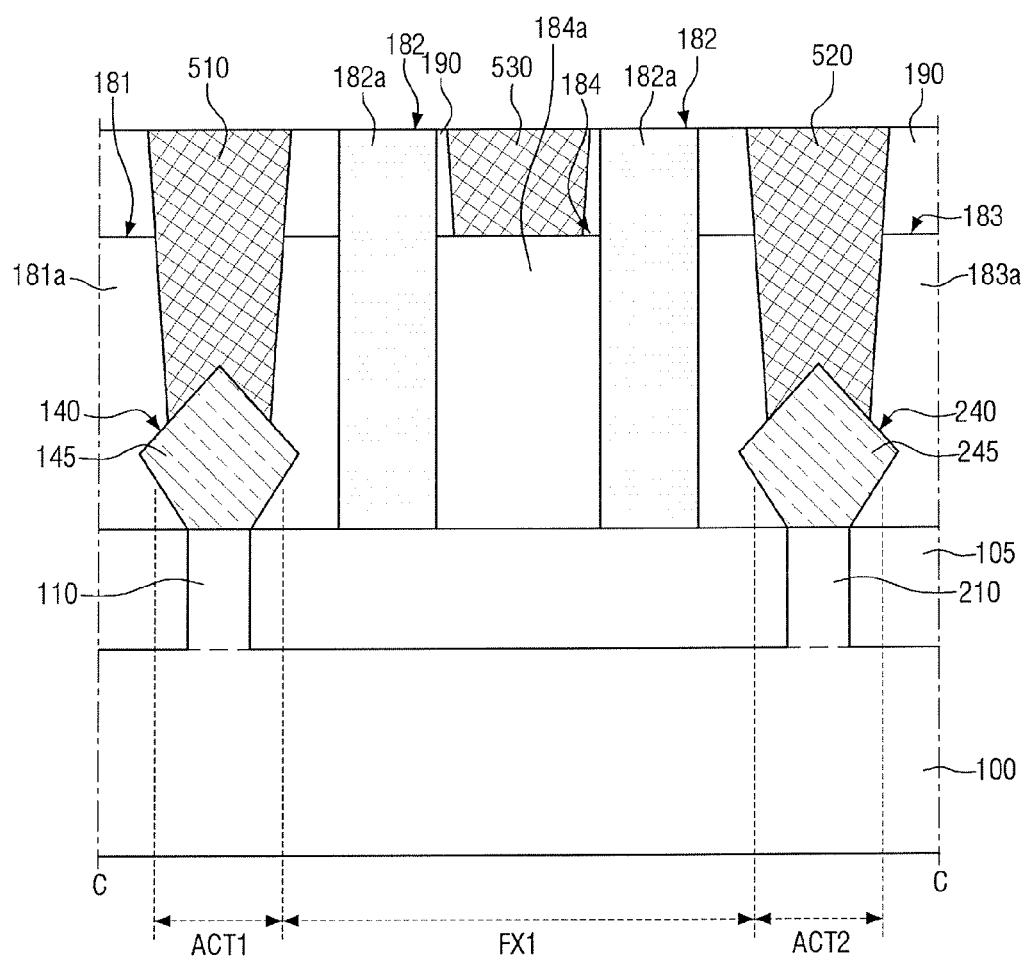
FIGS. 13 and 14 are views provided to explain a semiconductor device according to an exemplary embodiment of the present inventive concept.
Figure 14:
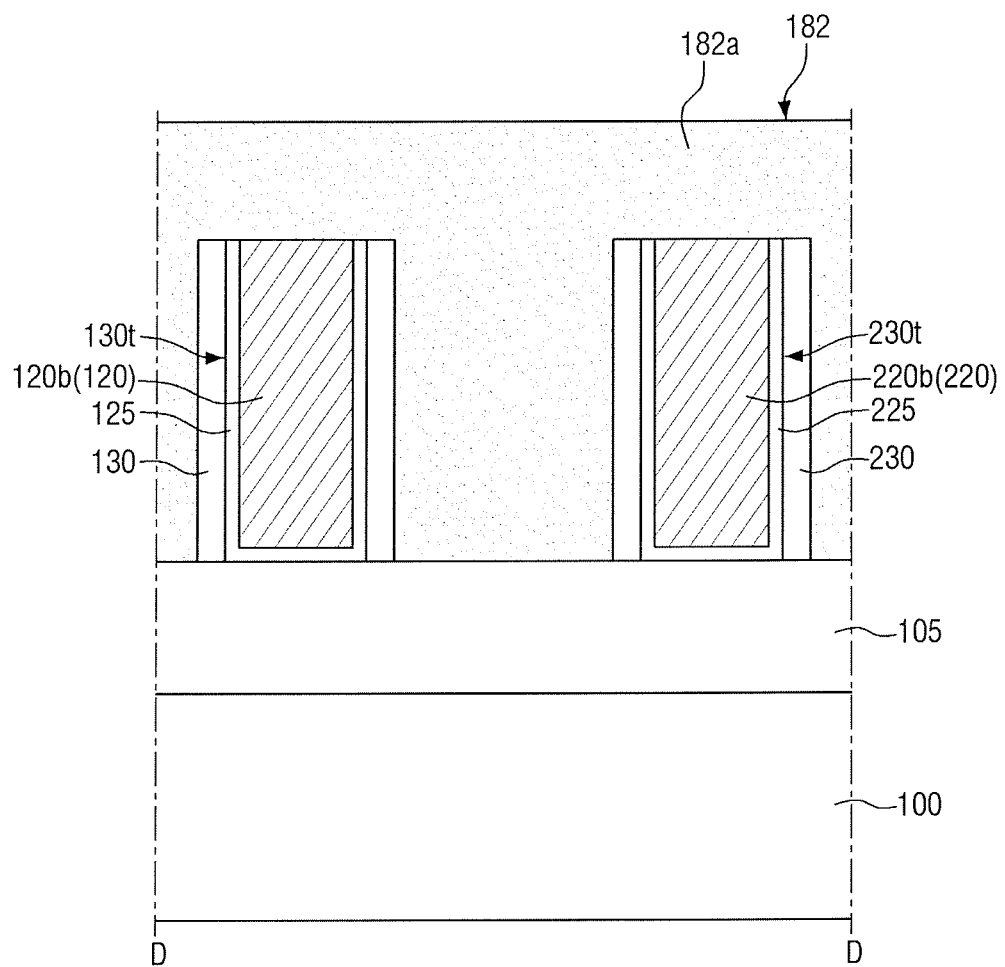

FIGS. 13 and 14 are views provided to explain a semiconductor device according to an exemplary embodiment of the present inventive concept. For convenience of explanation, differences that are not explained above with reference to FIGS. 1 and 6 will be mainly explained below.

For reference, FIG. 13 is a cross sectional view taken along line C-C of FIG. 1, and FIG. 14 is a cross sectional view taken along line D-D of FIG. 1.

Referring to FIGS. 13 and 14, the semiconductor device according to an exemplary embodiment of the present inventive concept may additionally include a fourth interlayer insulating structure 184 formed between the second interlayer insulating structures 182.

The fourth interlayer insulating structure 184 may be formed in a region overlapping with the third contact 530, and may be formed on the field insulating film 105 on the substrate 100. The fourth interlayer insulating structure 184 may be positioned between the third contact 530 and the field insulating film 105 of the first field region FX1.

In FIGS. 1 and 13, the fourth interlayer insulating structure 184 may be surrounded by the second interlayer insulating structure 182. Further, a width of the fourth interlayer insulating structure 184 in the first direction X may be greater than a width of the third contact 530 in the first direction X, and a width of the fourth interlayer insulating structure 184 in the second direction Y may be greater than a width of the third contact 530 in the second direction Y. These will be described with reference to FIGS. 44A to 44C.

The fourth interlayer insulating structure 184 may have a fourth dielectric constant, and may include a fourth interlayer insulating material 184a.

The fourth dielectric constant of the fourth interlayer insulating structure 184 may be greater than the second dielectric constant of the second interlayer insulating structure 182. For example, a dielectric constant of the fourth interlayer insulating material 184a may be greater than a dielectric constant of the second interlayer insulating material 182a.

The first interlayer insulating structure 181 may be formed in the same fabrication process as the fourth interlayer insulating structure 184 is formed. Accordingly, the fourth dielectric constant of the fourth interlayer insulating structure 184 may be substantially equal to the first dielectric constant of the first interlayer insulating structure 181. Further, the first interlayer insulating material 181a may be a material the same as the material of the fourth interlayer insulating material 184a.

With reference to the upper surface of the field insulating film 105, the upper surface of the second interlayer insulating structure 182 may be higher than the upper surface of the first interlayer insulating structure 181, the upper surface of the third interlayer insulating structure 183, and the upper surface of the fourth interlayer insulating structure 184.

The upper surface of the second interlayer insulating structure 182 may be in the same plane as an upper surface of the third contact 530, an upper surface of the first contact 510, and an upper surface of the second contact 520. The upper interlayer insulating film 190 may not be positioned on the upper surface of the second interlayer insulating structure 182.

In FIG. 14, the second interlayer insulating structure 182 may overlay an upper surface of the second portion 120b of the first gate electrode and an upper surface of the second portion 220b of the second gate electrode which are not overlapped with the third contact 530.

Figure 15:
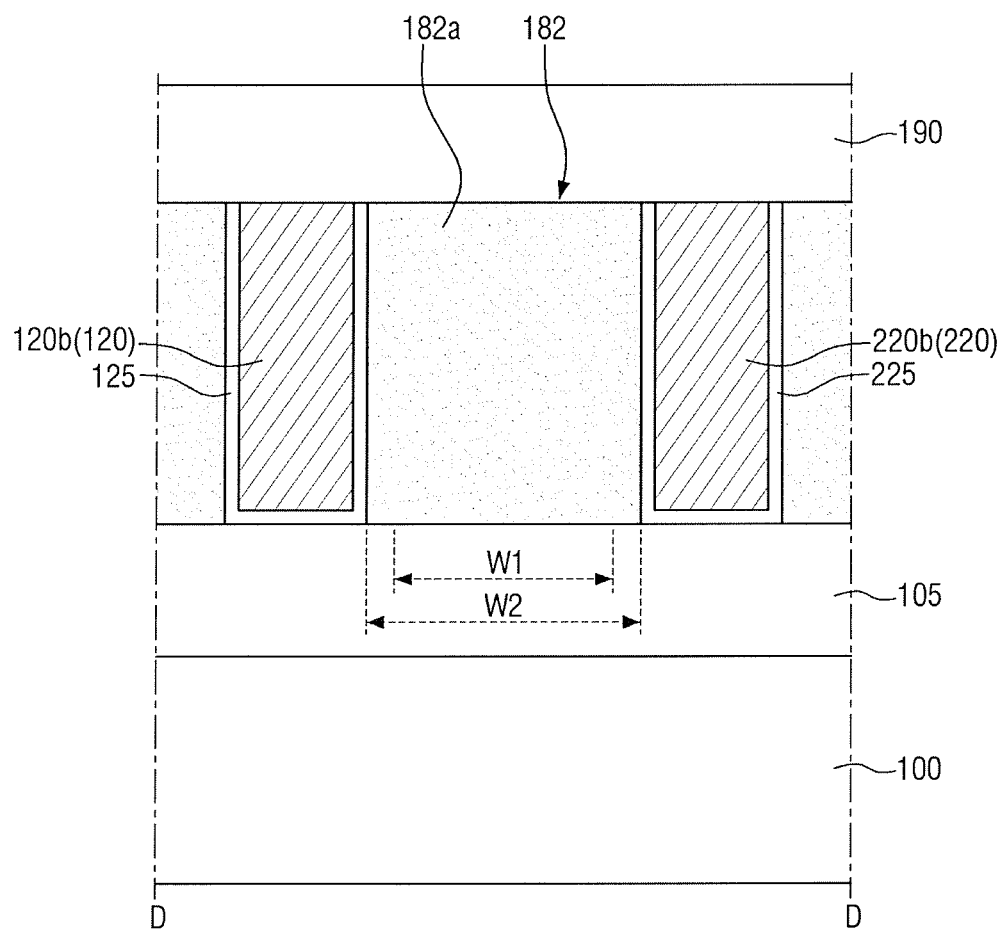
FIG. 15 is a view provided to explain a semiconductor device according to an exemplary embodiment of the present inventive concept.

FIG. 15 is a view provided to explain a semiconductor device according to an exemplary embodiment of the present inventive concept. For convenience of explanation, differences that are not explained above with reference to FIGS. 1 and 6 will be mainly explained below.

For reference, FIG. 15 is a cross sectional view taken along line D-D of FIG. 1. Further, an exemplary embodiment of the present inventive concept will be described with reference to FIG. 15 and in comparison with FIGS. 2A and 2B.

Referring to FIGS. 2A, 2B and 15, in a semiconductor device according to an exemplary embodiment of the present inventive concept, the first gate spacer 130 may be formed on the sidewall of the first portion 120a of the first gate electrode, and on the sidewall of the third portion 120c of the first gate electrode, but it may not be formed on the sidewall of the second portion 120b of the first gate electrode. Further, the second gate spacer 230 may be formed on the sidewall of the first portion 220a of the second gate electrode, and on the sidewall of the third portion 220c of the second gate electrode, but it may not be formed on the sidewall of the second portion 220b of the second gate electrode. In other words, the first gate spacer 130 may be formed between the first gate electrode 120 and the first interlayer insulating structure 181, and between the first gate electrode 120 and the third interlayer insulating structure 183, but it may not be formed between the first gate electrode 120 and the second interlayer insulating structure 182. Further, the second gate spacer 230 may be formed between the second gate electrode 220 and the first interlayer insulating structure 181, and between the second gate electrode 220 and the third interlayer insulating structure 183, but it may not be formed between the second gate electrode 220 and the second interlayer insulating structure 182.

Since the first gate spacer 130 may not be formed on the sidewall of the second portion 120b of the first gate electrode, a thickness of the first gate spacer 130 on the sidewall of the first portion 120a of the first gate electrode may be regarded as being greater than a thickness of the first gate spacer 130 on the sidewall of the second portion 120b of the first gate electrode.

Since the first gate spacer 130 may not be formed between the first gate electrode 120 and the second interlayer insulating structure 182, the first gate insulating film 125 may contact the second interlayer insulating structure 182.

Since the second gate spacer 230 may not be formed between the second gate electrode 220 and the second interlayer insulating structure 182, the second gate insulating film 225 may contact the second interlayer insulating structure 182.

In FIG. 15, the first gate spacer 130 is not formed on the sidewall of the second portion 120b of the first gate electrode, and the second gate spacer 230 is not formed on the sidewall of the second portion 220b of the second gate electrode. Accordingly, a width W2 of the second interlayer insulating structure 182 between the sidewall of the first gate electrode 120 and the sidewall of the second gate electrode 220 is greater than a width W1 of the first interlayer insulating structure 181 between the sidewall of the first gate electrode 120 and the sidewall of the second gate electrode 220.

Figure 16:
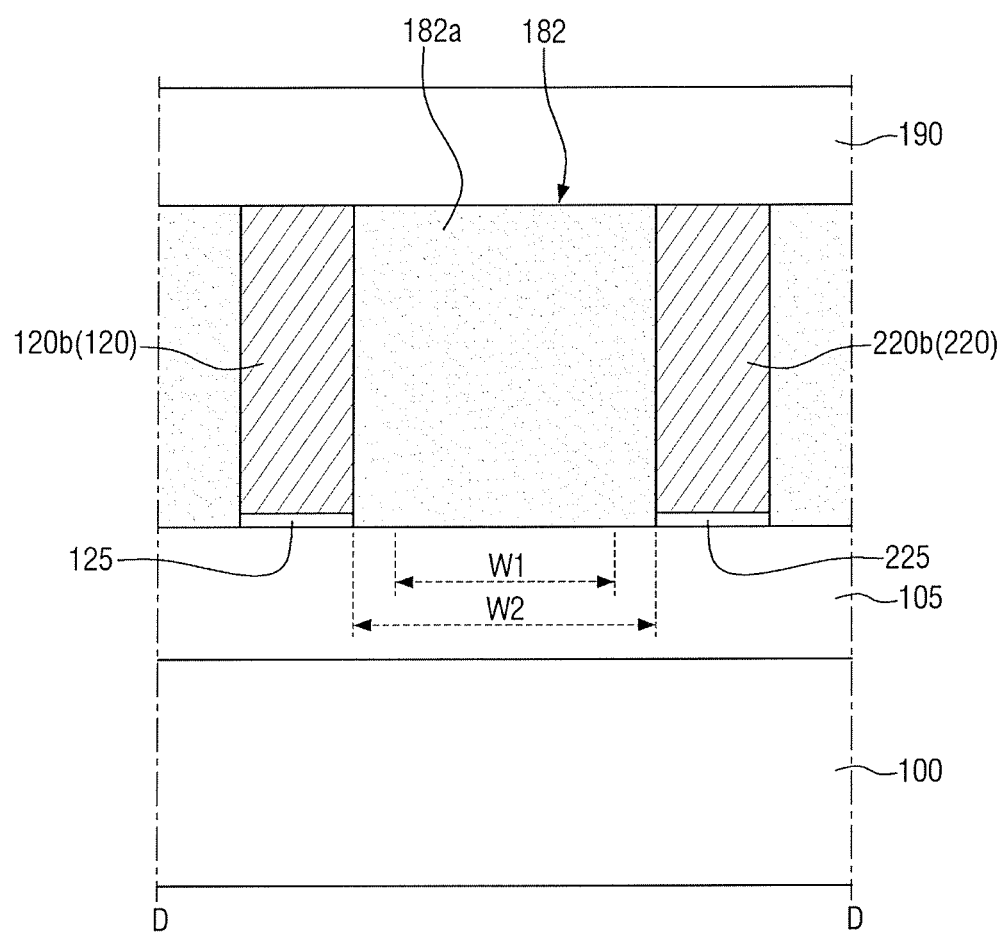
FIG. 16 is a view provided to explain a semiconductor device according to an exemplary embodiment of the present inventive concept.

FIG. 16 is a view provided to explain a semiconductor device according to an exemplary embodiment of the present inventive concept. For convenience of explanation, differences that are not explained above with reference to FIG. 15 will be mainly explained below.

For reference, FIG. 16 is a cross sectional view taken along line D-D of FIG. 1.

Referring to FIGS. 2A, 2B and 16, in a semiconductor device according to an exemplary embodiment of the present inventive concept, the first gate insulating film 125 may be formed on the sidewall of the first portion 120a of the first gate electrode, and on the sidewall of the third portion 120c of the first gate electrode, but no first gate insulating film 125 may be formed on the sidewall of the second portion 120b of the first gate electrode. Further, the second gate insulating film 225 may be formed on the sidewall of the first portion 220a of the second gate electrode, and on the sidewall of the third portion 220c of the second gate electrode, but no second gate insulating film 225 may be formed on the sidewall of the second portion 220b of the second gate electrode.

The first gate insulating film 125 may be formed on the bottom surface of the second portion 120b of the first gate electrode. That is, the first gate insulating film 125 may be formed between the bottom surface of the first gate electrode 120 and the upper surface of the field insulating film 105 facing the bottom surface of the first gate electrode 120. Of course, the first gate insulating film 125 is formed on the bottom surface of the first portion 120a of the first gate electrode, and on the bottom surface of the third portion 120c of the first gate electrode.

The second gate insulating film 225 may be formed on the bottom surface of the second portion 220b of the second gate electrode. That is, the second gate insulating film 225 may be formed between the bottom surface of the second gate electrode 220 and the upper surface of the field insulating film 105 facing the bottom surface of the second gate electrode 220. Of course, the second gate insulating film 225 is formed on the bottom surface of the first portion 220a of the second gate electrode, and the bottom surface of the third portion 220c of the second gate electrode.

Since the first gate insulating film 125 may not be formed between the sidewall of the first gate electrode 120 and the second interlayer insulating structure 182, the first gate electrode 120 may contact the second interlayer insulating structure 182.

Since the second gate insulating film 225 may not be formed between the sidewall of the second gate electrode 220 and the second interlayer insulating structure 182, the second gate electrode 220 may contact the second interlayer insulating structure 182.

In FIGS. 15 and 16, the number of insertion films interposed between the sidewall of the first gate electrode 120 and the first interlayer insulating structure 181 may be greater than the number of insertion films interposed between the sidewall of the first gate electrode 120 and the second interlayer insulating structure 182. That is, the first gate insulating film 125 and the first gate spacer 130 may be interposed between the sidewall of the first gate electrode 120 and the first interlayer insulating structure 181. However, the first gate insulating film 125 may be interposed between the sidewall of the first gate electrode 120 and the second interlayer insulating structure 182, or even the first gate insulating film 125 may not be interposed therebetween.

Figure 17:
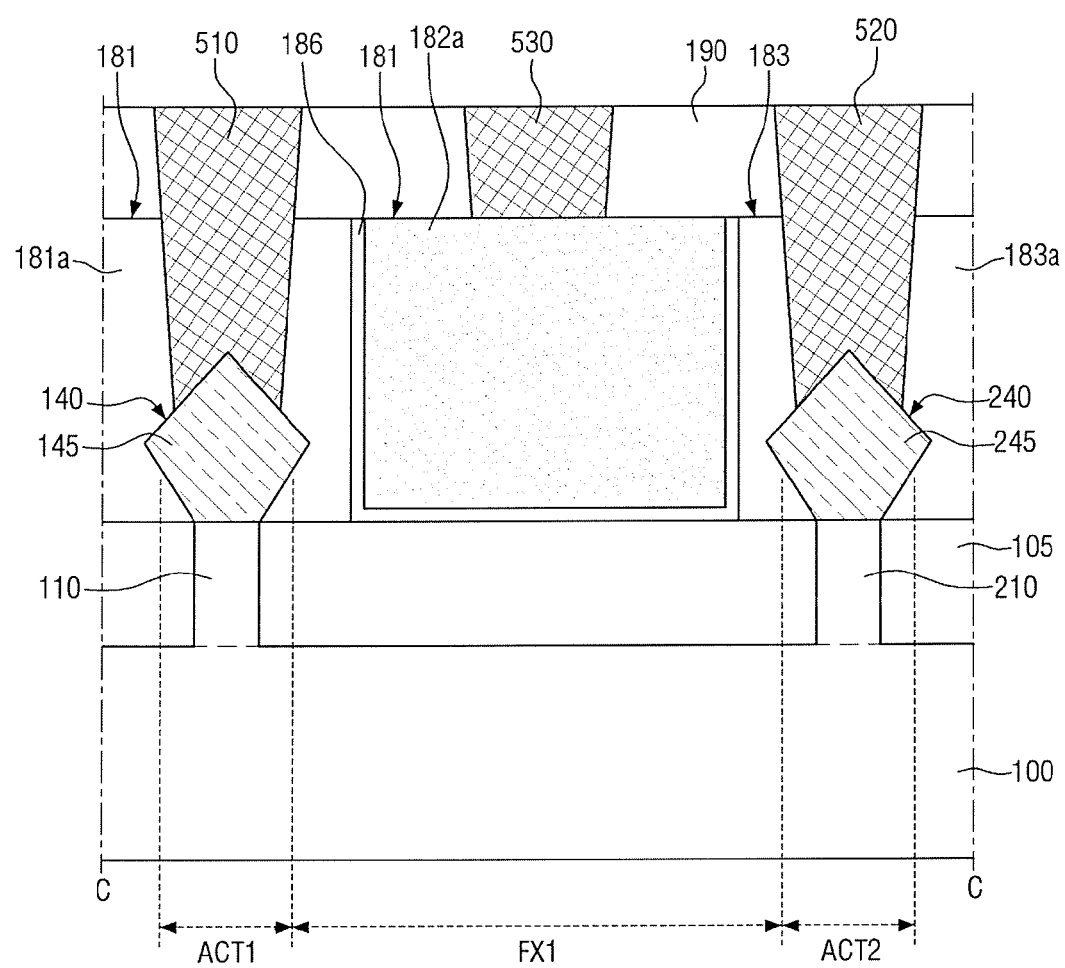
FIGS. 17 and 18 are views provided to explain a semiconductor device according to an exemplary embodiment of the present inventive concept.
Figure 18:
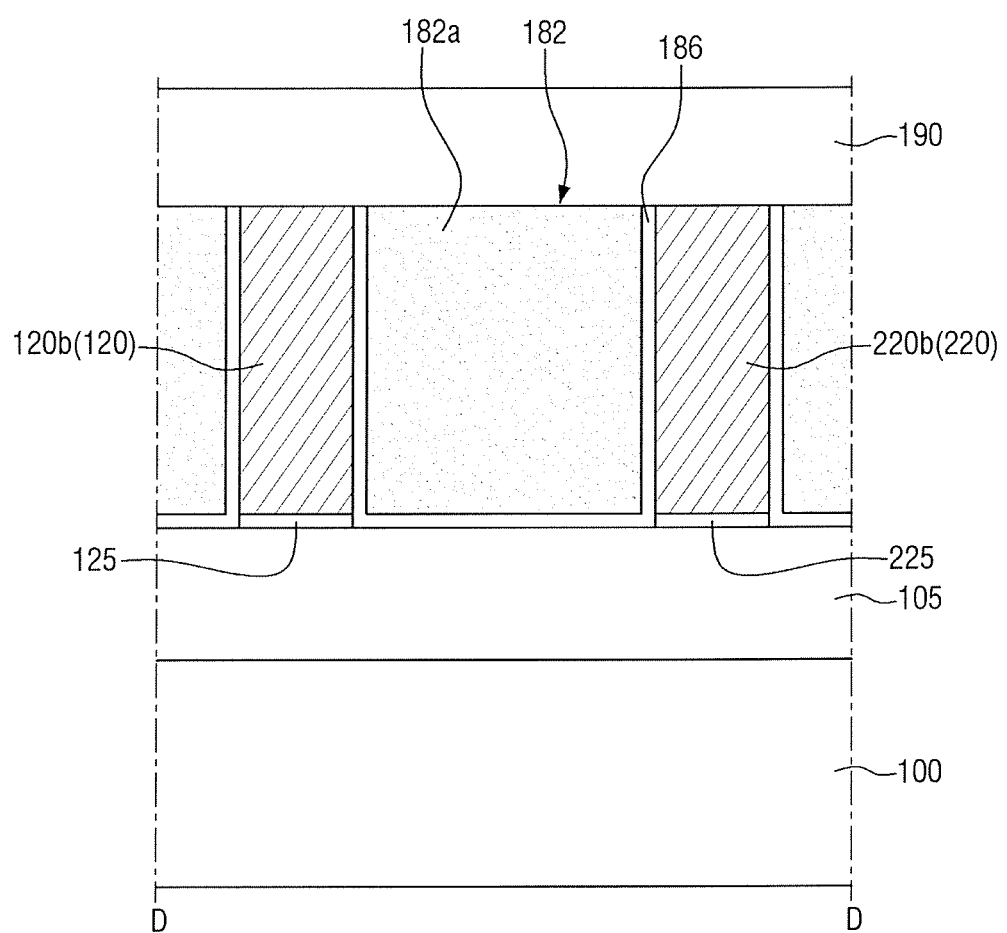

FIGS. 17 and 18 are views provided to explain a semiconductor device according to an exemplary embodiment of the present inventive concept. For convenience of explanation, differences that are not explained above with reference to FIG. 16 will be mainly explained below.

Referring to FIGS. 17 and 18, the semiconductor device according to an exemplary embodiment of the present inventive concept may further include a second liner 186.

The second liner 186 may extend between the second interlayer insulating structure 182 and the substrate 100, between the second interlayer insulating structure 182 and the second portion 120b of the first gate electrode, and between the second interlayer insulating structure 182 and the second portion 220b of the second gate electrode.

The second liner 186 extending between the second interlayer insulating structure 182 and the substrate 100 may be formed along the upper surface of the field insulating film 105 in the first field region FX1.

The second liner 186 may be formed between the first interlayer insulating structure 181 and the second interlayer insulating structure 182, and between the third interlayer insulating structure 183 and the second interlayer insulating structure 182.

The second liner 186 may include one of, for example, silicon nitride, silicon oxynitride, silicon oxycarbonitride (SiOCN), silicon oxide, and a combination thereof. Further, the second liner 186 may be a single film or multiple films.

The second interlayer insulating structure 182 may be formed on the second liner 186.

Figure 19:
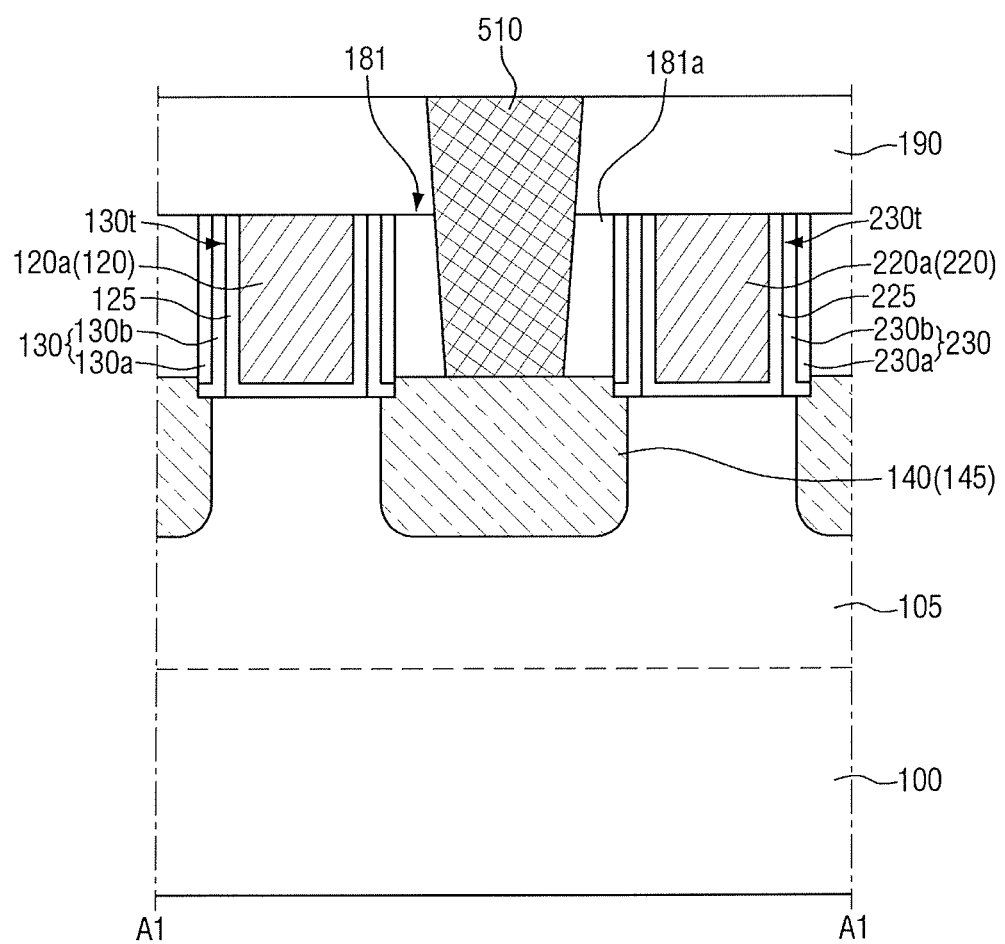
FIGS. 19 and 20 are views provided to explain a semiconductor device according to an exemplary embodiment of the present inventive concept.
Figure 20:
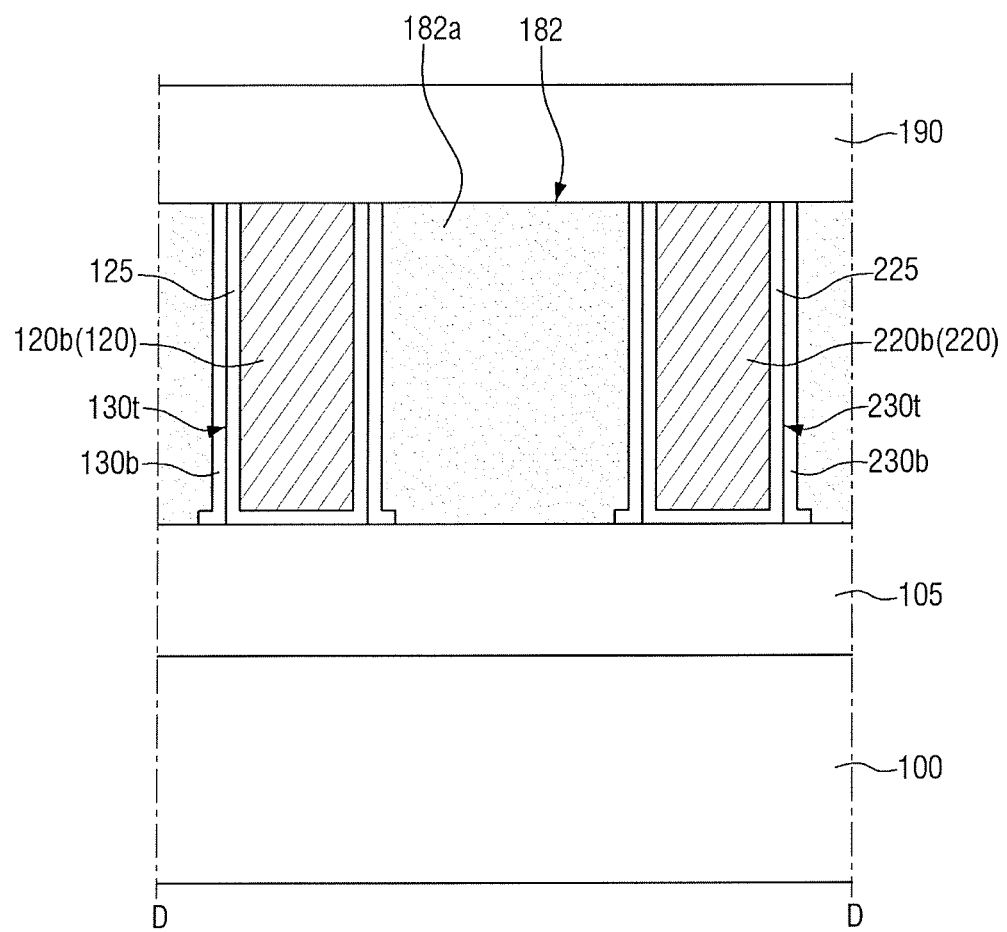

FIGS. 19 and 20 are views provided to explain a semiconductor device according to an exemplary embodiment of the present inventive concept. For convenience of explanation, differences that are not explained above with reference to FIGS. 1 to 6 will be mainly explained below.

For reference, FIG. 19 is a cross sectional view taken along line A1-A1 of FIG. 1, and FIG. 20 is a cross sectional view taken along line D-D of FIG. 1. Further, a cross sectional view taken along line A2-A2 of FIG. 1 may be substantially similar to FIG. 19 except for the first fin-type pattern and the first source/drain.

Referring to FIGS. 19 and 20, in a semiconductor device according to an exemplary embodiment of the present inventive concept, the first gate spacer 130 may include a first inner spacer 130b and a first outer spacer 130a. The second gate spacer 230 may include a second inner spacer 230b and a second outer spacer 230a.

The first inner spacer 130b may be formed on the sidewall of the first portion 120a of the first gate electrode, the sidewall of the second portion 120b of the first gate electrode, and the sidewall of the third portion 120c of the first gate electrode. However, the first outer gate spacer 130a may be formed on the sidewall of the first portion 120a of the first gate electrode, and the sidewall of the third portion 120c of the first gate electrode, but it may not be formed on the sidewall of the second portion 120b of the first gate electrode. Likewise, the second inner spacer 230b may be formed on the sidewall of the first portion 220a of the second gate electrode, the sidewall of the second portion 220b of the second gate electrode, and the sidewall of the third portion 220c of the second gate electrode. However, the second outer spacer 230a may be formed on the sidewall of the first portion 220a of the second gate electrode, and the sidewall of the third portion 220c of the second gate electrode, but it may not be formed on the sidewall of the second portion 220b of the second gate electrode.

Since the first outer spacer 130a may not be formed on the sidewall of the second portion 120b of the first gate electrode, a thickness of the first gate spacer 130 on the sidewall of the first portion 120a of the first gate electrode may be different from a thickness of the first gate spacer 130 on the sidewall of the second portion 120b of the first gate electrode. For example, the thickness of the first gate spacer 130 on the sidewall of the first portion 120a of the first gate electrode may be greater than the thickness of the first gate spacer 130 on the sidewall of the second portion 120b of the first gate electrode.

The thickness of the first gate spacer 130 on the sidewall of the second portion 120b of the first gate electrode may be a thickness of the first gate spacer 130 measured at the middle portion of the second interlayer insulating structure 182, for example. In other words, since the first outer spacer 130a and the second outer spacer 230a may not be formed on the sidewall of the second portion 120b of the first gate electrode, and on the sidewall of the second portion 220b of the second gate electrode, a width of the second interlayer insulating structure 182 in the first direction X (see FIG. 1) may be greater than a width of the first interlayer insulating structure 181 in the first direction X.

The number of insertion films interposed between the sidewall of the first gate electrode 120 and the first interlayer insulating structure 181 may be greater than the number of insertion films interposed between the sidewall of the first gate electrode 120 and the second interlayer insulating structure 182. That is, the first gate insulating film 125, the first inner spacer 130b, and the first outer spacer 130a may be interposed between the sidewall of the first gate electrode 120 and the first interlayer insulating structure 181. However, the first gate insulating film 125 and the first inner spacer 130b may be interposed between the sidewall of the first gate electrode 120 and the second interlayer insulating structure 182.

As illustrated in FIGS. 19 and 20, the first inner spacer 130b and the second inner spacer 230b may each have an L shape, and the first outer spacer 130a and the second outer spacer 230a may each have an I shape, but exemplary embodiments of the present inventive concept are not limited thereto. Further, as illustrated in FIGS. 19 and 20, the first gate spacer 130 and the second gate spacer 230 each may be a double film. However, this is provided only for convenience of illustration and exemplary embodiments of the present inventive concept are not limited thereto.

Figure 21:
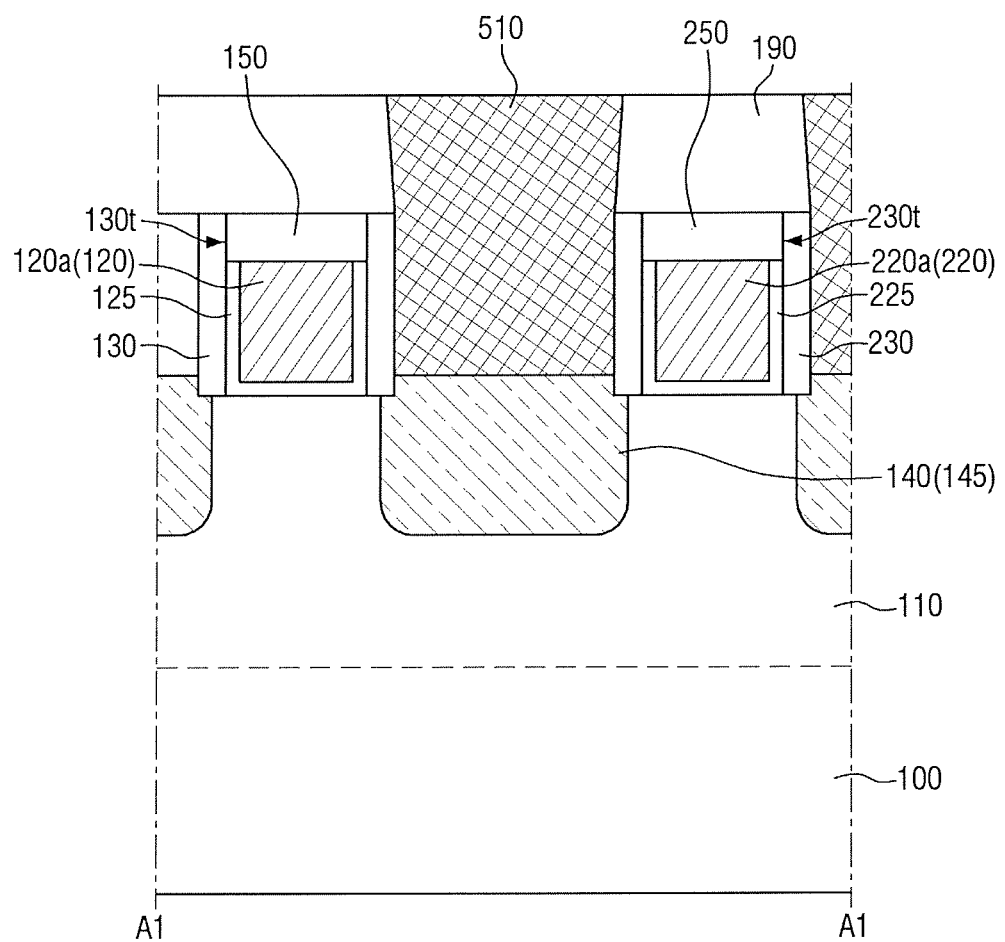
FIGS. 21 and 22 are views provided to explain a semiconductor device according to an exemplary embodiment of the present inventive concept.
Figure 22:
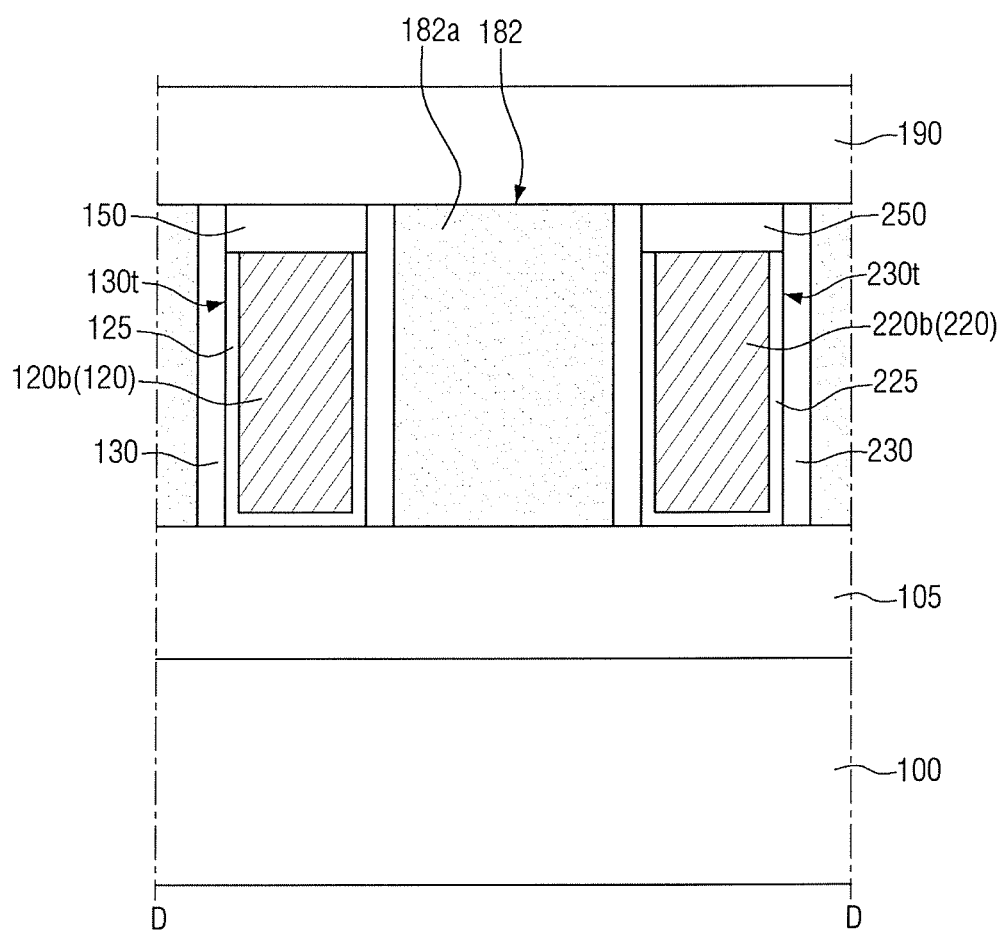

FIGS. 21 and 22 are views provided to explain a semiconductor device according to an exemplary embodiment of the present inventive concept. For convenience of explanation, differences that are not explained above with reference to FIGS. 1 to 6 will be mainly explained below.

For reference, FIG. 21 is a cross sectional view taken along line A1-A1 of FIG. 1, and FIG. 22 is a cross sectional view taken along line D-D of FIG. 1. Further, a cross sectional view taken along line A2-A2 of FIG. 1 may be substantially similar to FIG. 21 except for the first fin-type pattern and the first source/drain.

Referring to FIGS. 21 and 22, the semiconductor device according to an exemplary embodiment of the present inventive concept may additionally include a first capping pattern 150 and a second capping pattern 250.

The first gate electrode 120 may fill a portion of the first trench 130t. The first capping pattern 150 may be formed on the first gate electrode 120. The first capping pattern 150 may fill the rest of the first trench 130t remaining after the first gate electrode 120 is formed.

The second gate electrode 220 may fill a portion of the second trench 230t. The second capping pattern 250 may be forming on the second gate electrode 220. The second capping pattern 250 may fill the rest of the second trench 230t remaining after the second gate electrode 220 is formed.

While FIG. 21 illustrates that the first gate insulating film 125 is not formed between the first gate spacer 130 and the first capping pattern 150, and the second gate insulating film 225 is not formed between the second gate spacer 230 and the second capping pattern 250, this is provided only for convenience of explanation and exemplary embodiments of the present inventive concept are not limited thereto.

An upper surface of the first capping pattern 150 and an upper surface of the second capping pattern 250 may be positioned in the same plane as the upper surface of the first interlayer insulating structure 181 and the upper surface of the second interlayer insulating structure 182, respectively.

The first capping pattern 150 and the second capping pattern 250 may include, for example, a material having etch selectivity to the lower interlayer insulating films 181, 182, 183.

The first capping pattern 150 and the second capping pattern 250 may include at least one of, for example, silicon nitride (SiN), silicon oxynitride (SiON), silicon dioxide (SiO$_2$), silicon carbon nitride (SiCN), silicon oxycarbon nitride (SiOCN), and a combination thereof.

The first contact 510 and a second contact 520 may contact the first gate spacer 130 and the second gate spacer 230. Further, the third contact 530 may be connected with the second portion 120b of the first gate electrode and the second portion 220b of the second gate electrode through the first capping pattern 150 and the second capping pattern 250.

Figure 23:
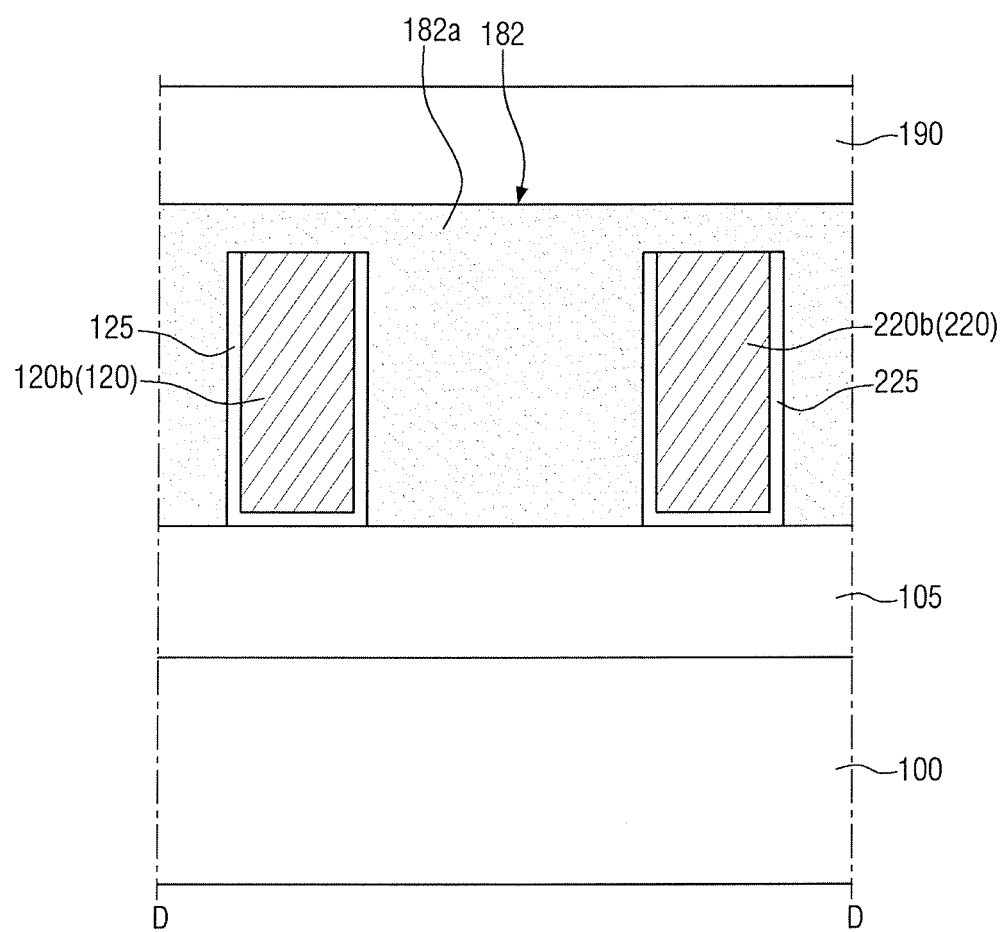
FIG. 23 is a view provided to explain a semiconductor device according to an exemplary embodiment of the present inventive concept.

FIG. 23 is a view provided to explain a semiconductor device according to an exemplary embodiment of the present inventive concept. For convenience of explanation, differences from the exemplary embodiments explained above with reference to FIGS. 21 and 22 will be mainly explained below.

For reference, FIG. 23 is a cross sectional view taken along line D-D of FIG. 1. Further, an exemplary embodiment of the present inventive concept will be described with reference to FIG. 23 and in comparison with FIG. 21.

Referring to FIGS. 21 and 23, in a semiconductor device according to an exemplary embodiment of the present inventive concept, the first capping pattern 150 may be formed on the upper surface of the first portion 120a of the first gate electrode, but it may not be formed on the upper surface of the second portion 120b of the first gate electrode.

The first capping pattern 150 may also be formed on the upper surface of the third portion 120c of the first gate electrode, like that for the first portion 120a of the first gate electrode described above. Further, the second capping pattern 250 may be formed on the upper surface of the first portion 220a of the second gate electrode, but it may not be formed on the upper surface of the second portion 220b of the second gate electrode. In addition, while the first gate spacer 130 may be formed on the sidewall of the first portion 120a of the first gate electrode, no first gate spacer 130 may be formed on the sidewall of the second portion 120b of the first gate electrode.

While the second gate spacer 230 may be formed on the sidewall of the first portion 220a of the second gate electrode, no second gate spacer 230 may be formed on the sidewall of the second portion 220b of the second gate electrode.

Since the first capping pattern 150 may not be formed on the upper surface of the second portion 120b of the first gate electrode, and the second capping pattern 250 may not be formed on the upper surface of the second portion 220b of the second gate electrode, the second interlayer insulating structure 182 may overlay the upper surface of the second portion 120b of the first gate electrode and the second portion 220b of the second gate electrode.

In an exemplary embodiment of the present inventive concept, the semiconductor device may include a first gate structure and a second gate structure. The first gate structure may include a first gate portion and a second gate portion. The second gate structure may include a third gate portion and a fourth gate portion. The first gate portion may include the first gate spacer 130, the first gate insulating film 125, the first portion of the first gate electrode 120a and the first capping pattern 150 sequentially stacked. The third gate portion may include the second gate spacer 230, the second gate insulating film 225, the first portion of the second gate electrode 220a and the second capping pattern 250 sequentially stacked. The second gate portion may include the first gate insulating film 125 and the second portion of the first gate electrode 120b sequentially stacked. The fourth gate portion may include the second gate insulating film 225 and the second portion of the second gate electrode 220b sequentially stacked. The extra space created between the second gate portion and the fourth gate portion by removing the gate spacers and the capping patterns from the second and fourth gate portions may allow additional amount of the insulating material having low dielectric constant to fill this extra space to reduce the parasitic capacitance between a gate electrode and other nodes. In addition, a larger air gap may be filled in between the second gate portion and the fourth gate portion to reduce the parasitic capacitance.

Figure 24:
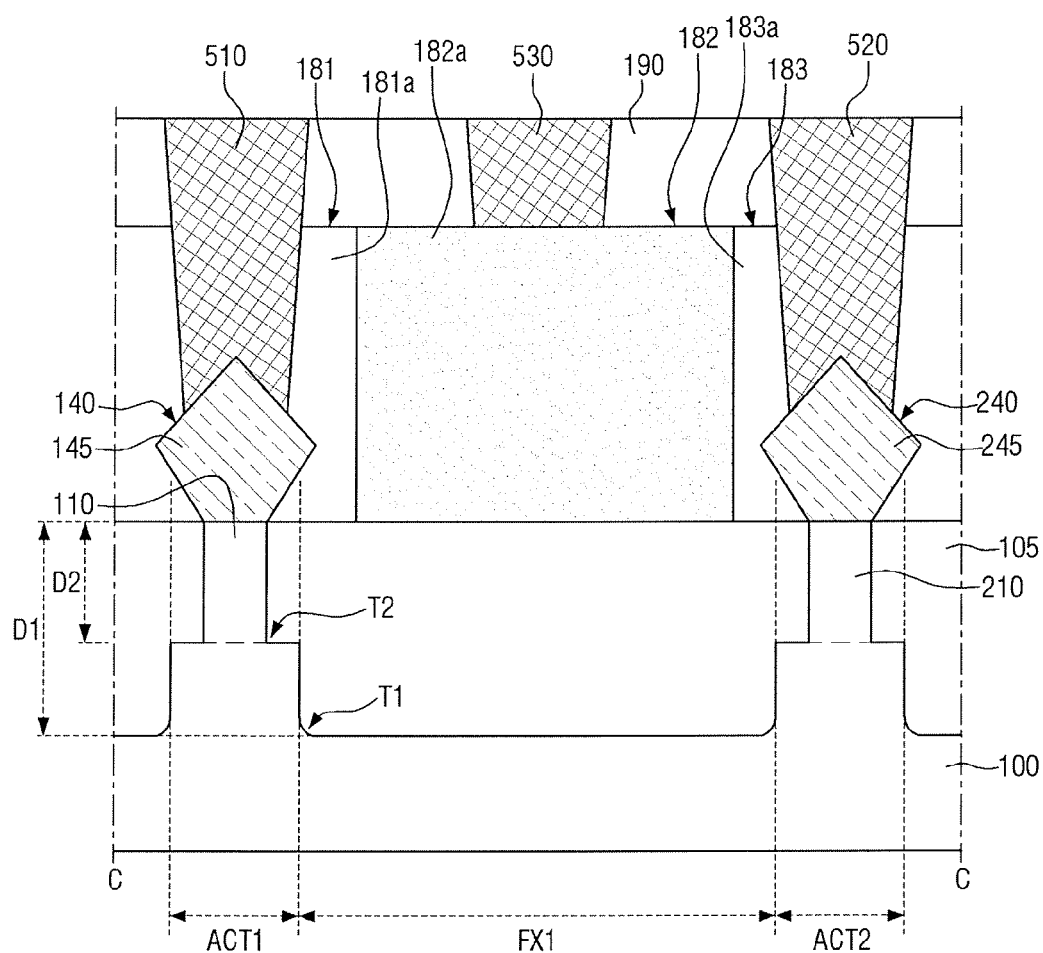
FIG. 24 is a view provided to explain a semiconductor device according to an exemplary embodiment of the present inventive concept.

FIG. 24 is a view provided to explain a semiconductor device according to an exemplary embodiment of the present inventive concept. For convenience of description, the following description will be made based on differences from the description with respect to FIGS. 1 to 6.

For reference, FIG. 24 is a cross sectional view taken along line C-C of FIG. 1.

Referring to FIG. 24, in the semiconductor device according to an exemplary embodiment of the present inventive concept, the first fin-type pattern 110 and the second fin-type pattern 210 may be defined by a shallow trench T2 having a first depth D2. However, the first active region ACT1 and the second active region ACT2 may be defined by a deep trench T1 having a second depth D1 larger than the first depth D2. In other words, a portion where the deep trench T1 of the second depth D1 is formed may be the first field region FX1. Further, the first active region ACT1 and the second active region ACT2 may be distinguished by the deep trench T1.

The field insulating film 105 may fill a portion of the deep trench T1 and a shallow trench T2.

In FIG. 24, each of depths of the shallow trench T2 and the deep trench T1 is defined with reference to the upper surface of the field insulating film 105, but note that this is only for illustrative purpose, and exemplary embodiments of the present inventive concept are not limited thereto.

Figure 25:
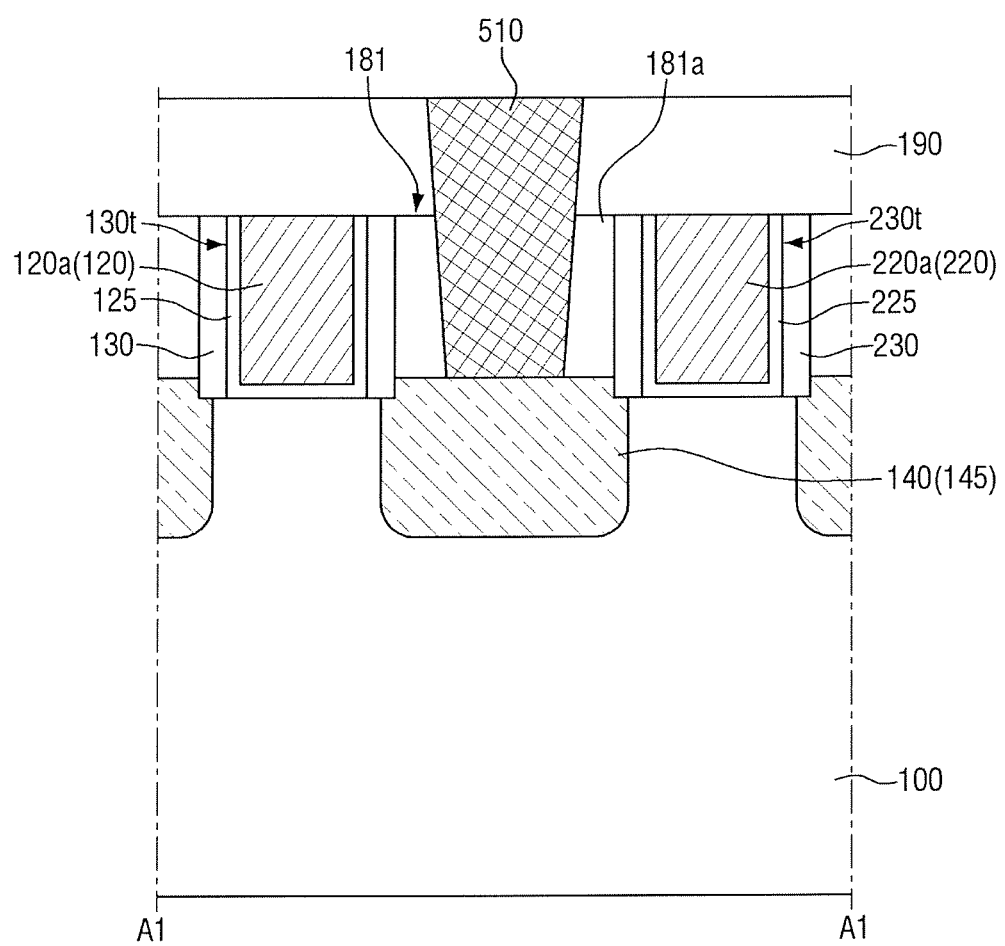
FIG. 25 is a view provided to explain a semiconductor device according to an exemplary embodiment of the present inventive concept.

FIG. 25 is a view provided to explain a semiconductor device according to an exemplary embodiment of the present inventive concept. For convenience of explanation, differences that are not explained above with reference to FIGS. 1 to 6 will be mainly explained below.

Referring to FIG. 25, the semiconductor device according to an exemplary embodiment of the present inventive concept may not include a first fin-type pattern 110 and a second fin-type pattern 210 which protrude from the substrate 100. That is, in FIG. 25, a semiconductor device according to an exemplary embodiment of the present inventive concept may be a planar transistor, rather than a multi-channel transistor using a fin-type pattern. Further, as illustrated, the epitaxial layer 145 included in the first source/drain 140 may be formed in a U shape within the substrate 100, although exemplary embodiments of the present inventive concept are not limited thereto. Accordingly, the first source/drain 140 may have a sigma shape as well.

Figure 26:
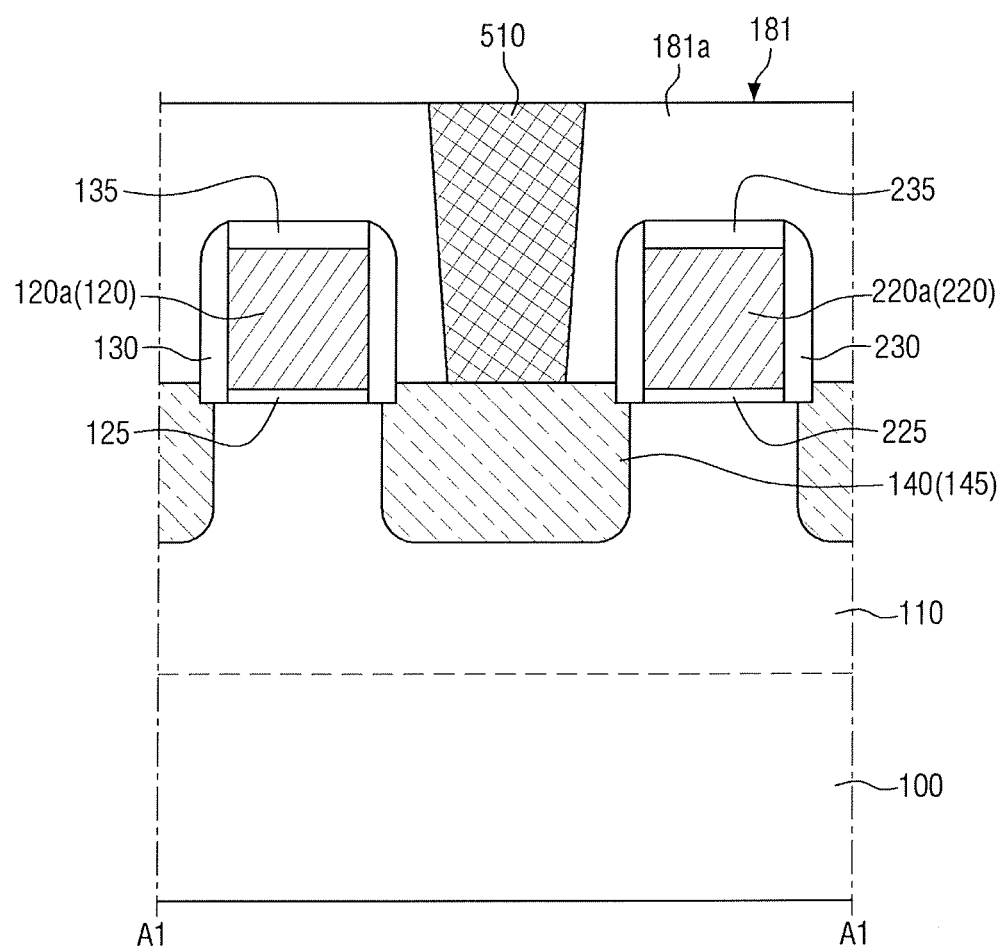
FIG. 26 is a view provided to explain a semiconductor device according to an exemplary embodiment of the present inventive concept.

FIG. 26 is a view provided to explain a semiconductor device according to an exemplary embodiment of the present inventive concept. For convenience of explanation, differences that are not explained above with reference to FIGS. 1 to 6 will be mainly explained below.

Referring to FIG. 26, in the semiconductor device according to an exemplary embodiment of the present inventive concept, the first gate insulating film 125 may not extend between the first gate electrode 120 and the first gate spacer 130. Further, the second gate insulating film 225 may not extend between the second gate electrode 220 and the second gate spacer 230. In addition, a first gate hard mask 135 may be formed on the first gate electrode 120, and a second gate hard mask 235 may be formed on the second gate electrode 220.

Figure 27:
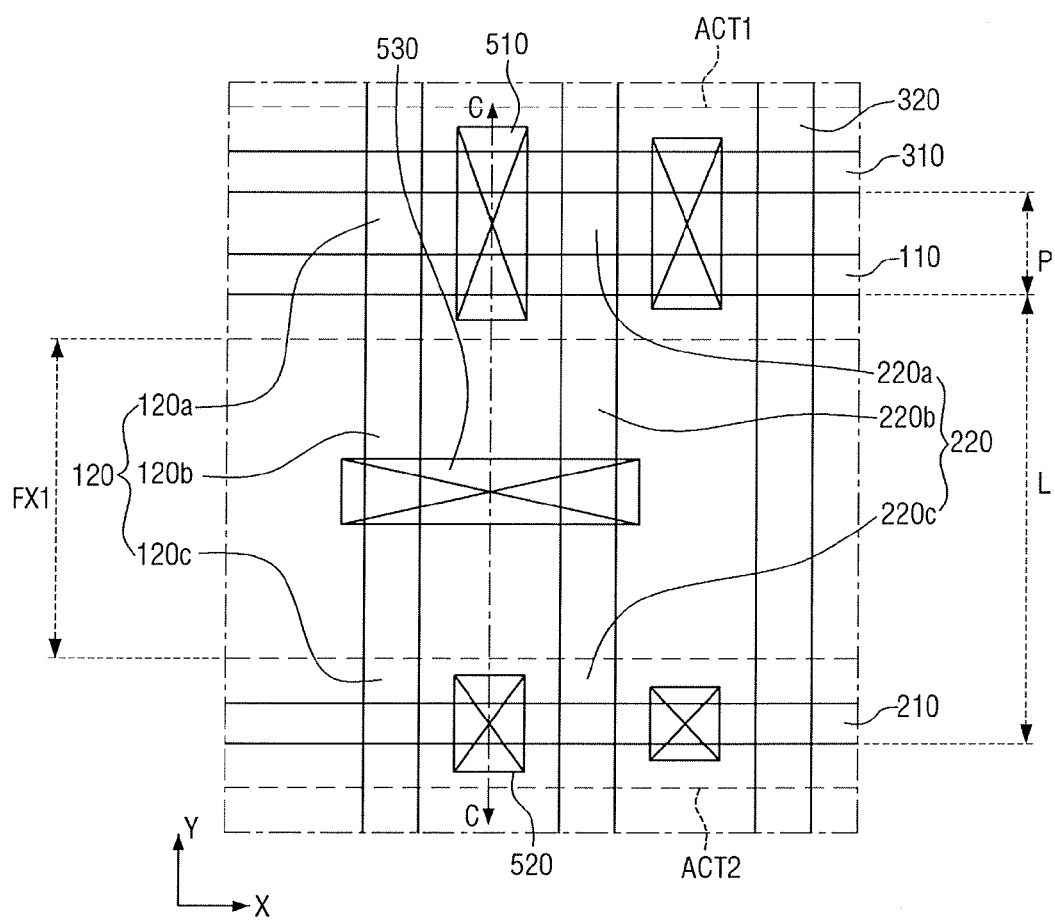
FIG. 27 is a layout diagram provided to explain a semiconductor device according to an exemplary embodiment of the present inventive concept.
Figure 28:
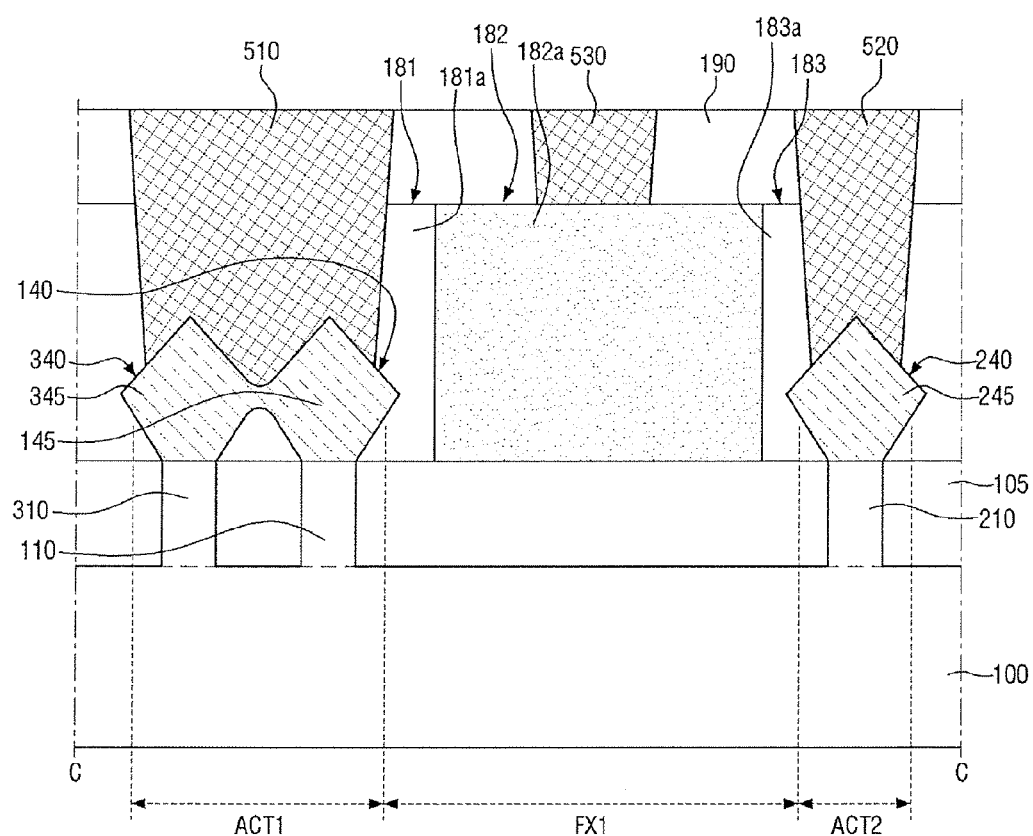
FIG. 28 is a cross sectional view taken along line C-C of FIG. 27 according to an exemplary embodiment of the present inventive concept.

FIG. 27 is a layout diagram provided to explain a semiconductor device according to an exemplary embodiment of the present inventive concept. FIG. 28 is a cross sectional view taken along line C-C of FIG. 27. For convenience of explanation, differences that are not explained above with reference to FIGS. 1 to 6 will be mainly explained below.

For reference, in FIG. 27, a cross sectional view taken of first to third fin-type patterns in the first direction may be substantially similar to FIGS. 2A and 2B.

Referring to FIGS. 27 and 28, a semiconductor device according to an exemplary embodiment of the present inventive concept may additionally include the third fin-type pattern 310.

The third fin-type pattern 310 may be formed in the first active region ACT1, and may protrude from the substrate 100 in the first active region ACT 1. The third fin-type pattern 310 may extend longitudinally on the substrate 100 and in a first direction X.

The first fin-type pattern 110 and the third fin-type pattern 310 formed in the first active region ACT1 may be spaced apart from each other by a first distance P in the second direction Y. Herein, the first distance P may be a fin pitch between the first fin-type pattern 110 and the third fin-type pattern 310. Further, the first fin-type pattern 110 formed in the first active region ACT1 and the second fin-type pattern 210 formed in the second active region ACT2 may be spaced apart from each other by a second distance L in the second direction Y.

A distance L between the first fin-type pattern 110 and the second fin-type pattern 210 is not defined to be a distance between a long side of the first fin-type pattern 110 and a long side of the second fin-type pattern 210 which face each other. The distance L between the first fin-type pattern 110 and the second fin-type pattern 210 is defined to be a distance between the long side of the first fin-type pattern 110 and the long side of the second fin-type pattern 210 which correspond to each other. The distance P between the first fin-type pattern 110 and the third fin-type pattern 310 may also be defined to be the distance L between the first fin-type pattern 110 and the second fin-type pattern 210. That is, p equals L.

In the semiconductor device according to an exemplary embodiment of the present inventive concept, the second distance L may be greater than the first distance P.

The first fin-type pattern 110 and the third fin-type pattern 310 spaced apart from each other by the first distance P (i.e., fin pitch) may be formed in the first active region ACT1. A field region may not be formed between the first fin-type pattern 110 and the third fin-type pattern 310. However, the first field region FX1 may be formed between the first fin-type pattern 110 and the second fin-type pattern 210 which are spaced apart from each other by the second distance L greater than the fin pitch. This is because the first fin-type pattern 110 is formed in the first active region ACT 1 and the second fin-type pattern 210 is formed in the second active region ACT2.

When there are the third fin-type pattern 310, the first fin-type pattern 110, and the second fin-type pattern 210 arranged sequentially in the second direction Y, the first field region FX1 may be defined and formed between the first fin-type pattern 110 and the second fin-type pattern 210 which are spaced apart from each other by the second distance L greater than the fin pitch.

The fin-type pattern may not be formed between the first fin-type pattern 110 and the second fin-type pattern 210, and between the first fin-type pattern 110 and the third fin-type pattern 310. That is, the second and third fin-type patterns 210, 310 may be fin-type patterns closest to the first fin-type pattern 110.

FIG. 27 illustrates two fin-type patterns formed in the first active region ACT1 and one fin-type pattern formed in the second region ACT2, but this is only for convenience of explanation and the exemplary embodiments of the present inventive concept are not limited thereto.

In the semiconductor device according to an exemplary embodiment of the present inventive concept, three or more fin-type patterns may be formed in the first active region ACT 1, and two or more fin-type patterns may be formed in the second active region ACT2.

The first to third gate electrodes 120, 220, 320 may intersect with the first to third fin-type patterns 110, 210, 310.

The first portion 120a of the first gate electrode 120 and the first portion 220a of the second gate electrode 220 each may intersect with both the first fin-type pattern 110 and the third fin-type pattern 310.

A third source/drain 340 may be formed between the first gate electrode 120 and the second gate electrode 220. The third source/drain 340 may include a third epitaxial layer 345 formed on the third fin-type pattern 310, although exemplary embodiments of the present inventive concept are not limited thereto.

As illustrated in FIG. 28, the first epitaxial layer 145 and the third epitaxial layer 345 may be in contact with each other, although exemplary embodiments of the present inventive concept are not limited thereto.

When the first epitaxial layer 145 and the third epitaxial layer 345 are in contact with each other, an air gap may be formed between the first epitaxial layer 145, the third epitaxial layer 345, and the field insulating film 105.

The first interlayer insulating structure 181 may be formed on the first source/drain 140 on the first fin-type pattern 110, and on the third source/drain 340 on the third fin-type pattern 310. The first interlayer insulating structure 181 may overlay the first epitaxial layer 145 and the third epitaxial layer 345.

Figure 29:
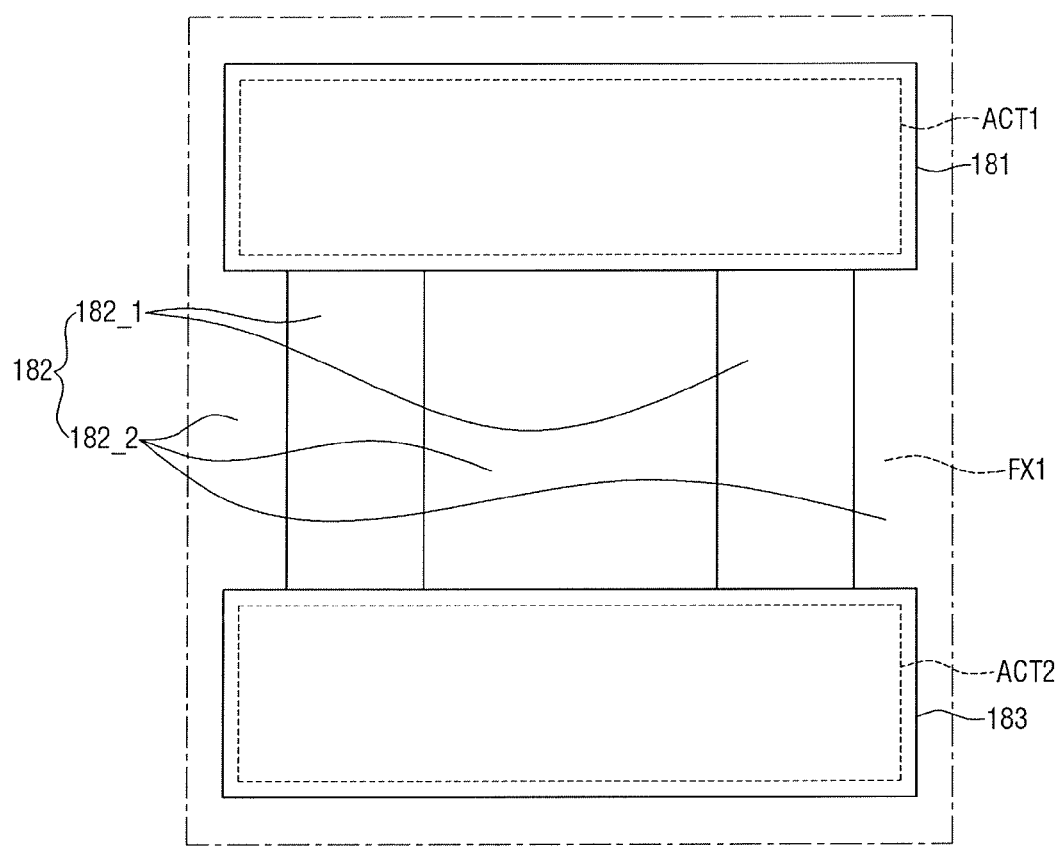
FIG. 29 is a top view provided to explain a semiconductor device according to an exemplary embodiment of the present inventive concept.

FIG. 29 is a top view provided to explain a semiconductor device according to an exemplary embodiment of the present inventive concept. For convenience of explanation, illustrations of the upper interlayer insulating film, the contact, and so on are omitted in the drawings.

Referring to FIG. 29, in a semiconductor device according to an exemplary embodiment of the present inventive concept, the first interlayer insulating structure 181 may be formed on the first active region ACT1, and the third interlayer insulating structure 183 may be formed on the second active region ACT2. Further, the second interlayer insulating structure 182 may be formed between the first interlayer insulating structure 181 and the third interlayer insulating structure 183, in the first field region FX1.

In the semiconductor device according to an exemplary embodiment of the present inventive concept, the second interlayer insulating structure 182 may include a first region 182_1 not including an air gap within the second interlayer insulating structure 182, and a second region 182_2 including an air gap within the second interlayer insulating structure 182. That is, the second interlayer insulating structure 182 may have a mixture of the first region 182_1 not including the air gap therein, and the second region 182_2 including the air gap therein.

As illustrated in FIG. 29, the first region 182_1 of the second interlayer insulating structure and the second region 182_2 of the second interlayer insulating structure may be formed into the shape of a line, but note that this is only for illustrative purpose, and exemplary embodiments of the present inventive concept are not limited thereto.

Explaining as an example by referring to FIG. 1, a portion of the second interlayer insulating structure 182 between the first gate electrode 120 and the second gate electrode 220 may include an air gap, and the rest may not include an air gap. Further, the second interlayer insulating structure 182 between the first gate electrode 120 and the second gate electrode 220 may not include an air gap, and the second interlayer insulating structure 182 between the second gate electrode 220 and the third gate electrode 320 may include an air gap.

Figure 30:
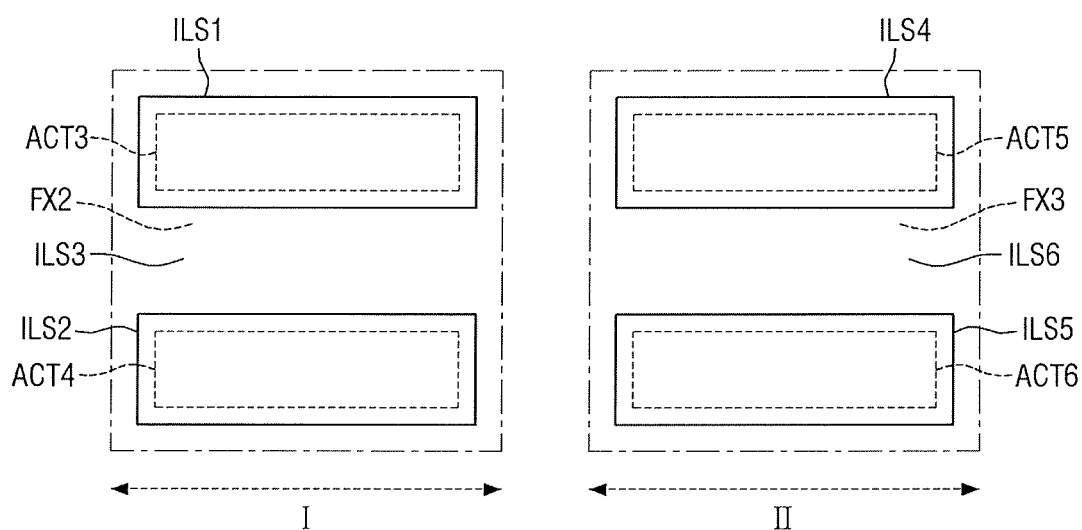
FIG. 30 is a schematic top view provided to explain a semiconductor device according to an exemplary embodiment of the present inventive concept.

FIG. 30 is a schematic top view provided to explain a semiconductor device according to an exemplary embodiment of the present inventive concept. For convenience of explanation, illustrations of the upper interlayer insulating film, the contact, and so on are omitted in the drawings.

Referring to FIG. 30, in a semiconductor device according to an exemplary embodiment of the present inventive concept, the substrate 100 may include a first region I and a second region II.

The first region I may include a third active region ACT3, a fourth active region ACT4, and a second field region FX2 between the third active region ACT3 and the fourth active region ACT4.

A fifth interlayer insulating structure ILS1 may be formed in the third active region ACT3, a sixth interlayer insulating structure ILS2 may be formed in the fourth active region ACT4, and a seventh interlayer insulating structure ILS3 may be formed in the second field region FX2.

The second region II may include a fifth active region ACT5, a sixth active region ACT6, and a third field region FX3 between the fifth active region ACT5 and the sixth active region ACT6.

An eighth interlayer insulating structure ILS4 may be formed in the fifth active region ACT5, a ninth interlayer insulating structure ILS5 may be formed in the sixth active region ACT6, and a tenth interlayer insulating structure ILS6 may be formed in the third field region FX3. In this case, both the seventh interlayer insulating structure ILS3 and the tenth interlayer insulating structure ILS6 may or may not include an air gap therein. Alternatively, one of the seventh interlayer insulating structure ILS3 and the tenth interlayer insulating structure ILS6 may not include an air gap therein, and the other may include an air gap therein.

FIGS. 31 to 36 are views provided to explain intermediate stages of fabrication, and provided to explain a method for fabricating a semiconductor device according to an exemplary embodiment of the present inventive concept.

FIGS. 31, 32, 33A and 34A are layout diagrams, respectively. FIGS. 33B and 33C are cross sectional views taken along lines A1-A1 and C-C of FIG. 33A, respectively. FIG. 34B is a cross sectional view taken along line C-C of FIG. 34A.

Figure 31:
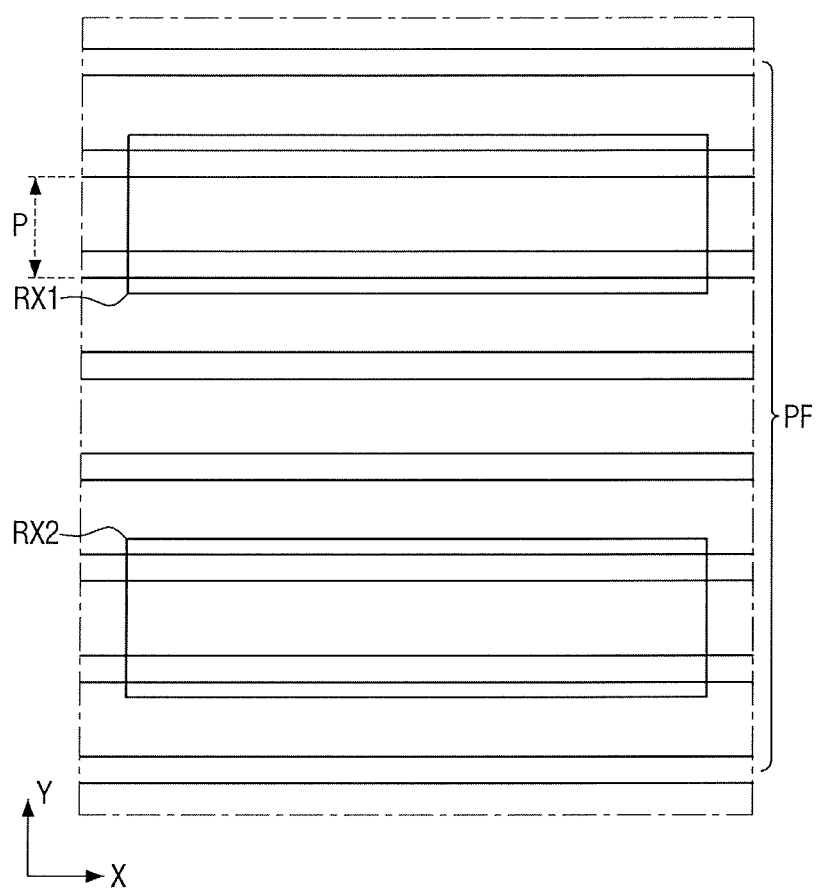
FIGS. 31 to 36 are views illustrating intermediate stages of fabrication, provided to explain a method for fabricating a semiconductor device according to an exemplary embodiment of the present inventive concept.
Figure 32:
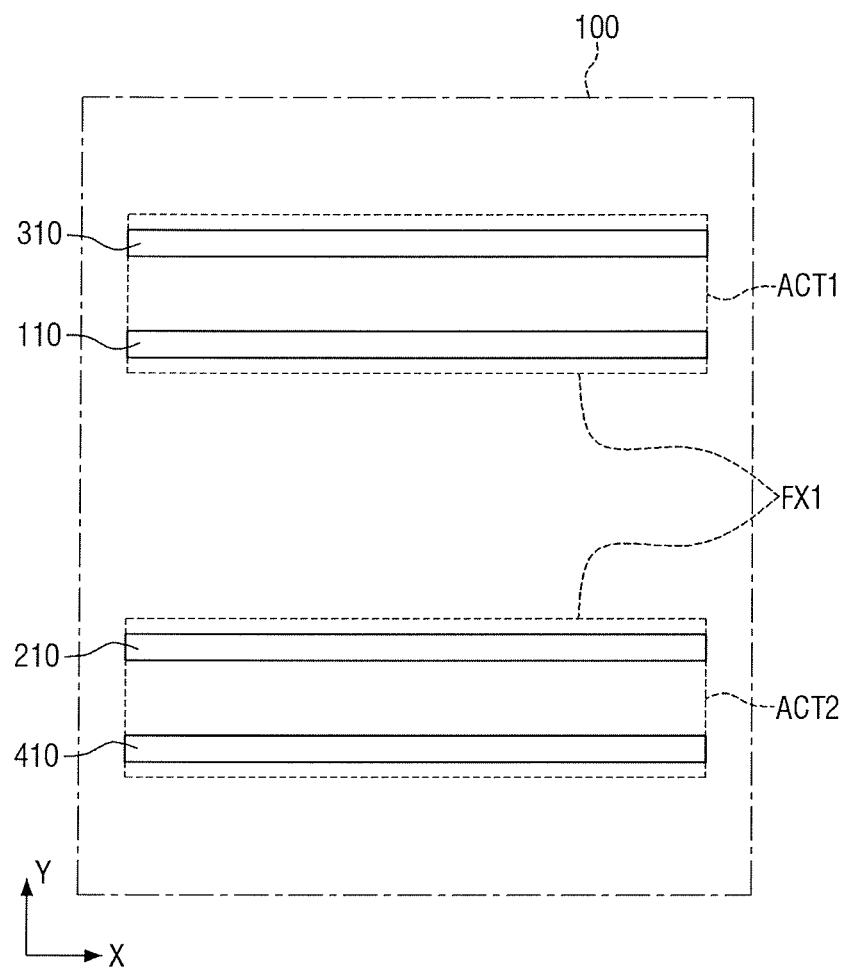

Referring to FIGS. 31 and 32, a plurality of pre-fin-type patterns PF having the fin pitch P may be formed on the substrate 100.

The plurality of pre-fin-type patterns PF may extend longitudinally in the first direction X, respectively. Each of the pre-fin-type patterns PF may be spaced apart from the other by the fin pitch P in the second direction Y. Then, using the first active region mask RX1 and the second active region mask RX2, the first active region ACT1, the second active region ACT2, and the first field region FX1 may be defined.

A portion of the pre-fin-type patterns PF hidden by the first active region mask RX1 may not be removed, so that the first fin-type pattern 110 and the third fin-type pattern 310 are formed on the substrate 100. The first fin-type pattern 110 and the third fin-type pattern 310 may be formed in the first active region ACT1. Further, a portion of the pre-fin-type patterns PF hidden by the second active region mask RX2 may not be removed, so that the second fin-type pattern 210 and the fourth fin-type pattern 410 are formed on the substrate 100. The second fin-type pattern 210 and the fourth fin-type pattern 410 may be formed in the second active region ACT2.

The pre-fin-type pattern PF not hidden by the first active region mask RX1 and the second active region mask RX2 may be removed. As a result, the first active region ACT1 where the first fin-type pattern 110 and the third fin-type pattern 310 are formed, and the second active region ACT2 where the second fin-type pattern 210 and the fourth fin-type pattern 410 are formed may be defined. Further, the first field region FX1 where the fin-type is not formed may also be defined. In other words, the substrate 100 may include the first active region ACT1 and the second active region ACT2 where at least one or more fin-type patterns are formed, and the first field region FX1 where the fin-type pattern is not formed.

Figure 33A:
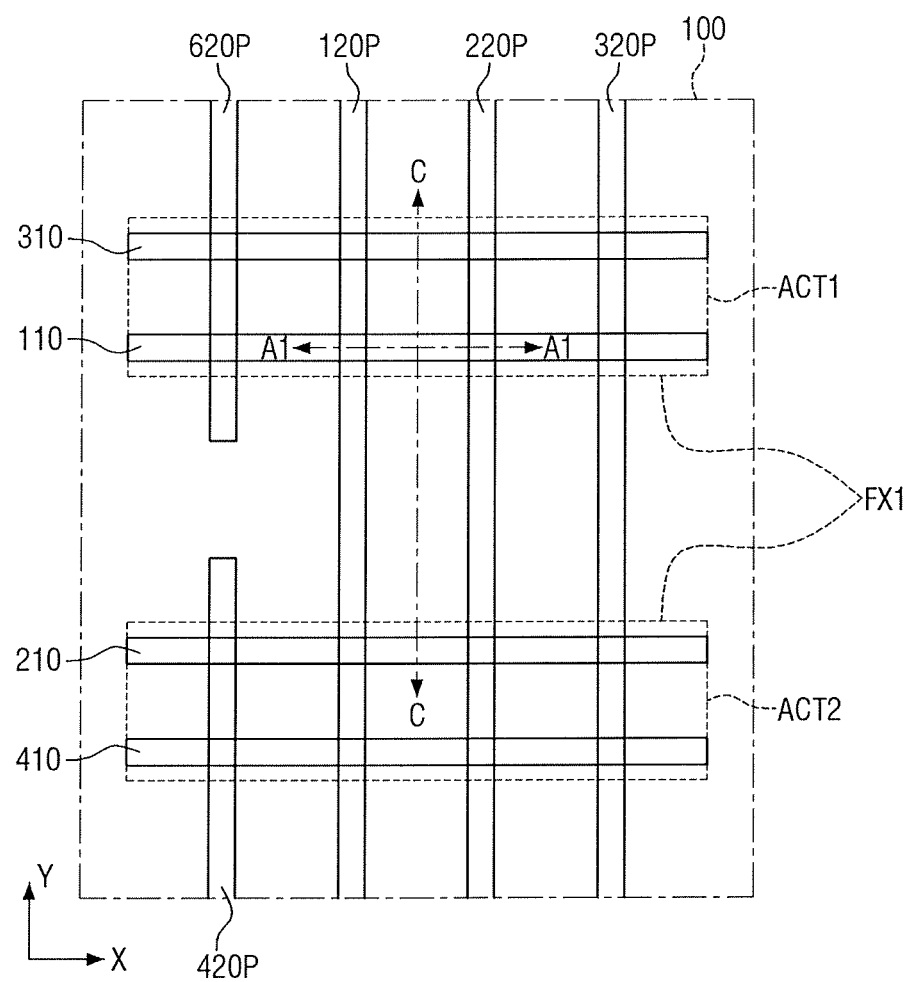
Figure 33B:
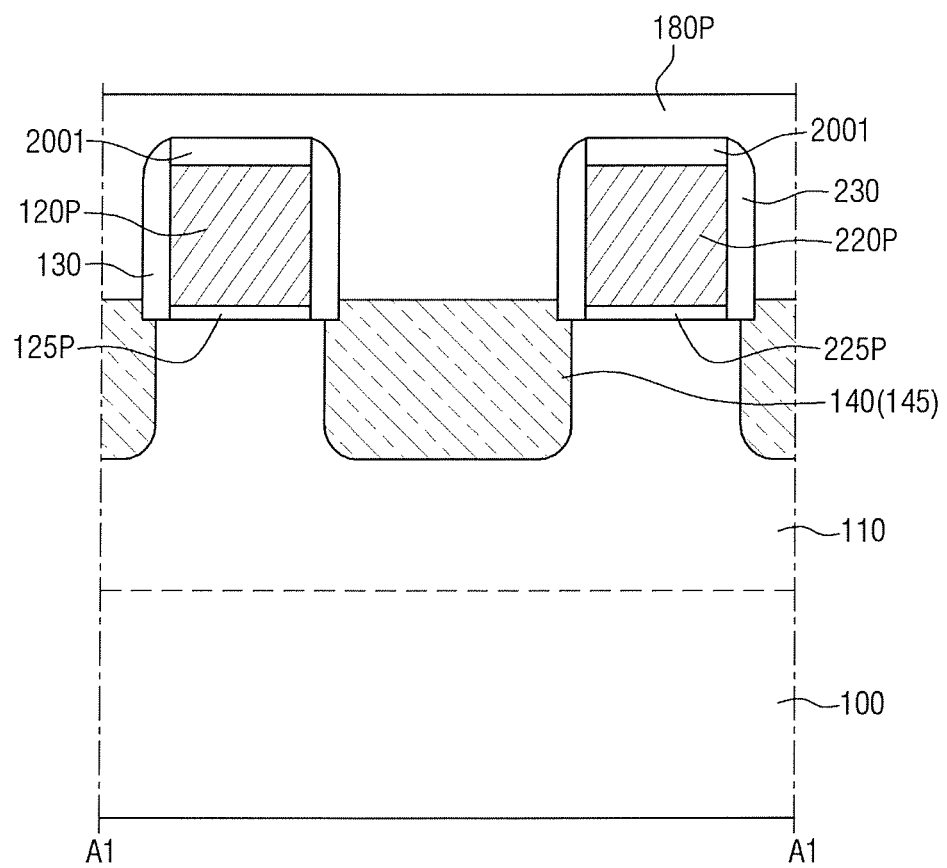
Figure 33C:
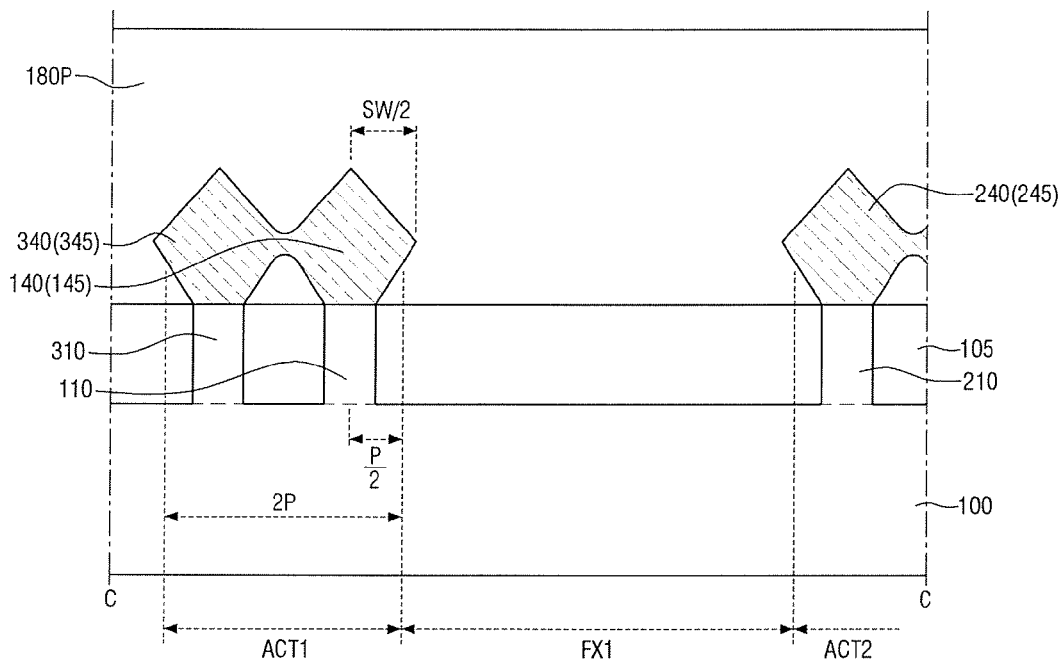

Referring to FIGS. 33A to 33C, first to third dummy gate electrodes 120P, 220P, 330P may be formed, intersecting with first to fourth fin-type patterns 110, 210, 310, 410.

The first to third dummy gate electrodes 120P, 220P, 330P may span the first active region ACT1, the first field region FX1, and the second active region ACT2.

Depending on occasions, a fourth dummy gate electrode 420P may be formed, intersecting with the second fin-type pattern 210 and the fourth fin-type pattern 410, but not with the first fin-type pattern 110 and the third fin-type pattern 310. Likewise, a fifth dummy gate electrode 620P may be formed, intersecting with the first fin-type pattern 110 and the third fin-type pattern 310, but not with the second fin-type pattern 210 and the fourth fin-type pattern 410.

The first dummy gate electrode 120P and the second dummy gate electrode 220P may be formed on the first fin-type pattern 110.

A first dummy gate insulating film 125P may be formed between the first dummy gate electrode 120P and the first fin-type pattern 110. A second dummy gate insulating film 225P may be formed between the second dummy gate electrode 220P and the first fin-type pattern 110.

A mask pattern 2001 may be formed on the first dummy gate electrode 120P and the second dummy gate electrode 220P.

A first gate spacer 130 may be formed on a sidewall of the first dummy gate electrode 120P, and a second gate spacer 230 may be formed on a sidewall of the second dummy gate electrode 220P.

The first source/drain region 140 including the first epitaxial layer 145 may be formed on the first fin-type pattern 110 between the first dummy gate electrode 120P and the second dummy gate electrode 220P. Likewise, the second source/drain 240 including the second epitaxial layer 245 may be formed on the second fin-type pattern 210, and the third source/drain 340 including the third epitaxial layer 345 may be formed on the third fin-type pattern 310.

As illustrated in FIG. 33C, the first epitaxial layer 145 and the third epitaxial layer 345 may be in contact with each other, although exemplary embodiments of the present inventive concept are not limited thereto.

The first source/drain 140 may have a width SW in the second direction Y. The width SW of the first source/drain 140 in the second direction Y may be obtained as follows.

A size of the first epitaxial layer 145 included in the first source/drain 140 may be subject to influence of a width of the first fin-type pattern 110 in the second direction Y to be a seed of the first epitaxial layer 145, and a recessed depth of the first fin-type pattern 110 to form the first epitaxial layer 145.

In the fabrication process, a width of the first fin-type pattern 110 in the second direction Y, and a recess depth of the first fin-type pattern 110 to form the first epitaxial 145 are determined for each of semiconductor device manufacturers. Further, a crystal plane developed during the growth of the first epitaxial layer 145 is also determined. Accordingly, using these, the width SW of the first source/drain 140 in the second direction Y may be obtained.

A portion of the first source/drain 140 may be overlapped with the first field region FX1.

When the number of the fin-type patterns formed in the first active region ACT1 are two, a width of the first active region ACT1 in the second direction Y may be determined to be, for example, twice the fin pitch P, but note that this is only for illustrative purpose, and exemplary embodiments of the present inventive concept are not limited thereto.

When determined as described above, a width in which the first field region FX1 overlaps with the first source/drain 140 is obtained by subtracting the fin pitch P from the width SW of the first source/drain 140 in the second direction Y and dividing the remainder in half.

A pre-lower field insulating film 180P may be formed on the substrate 100, and may overlay the first to third source/drains 140, 240, 340, and the first dummy gate electrode 120P and the second dummy gate electrode 220P. The pre-lower interlayer insulating film 180P may surround the sidewall of the first dummy gate electrode 120P and the sidewall of the second dummy gate electrode 220P.

The pre-lower interlayer insulating film 180P may also overlay the upper surface of the mask pattern 2001.

Figure 34A:
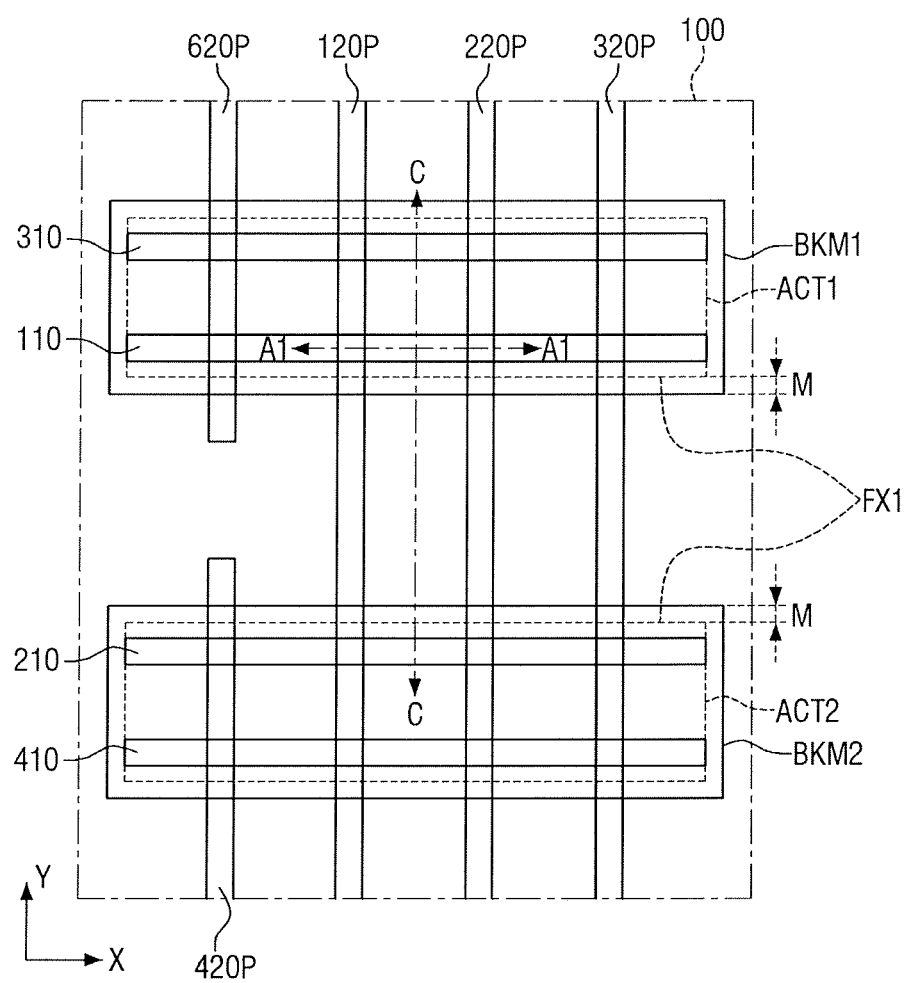
Figure 34B:
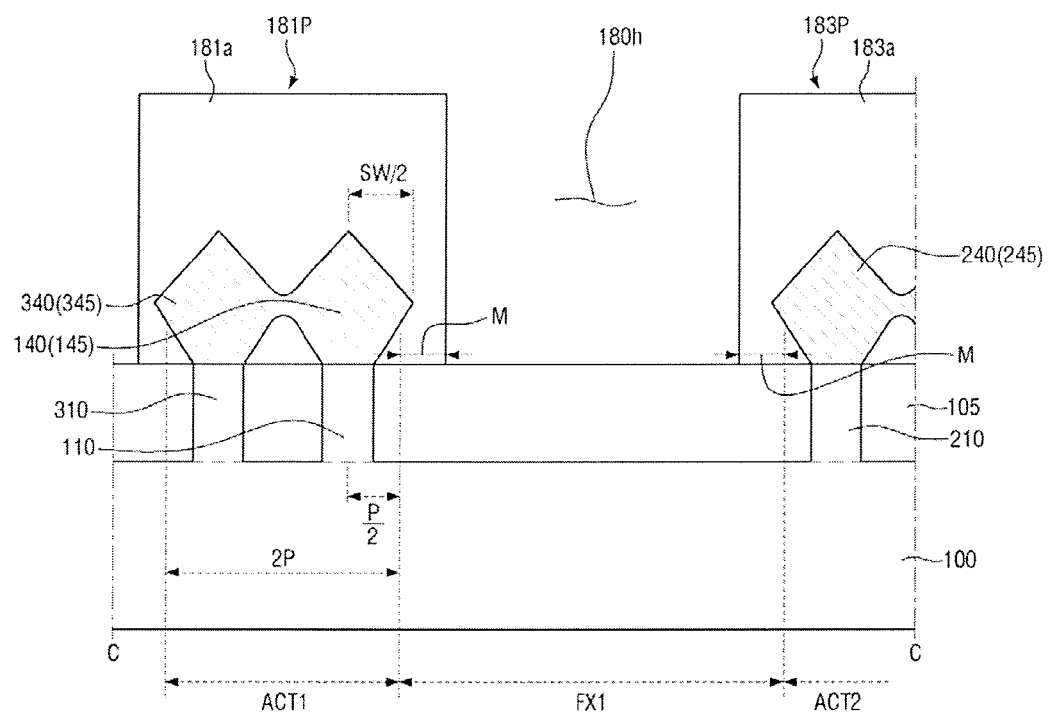

Referring to FIGS. 34A and 34B, the pre-lower interlayer insulating film 180P in the first field region FX1 may be removed using a first blocking mask BKM1 and a second blocking mask BKM2.

A first opening 180*h* may be formed upon removal of the pre-lower interlayer insulating film 180P in the first field region FX1. Further, a first pre-interlayer insulating structure 181P may be formed in the first active region ACT1 hidden by the first blocking mask BKM1, and a second pre-interlayer insulating structure 183P may be formed in the second active region ACT2 hidden by the second blocking mask BKM2.

The first blocking mask BKM1 may be greater than the first active region ACT1 by the margin width M on all sides. That is, the first blocking mask BKM1 may hide not only the first active region ACT1, but also a portion of the first field region FX1.

The first blocking mask BKM1 may be greater than the first active region ACT1, because the first to third source/drains 140, 240, 340 should not have damage during removal of the lower interlayer insulating film 180P in the first field region FX1.

The margin width M may be greater than a width in which the first field region FX1 overlaps with at least the first source/drain 140, so that the first blocking mask BKM1 protects the first to third source/drains 140, 240, 340. That is, the margin width M may be greater than a value obtained by subtracting the fin pitch P from a width SW of the first source/drain 140 in the second direction Y and dividing the remainder in half. In addition, the margin width M may further include a misalign margin of the first active region mask RX1 used when defining the first active region ACT1. Further, the margin width M may further include a misalign margin in the first blocking mask BKM1 used when removing the pre-lower interlayer insulating film 180P in the first field region FX1. In other words, the width in which the first field region FX1 overlaps with the first pre-interlayer insulating structure 181P may be the margin width M.

Unlike the illustration in FIG. 33B, FIGS. 34A to 34B, at least a portion of the first gate spacer 130 and the second gate spacer 230 may be removed when the pre-lower interlayer insulating film 180P in the first field region FX1 is removed.

Figure 35A:
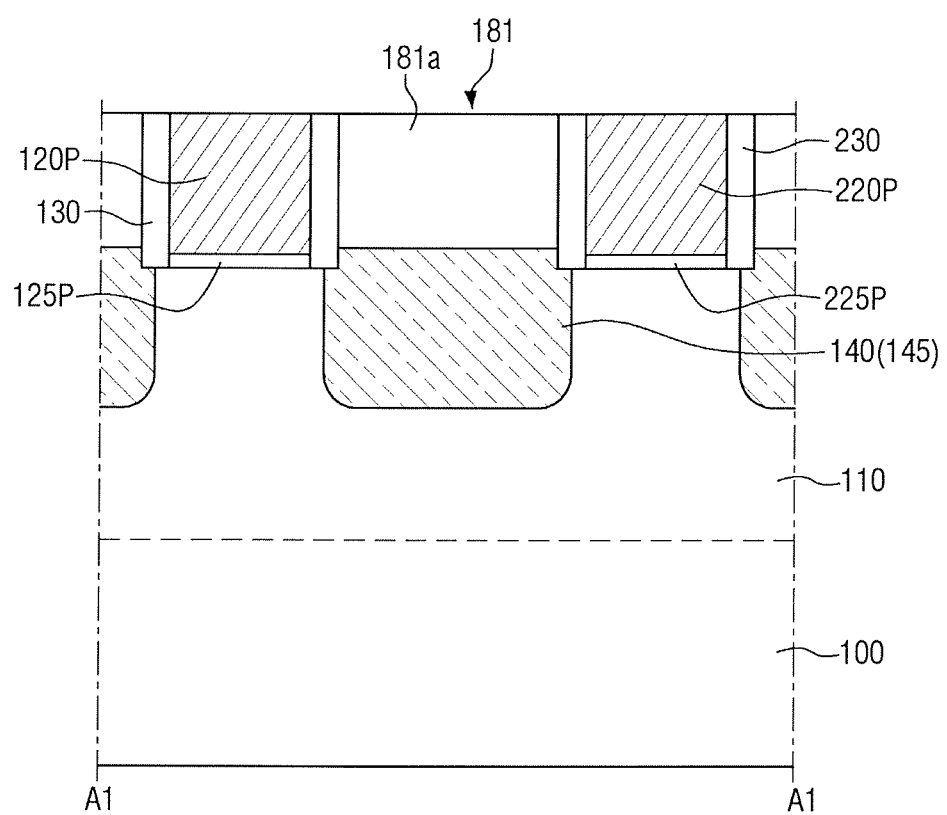
Figure 35B:
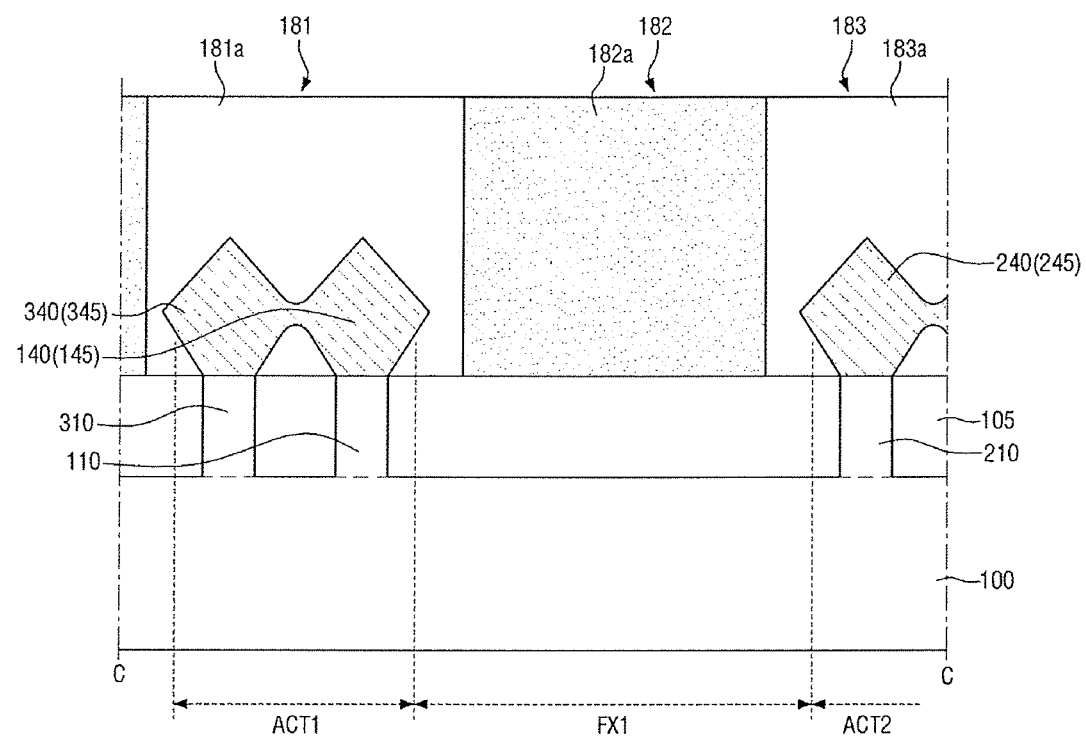

Referring to FIGS. 35A and 35B, the second interlayer insulating material 182*a* may be deposited to fill the first opening 180*h*.

The second interlayer insulating material 182*a* may be a material having a smaller dielectric constant than a dielectric constant of the insulating material included in the pre-lower interlayer insulating film 180P.

To expose an upper surface of the first dummy gate electrode 120P and an upper surface of the second dummy gate electrode 220P, the first pre-interlayer insulating structure 181P and the second pre-interlayer insulating structure 183P may be planarized. At this time, the area containing the second interlayer insulating material 182*a* may also be planarized. As a result, the second interlayer insulating structure 182 may be formed on the first interlayer insulating structure 181 overlaying the first to third source/drains 140, 340, on the third interlayer insulating structure 183 overlaying the second source/drain 240, and on the substrate in the first field region FX1.

Unlike the illustration in FIGS. 35A and 35B, the second interlayer insulating structure 182 may include an air gap surrounded by the second interlayer insulating material 182*a*. In this case, the dielectric constant of the second interlayer insulating material 182*a* may be equal to the dielectric constant of the insulating material included in the pre-lower interlayer insulating film 180P.

Figure 36:
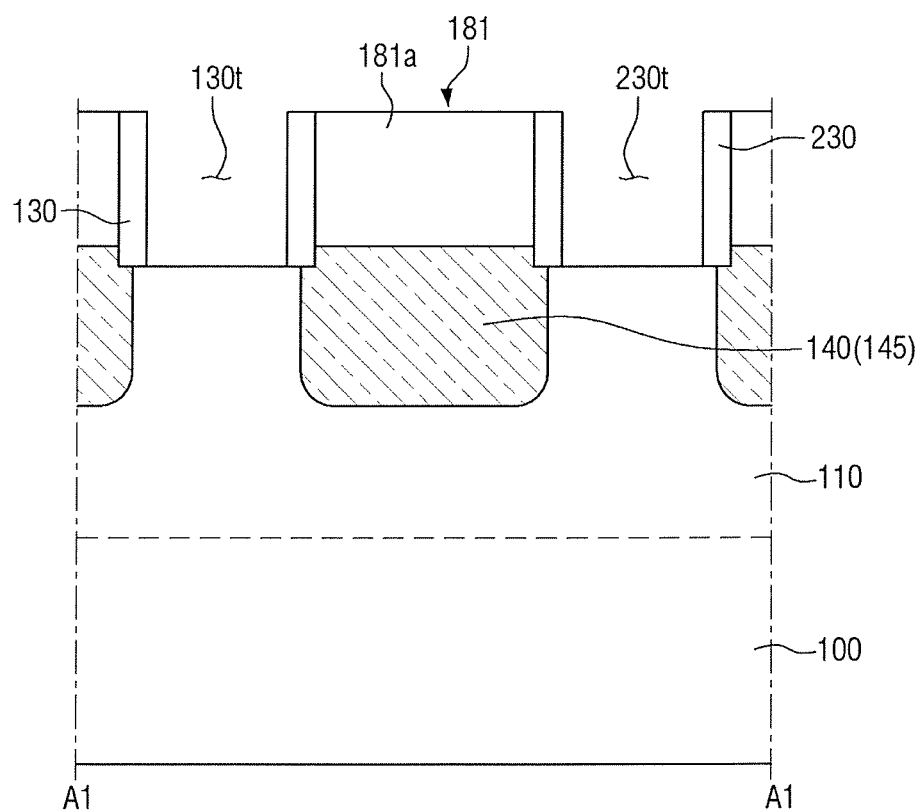

Referring to FIG. 36, the first dummy gate electrode 120P and the second dummy gate electrode 220P may be removed, so that the first trench 130*t* defined by the first gate spacer 130, and the second trench 230*t* defined by the second gate spacer 230 are formed.

The first dummy gate insulating film 125P and the second dummy gate insulating film 225P may also be removed.

Referring to FIGS. 2A, 2B and 5, the first gate electrode 120 and the second gate electrode 220 may be formed, filling the first trench 130*t* and the second trench 230*t*. Further, the first to third contacts 510, 520, 530 may be formed.

A method for fabricating a semiconductor device according to an exemplary embodiment of the present inventive concept will be described below with reference to FIGS. 31 to 33C, and 37 to 41B.

FIGS. 37 to 41B are views illustrating intermediate stages of fabrication, provided to explain a method for fabricating a semiconductor device according to an exemplary embodiment of the present inventive concept.

Figure 37:
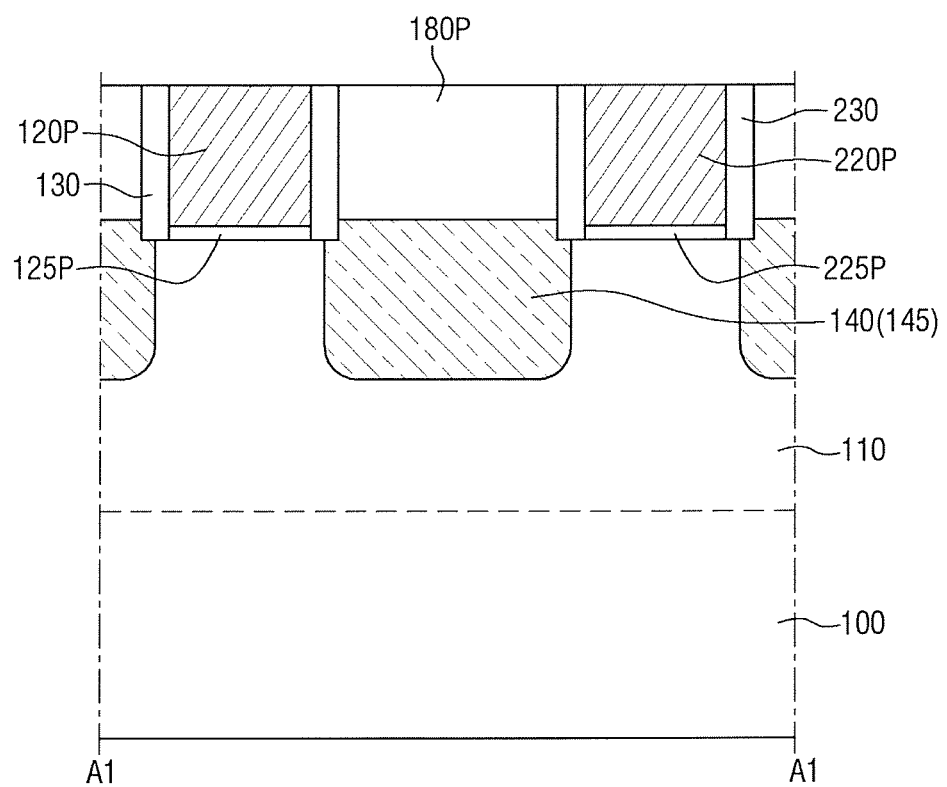
FIGS. 37 to 41B are views illustrating intermediate stages of fabrication, provided to explain a method for fabricating a semiconductor device according to an exemplary embodiment of the present inventive concept.

For reference, FIG. 37 may be the fabrication process after FIGS. 33A to 33C.

Referring to FIG. 37, the pre-lower interlayer insulating film 180P may be planarized to expose the upper surface of the first dummy gate electrode 120P and the upper surface of the second dummy gate electrode 220P.

While the pre-lower interlayer insulating film 180P may be planarized, it may surround the sidewall of the first dummy gate electrode 120P and the sidewall of the second dummy gate electrode 220P.

Figure 38:
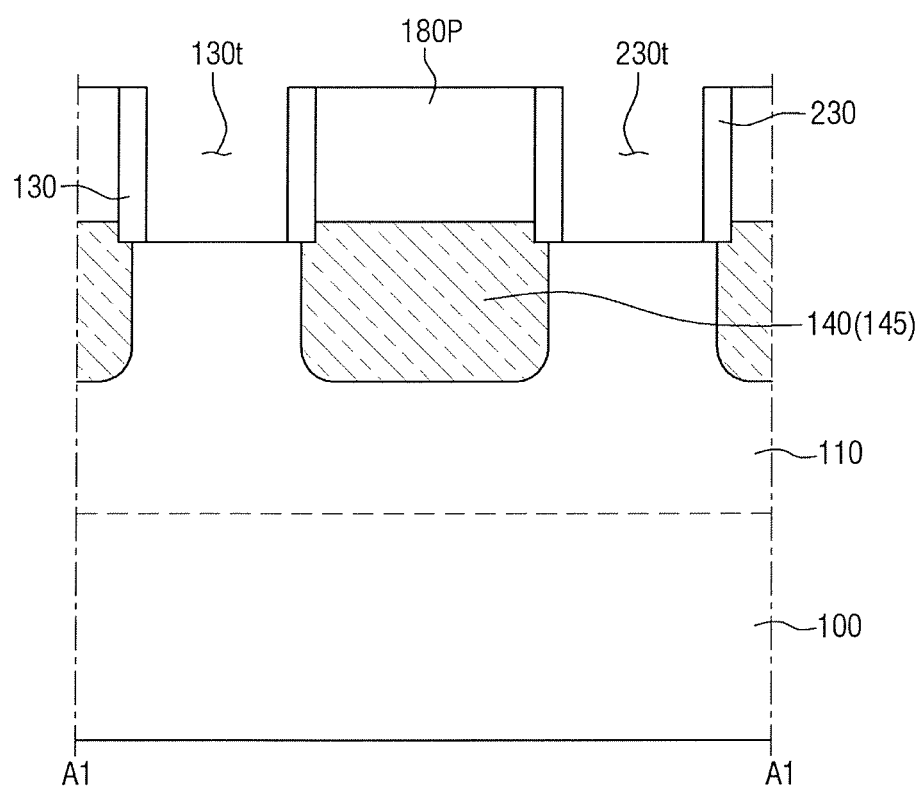

Referring to FIG. 38, the first dummy gate electrode 120P and the second dummy gate electrode 220P may be removed, so that the first trench 130*t* and the second trench 230*t* are formed.

The first trench 130*t* may be defined by the first gate spacer 130, and the second trench 230*t* may be defined by the second gate spacer 230.

The first dummy gate insulating film 125P and the second dummy gate insulating film 225P may also be removed.

Figure 39:
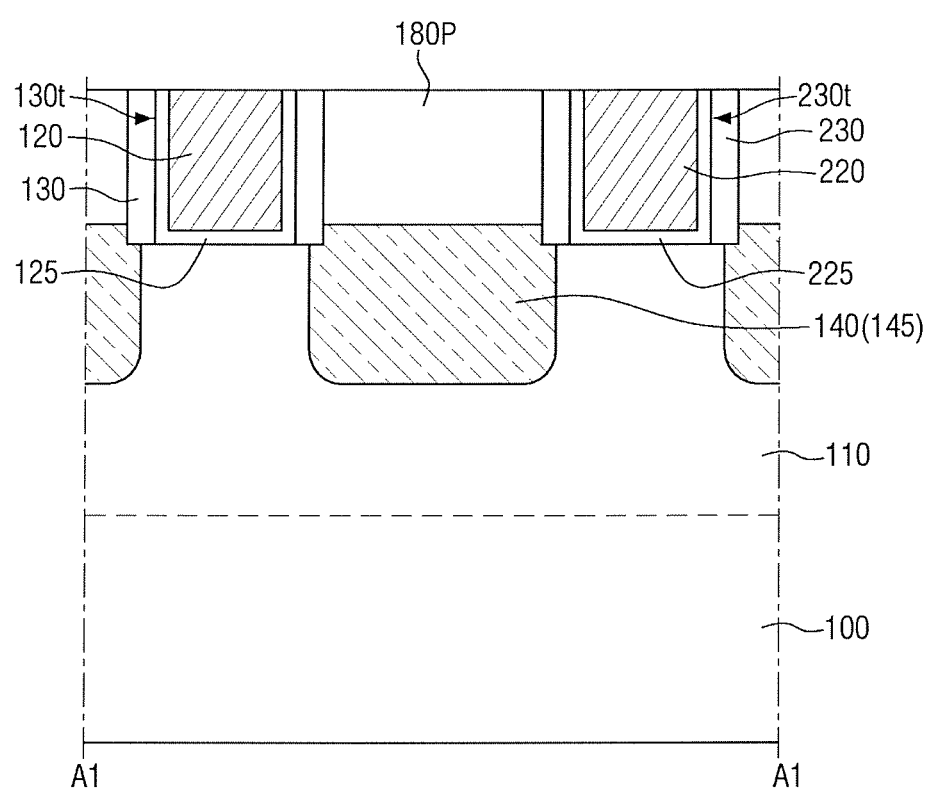

Referring to FIG. 39, the first gate insulating film 125 may be formed on a sidewall and a bottom surface of the first trench 130*t*, and the second gate insulating film 225 may be formed on a sidewall and a bottom surface of the second trench 230*t*. Then, the first gate electrode 120 filling the first trench 130*t*, and the second gate electrode 220 filling the second trench 230*t* may be formed.

Figure 40A:
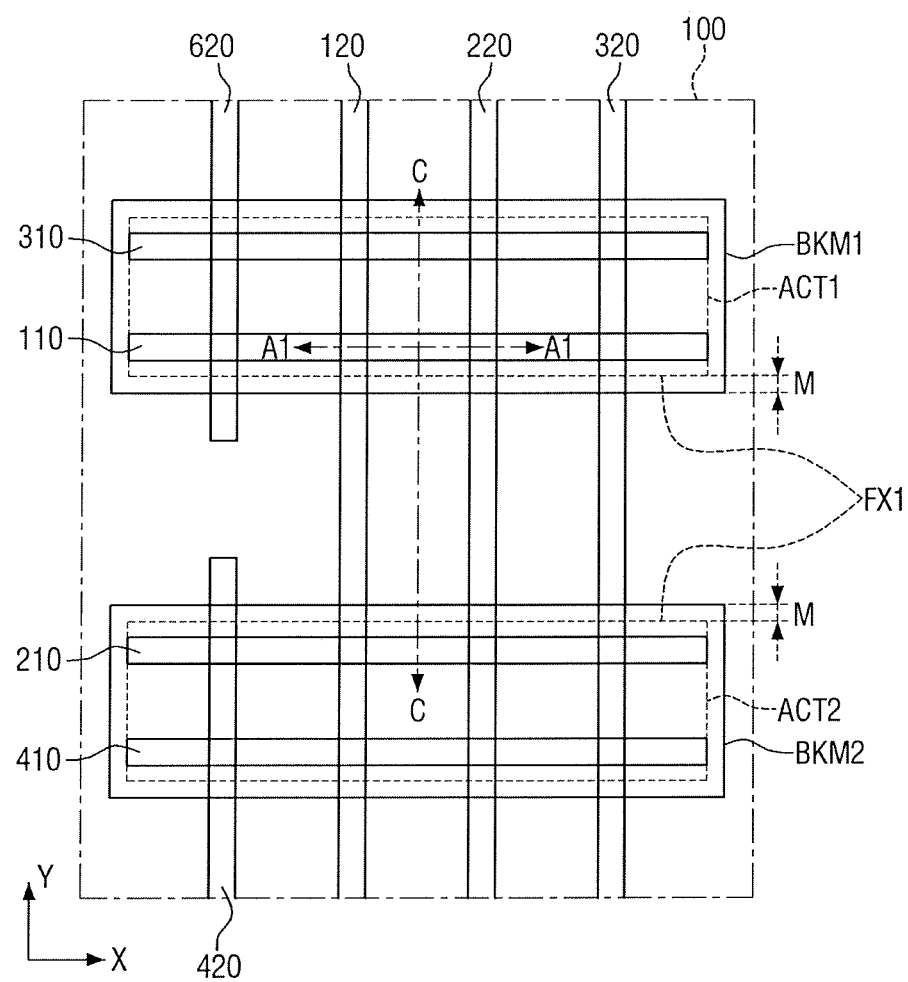
Figure 40B:
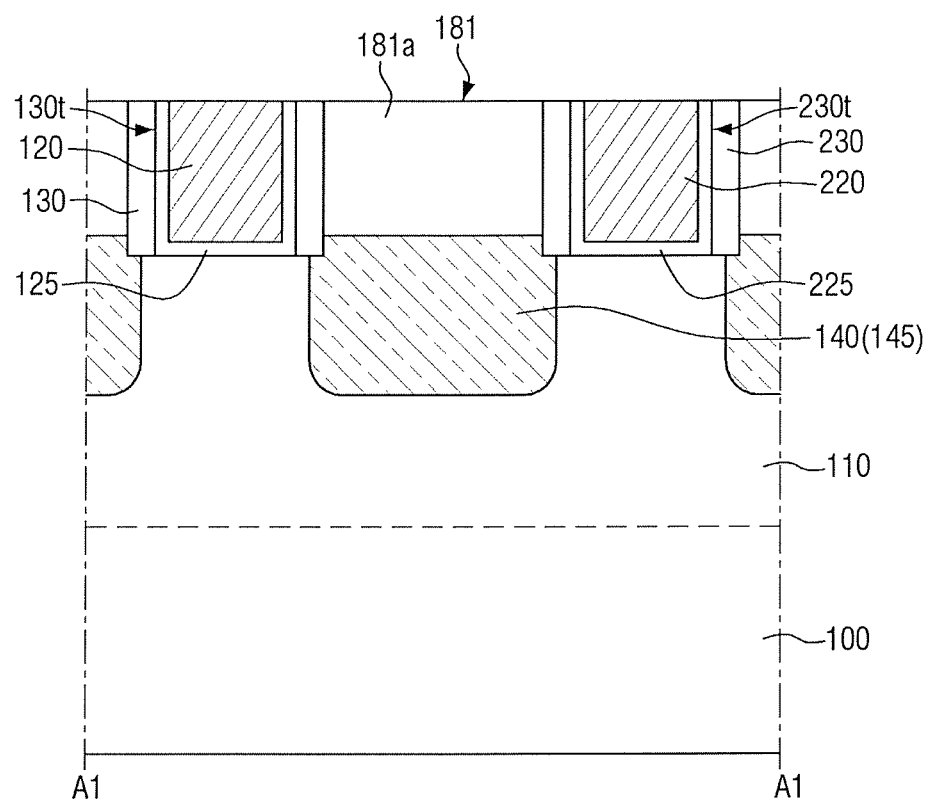
Figure 40C:
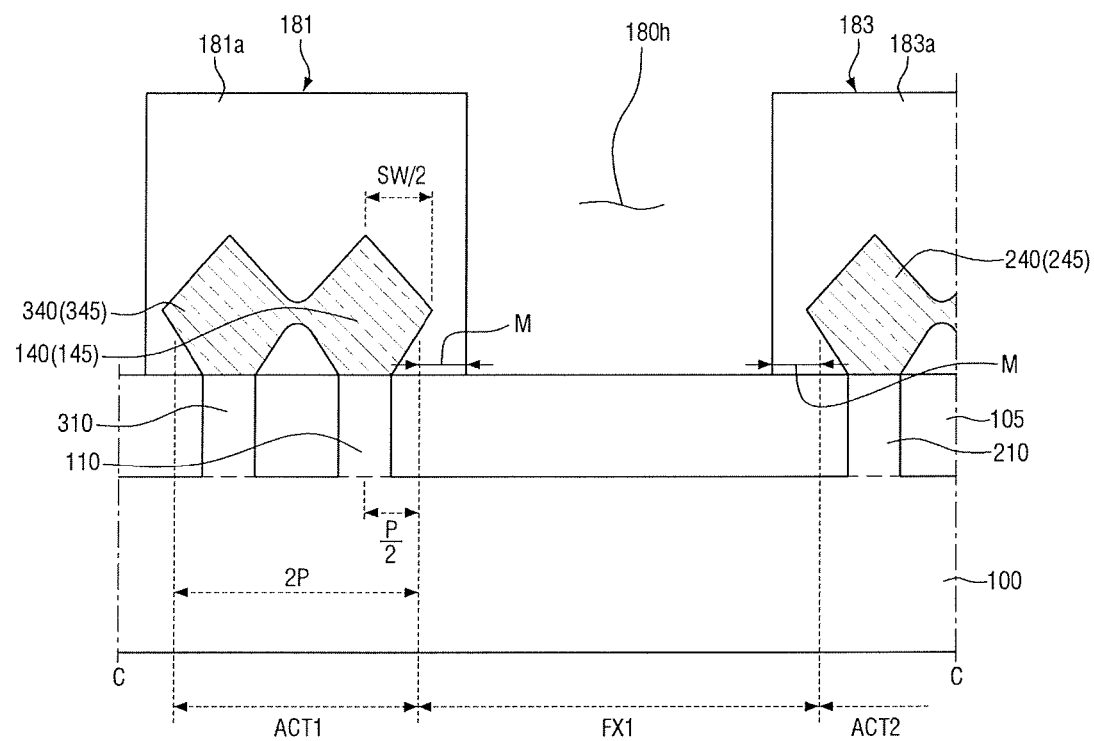

Referring to FIGS. 40A to 40C, the pre-lower interlayer insulating film 180P in the first field region FX1 may be removed using the first blocking mask BKM1 and the second blocking mask BKM2.

A first opening 180*h* may be formed by removing the pre-lower interlayer insulating film 180P in the first field region FX1.

The first interlayer insulating structure 181 may be formed in the first active region ACT1 hidden by the first blocking mask BKM1, and the third interlayer insulating structure 183 in the second active region ACT2 hidden by the second blocking mask BKM2.

The first blocking mask BKM1 may be greater than the first active region ACT1 by the margin width M on all sides. That is, the first blocking mask BKM1 may hide not only the first active region ACT1, but also a portion of the first field region FX1.

The margin width M will not be additionally described below, but referred to the description provided above with reference to FIGS. 34A to 34B.

The second interlayer insulating material 182*a* may be deposited to fill the first opening 180*h*. As a result, the second interlayer insulating structure 182 may be formed in the first field region FX1.

Figure 41A:
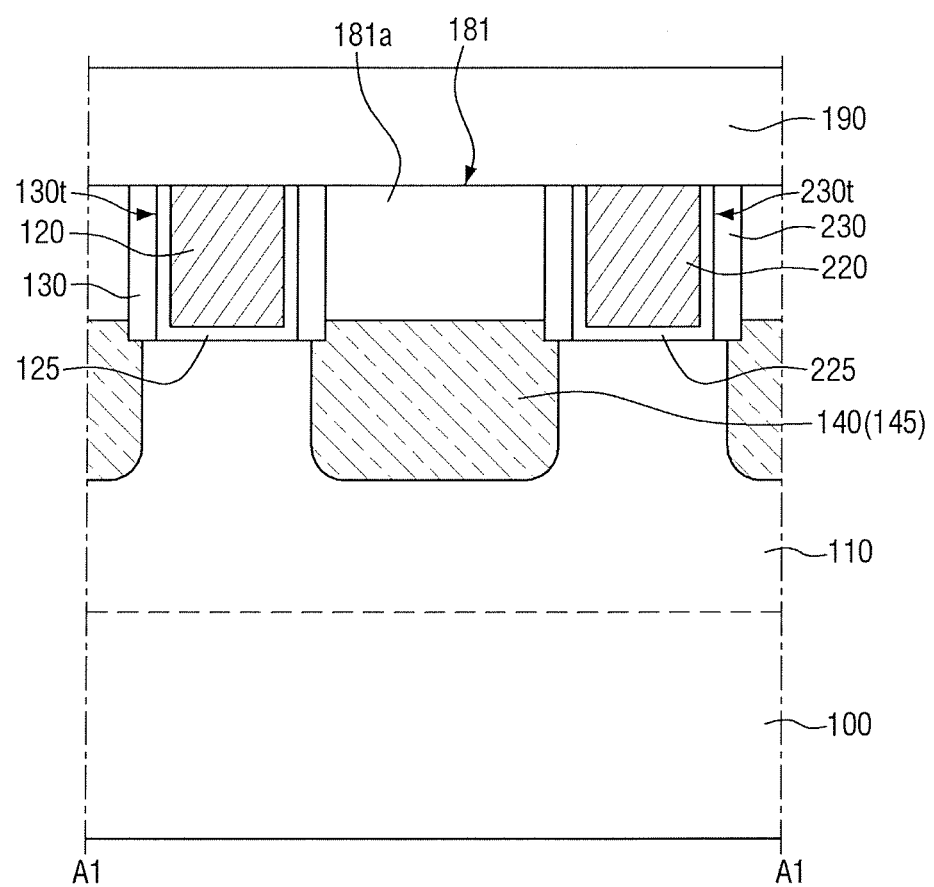
Figure 41B:
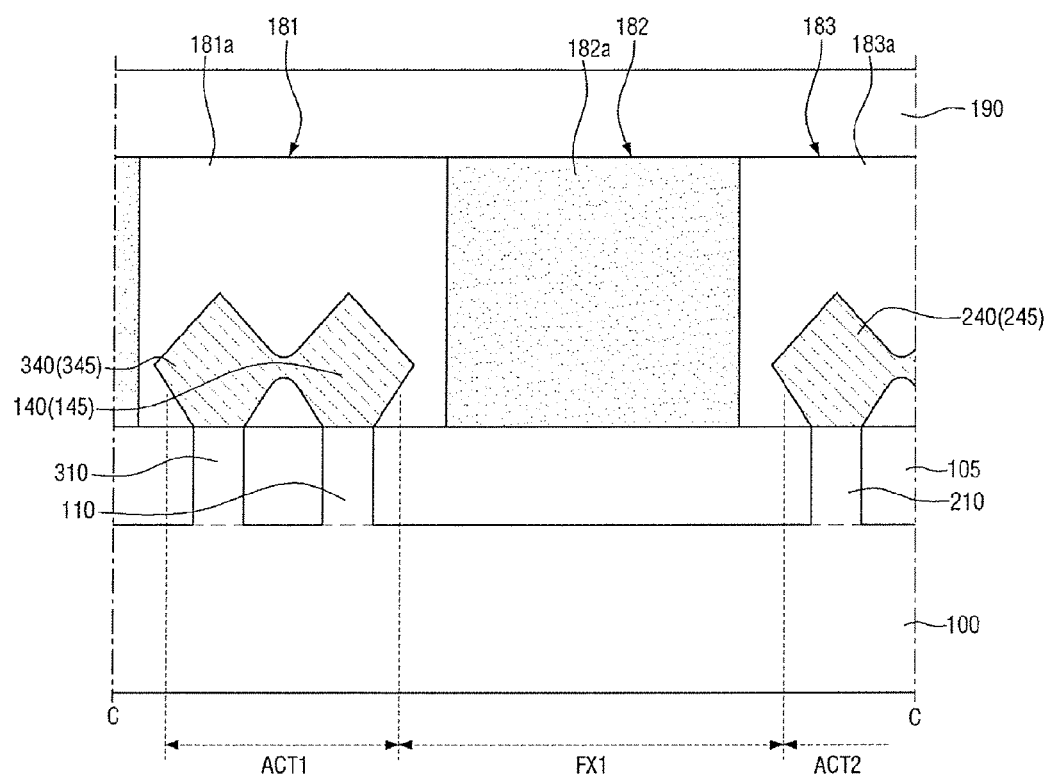

Referring to FIGS. 41A and 41B, an upper interlayer insulating film 190 may be formed on the first to third interlayer insulating structures 181, 182, 183. Then, the first to third contacts 510, 520, 530 may be formed.

A method for fabricating a semiconductor device according to an exemplary embodiment of the present inventive concept will be described below with reference to FIGS. 31 to 33C, 37 to 39, and 42A to 44C.

FIGS. 42A to 44C are views illustrating intermediate stages of fabrication, provided to explain a method for fabricating a semiconductor device according to an exemplary embodiment of the present inventive concept.

Figure 42A:
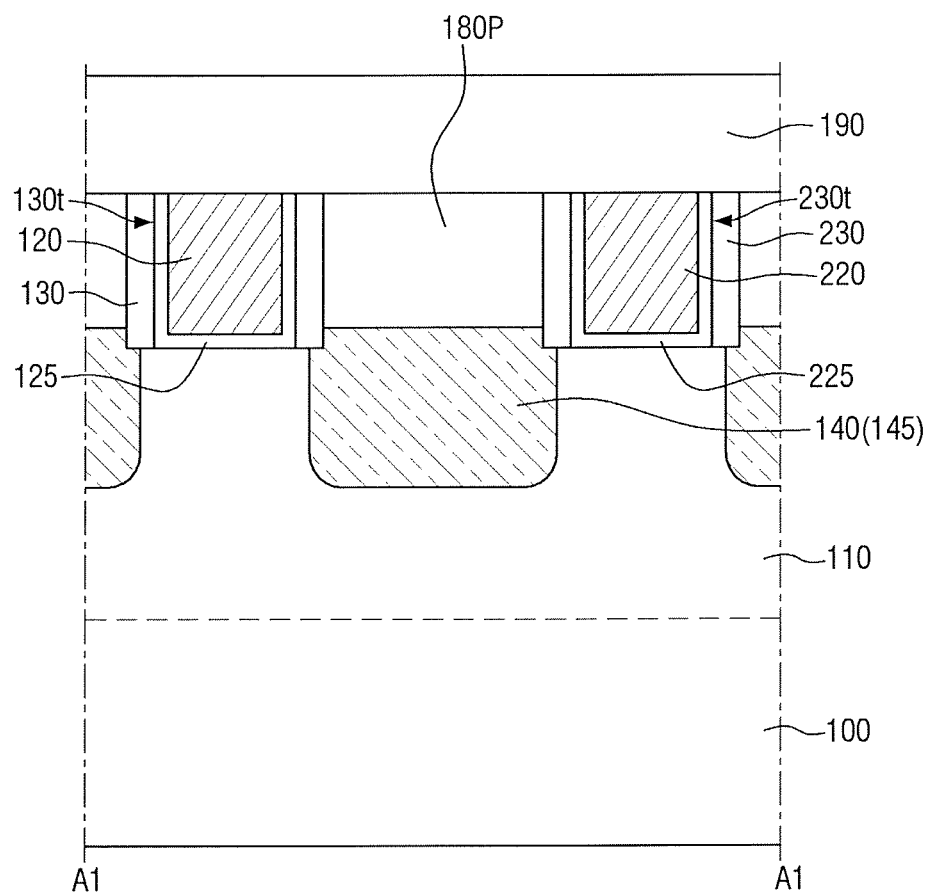
FIGS. 42A to 44C are views illustrating intermediate stages of fabrication, provided to explain a method for fabricating a semiconductor device according to an exemplary embodiment of the present inventive concept.
Figure 42B:
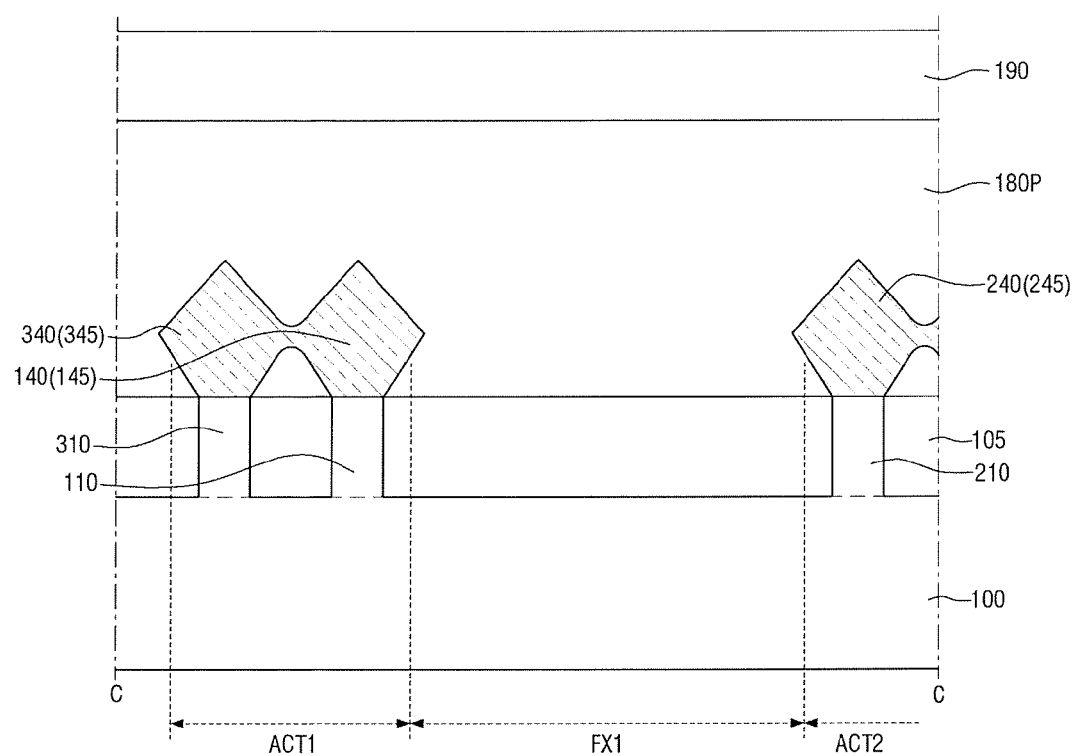

For reference, FIGS. 42A and 42B may be the fabrication process after FIG. 39.

Referring to FIGS. 42A and 42B, the upper interlayer insulating film 190 may be formed on the first gate electrode 120, the second gate electrode 220, and the pre-lower interlayer insulating film 180P.

Figure 43A:
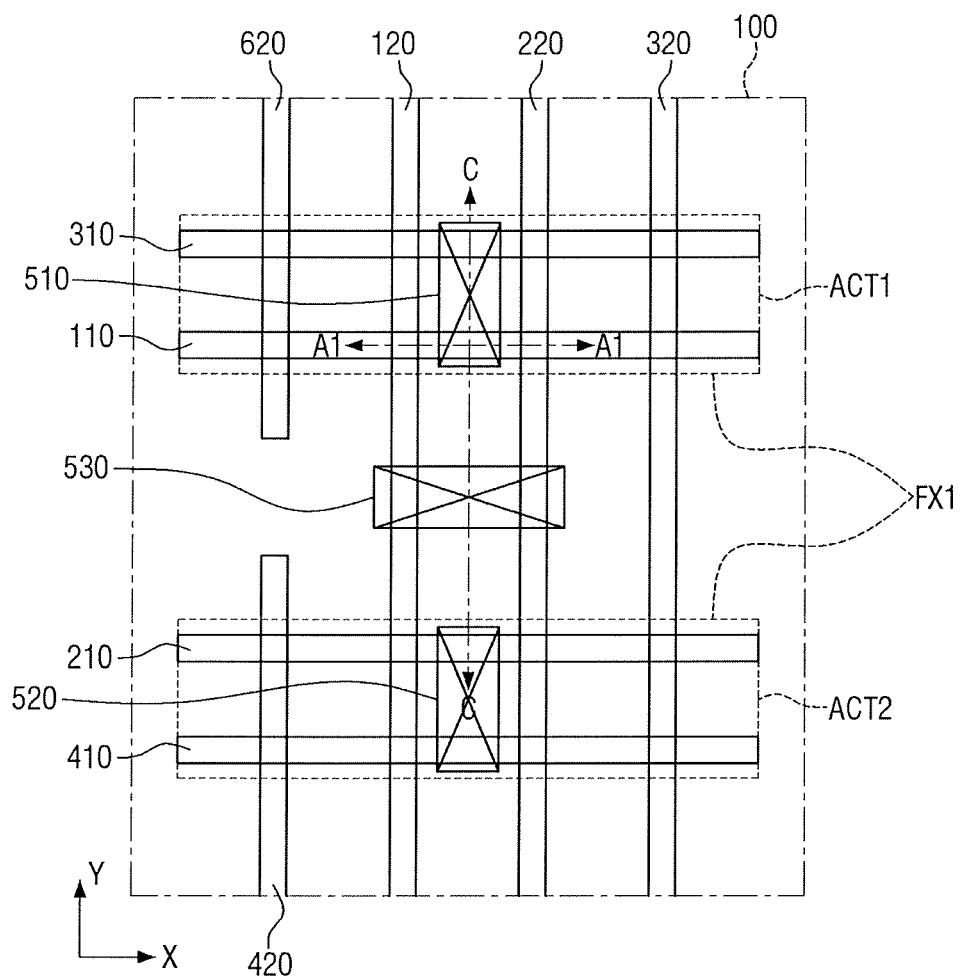
Figure 43B:
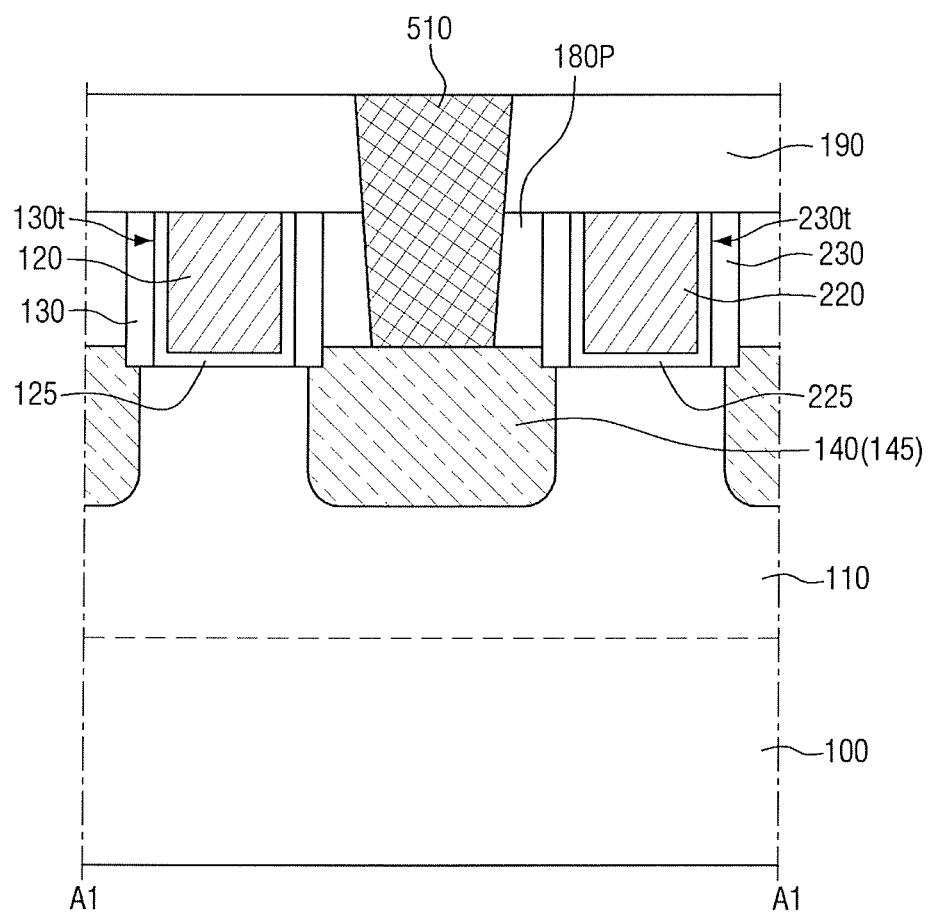
Figure 43C:
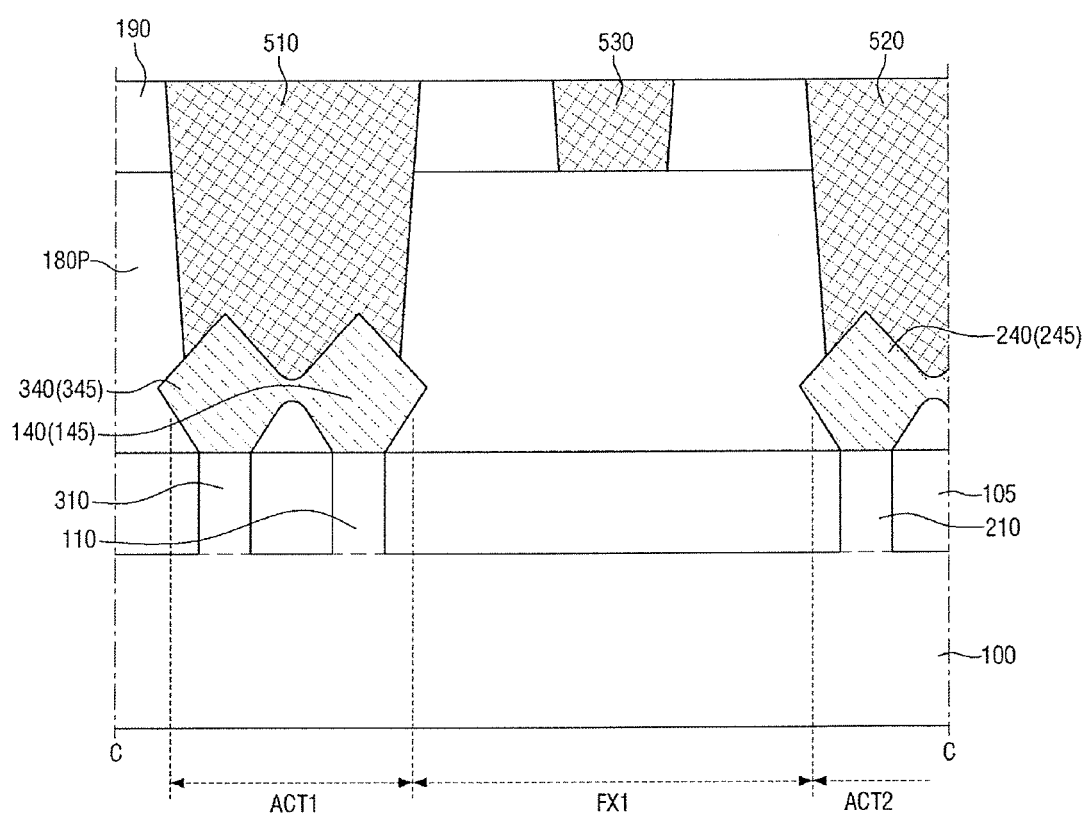

Referring to FIGS. 43A to 43C, the first contact 510 connected with the first source/drain 140 and the third source/drain 340, the second contact 520 connected with the second source/drain 240, and the third contact 530 connected with the first gate electrode 120 and the second gate electrode 220 may be formed.

Figure 44A:
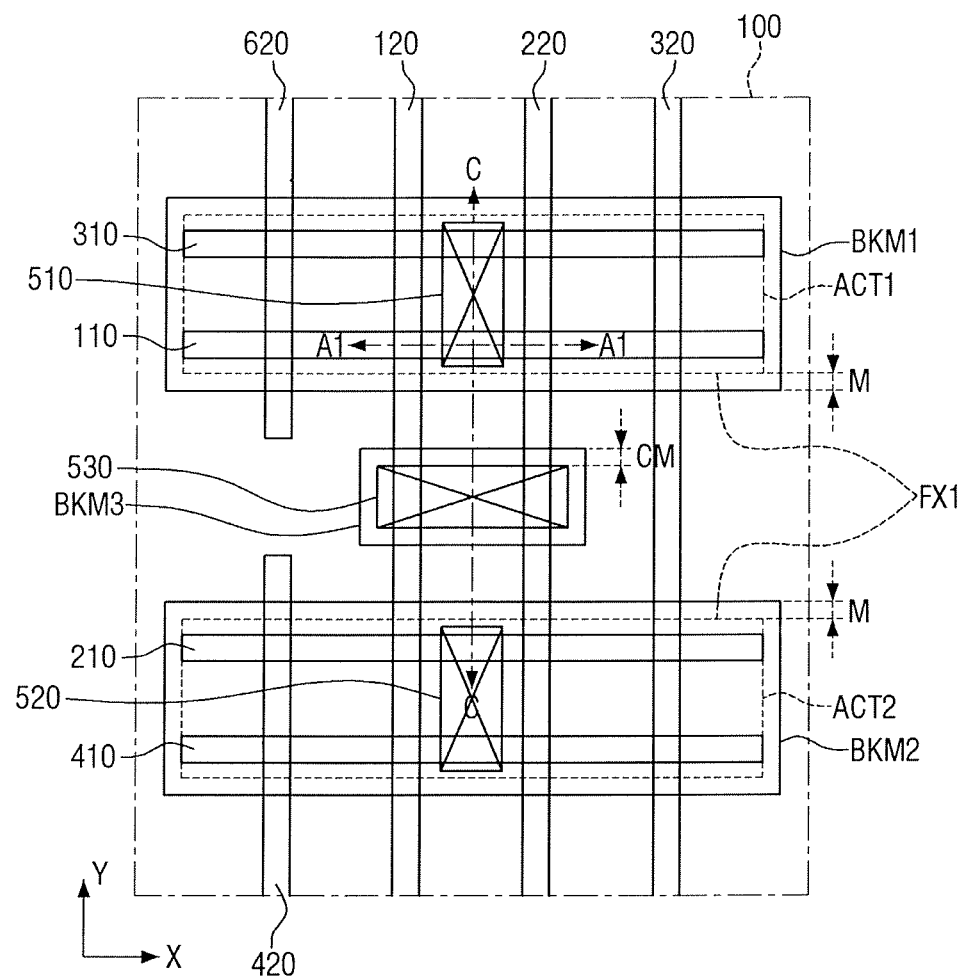
Figure 44B:
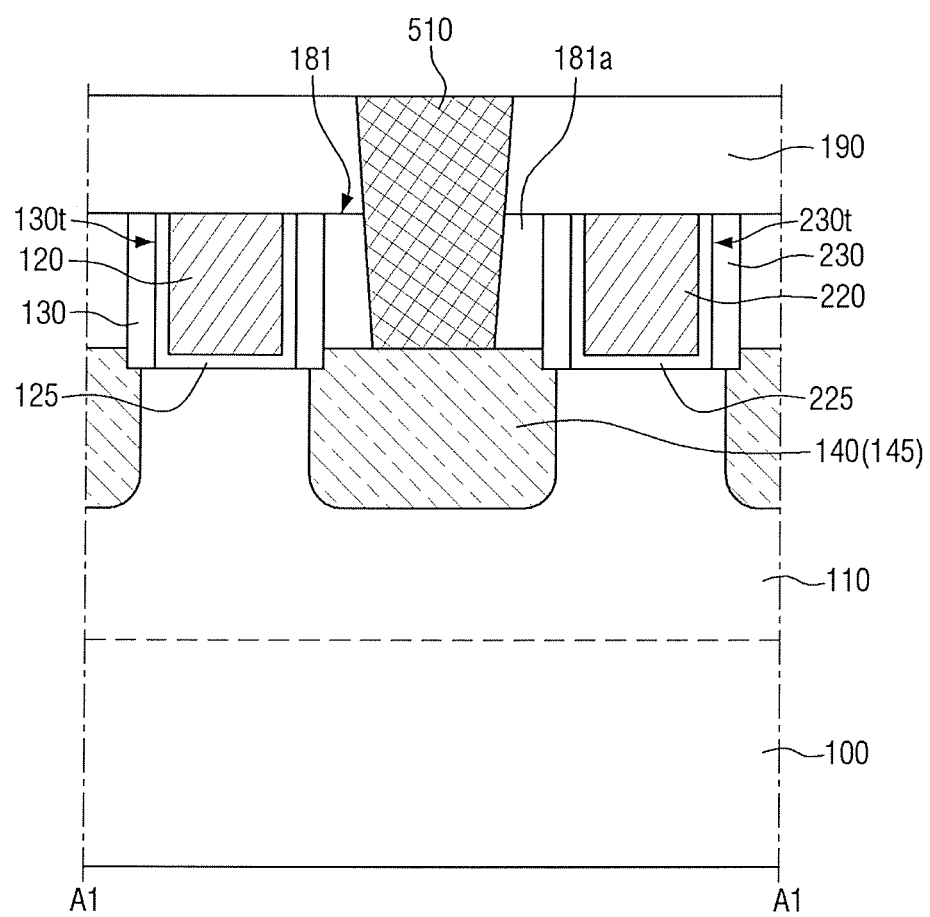
Figure 44C:
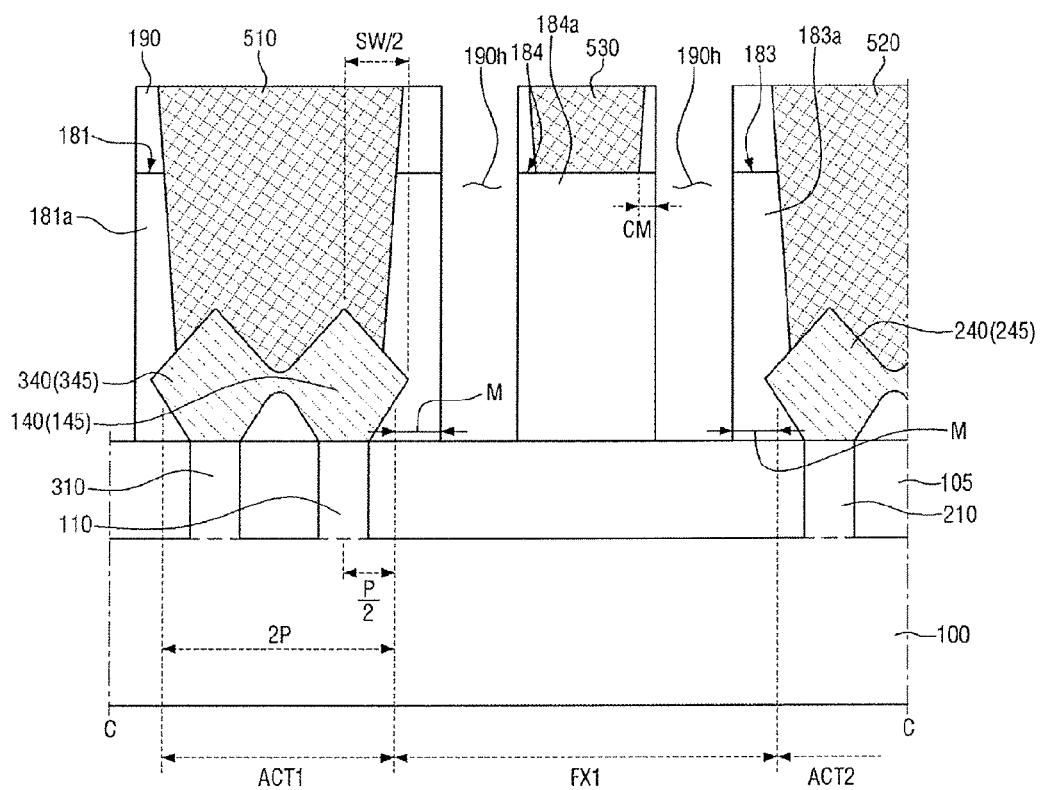

Referring to FIGS. 44A to 44C, the pre-lower interlayer insulating film 180P in the first field region FX1 may be removed using a first blocking mask BKM1, a second blocking mask BKM2, and a third blocking mask BKM3.

The pre-lower interlayer insulating film 180P in the first field region FX1 may be removed, so that a second opening 190*h* is formed.

The first interlayer insulating structure 181 may be formed in the first active region ACT1 hidden by the first blocking mask BKM1, and the third interlayer insulating structure 183 may be formed in the second active region ACT2 hidden by the second blocking mask BKM2.

The fourth interlayer insulating structure 184 may be formed in the lower portion of the third contact 530 hidden by the third blocking mask BKM3.

The margin width M will not be additionally described below, but referred to the description provided above with reference to FIGS. 34A to 34C.

The third blocking mask BKM3 may be greater than the third contact 530 by a contact margin CM on all sides. This is to protect the third contact 530 from being damaged while the pre-lower interlayer insulating film 180P in the first field region FX1 is removed.

Although it is described that the first and second contacts 510, 520 are formed before forming the first and third interlayer insulating structures 181, 183, exemplary embodiments of the present inventive concept are not limited thereto. Of course, the first and second contacts 510, 520 may be formed after forming the first and third interlayer insulating structures 181, 183.

The second interlayer insulating material 182*a* may be deposited to fill the second opening 190*h*. As a result, the second interlayer insulating structure 182 may be formed in the first field region FX1.

Figure 45:
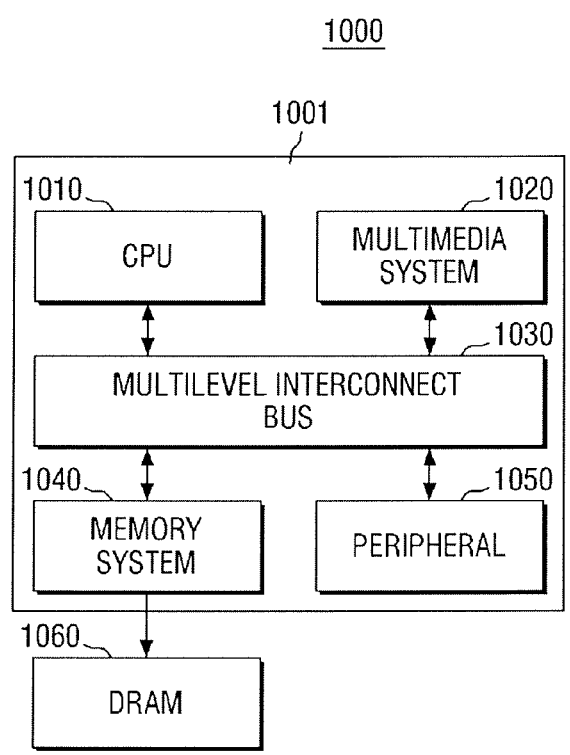
FIG. 45 is a block diagram of a system on chip (SoC) comprising a semiconductor device according to an exemplary embodiment of the present inventive concept.

FIG. 45 is a block diagram of a system on chip (SoC) comprising a semiconductor device according to an exemplary embodiment of the present disclosure.

Referring to FIG. 45, the SoC system 1000 includes an application processor 1001 and a dynamic random-access memory (DRAM) 1060.

The application processor 1001 may include a central processing unit (CPU) 1010, a multimedia system 1020, a bus 1030, a memory system 1040, and a peripheral circuit 1050.

The CPU 1010 may perform arithmetic operation necessary for driving the SoC system 1000. In an exemplary embodiment of the present inventive concept, the CPU 1010 may be configured in a multi-core environment which includes a plurality of cores.

The multimedia system 1020 may be used for performing a variety of multimedia functions on the SoC system 1000. The multimedia system 1020 may include, for example, a 3D engine module, a video codec, a display system, a camera system, a post-processor, or the like.

The bus 1030 may be used for exchanging data communication among the CPU 1010, the multimedia system 1020, the memory system 1040, and the peripheral circuit 1050. In an exemplary embodiment of the present disclosure, the bus 1030 may have a multi-layer structure. Specifically, an example of the bus 1030 may be a multi-layer advanced high-performance bus (AHB), or a multi-layer advanced eXtensible interface (AXI), although exemplary embodiments of the present inventive concept are not limited herein.

The memory system 1040 may provide environments necessary for the application processor 1001 to connect to an external memory (e.g., DRAM 1060) and perform high-speed operation. In an exemplary embodiment of the present disclosure, the memory system 1040 may include a separate controller (e.g., DRAM controller) to control an external memory (e.g., DRAM 1060).

The peripheral circuit 1050 may provide environments necessary for the SoC system 1000 to have a seamless connection to an external device (e.g., main board). Accordingly, the peripheral circuit 1050 may include a variety of interfaces to allow compatible operation with the external device connected to the SoC system 1000.

The DRAM 1060 may function as an operation memory necessary for the operation of the application processor 1001. In an exemplary embodiment of the present inventive concept, the DRAM 1060 may be disposed externally to the application processor 1001, as illustrated. Specifically, the DRAM 1060 may be packaged into a package on package (PoP) type with the application processor 1001.

At least one of the above-mentioned components of the SoC system 1000 may include at least one of the semiconductor devices according to the exemplary embodiments of the present inventive concept explained above.

Although illustrative embodiments have been described in detail, it should be understood that the disclosed preferred embodiments of the present inventive concept are used in a generic and descriptive sense only and not for the purposes of limitation. Therefore, those skilled in the art will appreciate that many variations and modifications can be made to the preferred embodiments without departing from the principles of the present inventive concept, and those variations and modifications are intended to be included within the scope of the appended claims.

What is claimed is:

1. A semiconductor device, comprising:
   a substrate including an active region, and a field region directly adjacent to the active region;
   a first fin-type pattern protruding from the substrate in the active region;
   a first gate electrode disposed on the substrate, intersecting with the first fin-type pattern and including a first portion and a second portion, the first portion intersecting with the first fin-type pattern;
   a second gate electrode disposed on the substrate, intersecting with the first fin-type pattern and including a third portion and a fourth portion, the fourth portion facing the second portion, and the third portion intersecting with the first fin-type pattern and facing the first portion;
   a first interlayer insulating structure disposed between the first portion and the third portion, being on the substrate, and having a first dielectric constant; and
   a second interlayer insulating structure disposed between the second portion and the fourth portion, being on the substrate, and having a second dielectric constant which is different from the first dielectric constant.

2. The semiconductor device of claim 1, further comprising a source/drain formed on the first fin-type pattern between the first portion and the third portion,
   wherein the first interlayer insulating structure is formed on the source/drain, and
   wherein no fin-type pattern is formed in the field region.

3. The semiconductor device of claim 2, wherein the first dielectric constant is greater than the second dielectric constant.

4. The semiconductor device of claim 3, wherein the second interlayer insulating structure includes an air gap, and the first interlayer insulating structure includes no air gap.

5. The semiconductor device of claim 3, wherein the first interlayer insulating structure and the second interlayer insulating structure include no air gap.

6. The semiconductor device of claim 1, further comprising a gate spacer formed on a sidewall of the first gate electrode,
   wherein a thickness of the gate spacer on the sidewall of the first portion is different from a thickness of the gate spacer on the sidewall of the second portion.

7. The semiconductor device of claim 6, wherein the gate spacer defines a trench, and
   the semiconductor device further comprises a gate insulating film formed along a sidewall and a bottom surface of the trench.

8. The semiconductor device of claim 1, further comprising a gate spacer formed on a sidewall of the first gate electrode,
   wherein the gate spacer is formed on the sidewall of the first portion, but not formed on the sidewall of the second portion.

9. The semiconductor device of claim 1, further comprising a capping pattern formed along an upper surface of the first gate electrode,
   wherein the capping pattern is formed on the upper surface of the first portion, but not formed on the upper surface of the second portion.

10. The semiconductor device of claim 1, wherein the first portion and the third portion are laid on the active region, and the second portion and the fourth portion are laid on the field region.

11. The semiconductor device of claim 1, wherein the first fin-type pattern is defined by a first trench having a first depth, and the active region is defined by a second trench having a second depth which is larger than the first depth.

12. A semiconductor device, comprising:
   a first fin-type pattern extending in a first direction protruding from a substrate;

a second fin-type pattern extending in the first direction, and spaced apart from the first fin-type pattern by a first distance in a second direction different form the first direction;

a third fin-type pattern extending in the first direction, and spaced apart from the first fin-type pattern by a second distance in the second direction, the second distance being greater than the first distance;

a first gate electrode includes a first portion intersecting with the first fin-type pattern and the second fin-type pattern, a second portion intersecting with the third fin-type pattern, and a third portion interposed between the first portion and the second portion;

a second gate electrode including a fourth portion intersecting with the first fin-type pattern and the second fin-type pattern, a fifth portion intersecting with the third fin-type pattern, and a sixth portion interposed between the fourth portion and the fifth portion;

a first interlayer insulating structure disposed between the first portion and the fourth portion, being on the substrate, and having a first dielectric constant;

a second interlayer insulating structure disposed between the second portion and the fifth portion, being on the substrate, and having a second dielectric constant; and a third interlayer insulating structure disposed between the third portion and the sixth portion, being on the substrate, and having a third dielectric constant different from the first dielectric constant and the second dielectric constant.

13. The semiconductor device of claim 12, wherein the third dielectric constant is smaller than the first dielectric constant and the second dielectric constant.

14. The semiconductor device of claim 13, wherein the second interlayer insulating structure includes an insulating material same as that included in the first interlayer insulating structure.

15. The semiconductor device of claim 13, wherein the third interlayer insulating structure includes an air gap.

16. The semiconductor device of claim 13, wherein a dielectric constant of an insulating material included in the first interlayer insulating structure is greater than a dielectric constant of an insulating material included in the third interlayer insulating structure.

17. The semiconductor device of claim 12, wherein, between a sidewall of the first gate electrode and a sidewall of the second gate electrode facing the sidewall of the first gate electrode, a width of the third interlayer insulating structure is greater than a width of the first interlayer insulating structure.

18. The semiconductor device of claim 17, wherein number of insertion films interposed between the sidewall of the first gate electrode and the third interlayer insulating structure is less than number of insertion films interposed between the sidewall of the first gate electrode and the first interlayer insulating structure.

19. A semiconductor device, comprising:
a substrate including an active region, and a field region directly adjacent to the active region;
a first trench having a first depth, and defining the active region on a substrate;
a fin-type pattern defined by a second trench having a second depth smaller than the first depth, and being in the active region;
a field insulating film filling a portion of the first trench and a portion of the second trench;
a gate electrode intersecting with the fin-type pattern, disposed on the field insulating film, extending from the active region the field region and including a first portion overlapping with the active region and a second portion not overlapping with the active region;
a first interlayer insulating structure overlaying a sidewall of the first portion, disposed on the field insulating film, and having a first dielectric constant; and
a second interlayer insulating structure overlaying a sidewall of the second portion, disposed on the field insulating film, and having a second dielectric constant different from the first dielectric constant.

20. The semiconductor device of claim 19, wherein the first dielectric constant is greater than the second dielectric constant.

* * * * *